United States Patent
Kondo

(10) Patent No.: US 8,651,262 B2
(45) Date of Patent: Feb. 18, 2014

(54) CIRCUIT BOARD INSPECTION APPARATUS

(75) Inventor: Takeshi Kondo, Chiryu (JP)

(73) Assignee: Fuji Machine Mfg. Co., Ltd., Chiryu-Shi (JP)

( * ) Notice: Subject to any disclaimer, the term of this patent is extended or adjusted under 35 U.S.C. 154(b) by 847 days.

(21) Appl. No.: 12/618,406

(22) Filed: Nov. 13, 2009

(65) Prior Publication Data
US 2010/0133064 A1    Jun. 3, 2010

(30) Foreign Application Priority Data

Dec. 2, 2008    (JP) ................................ 2008-307378

(51) Int. Cl.
*B65G 47/10*    (2006.01)
*B65G 47/50*    (2006.01)

(52) U.S. Cl.
CPC ..................................... *B65G 47/50* (2013.01)
USPC ........................................ 198/349; 198/346.2

(58) Field of Classification Search
USPC .......... 198/346.1, 346.2, 346.3, 463.2, 369.1, 198/586, 339.1, 341.01, 341.03, 347.4, 349, 198/817
See application file for complete search history.

(56) References Cited

U.S. PATENT DOCUMENTS

| | | | | |
|---|---|---|---|---|
| 4,003,476 A * | 1/1977 | Laskey | ........................ | 198/468.6 |
| 4,708,232 A * | 11/1987 | Hata et al. | ................... | 198/346.1 |
| 4,999,578 A * | 3/1991 | Ohashi et al. | ............ | 324/757.02 |
| 5,491,737 A * | 2/1996 | Yarnall et al. | .................... | 378/58 |
| 5,517,748 A * | 5/1996 | Park | ................. | 29/741 |
| 5,894,657 A * | 4/1999 | Kanayama et al. | ............. | 29/740 |
| 6,378,198 B1 * | 4/2002 | Asai et al. | ........................ | 29/825 |
| 6,460,692 B2 * | 10/2002 | Dionne et al. | ............. | 198/836.3 |
| 6,892,446 B2 * | 5/2005 | Hwang et al. | .................... | 29/740 |
| 6,944,943 B2 * | 9/2005 | Cho et al. | ........................ | 29/740 |
| 7,032,304 B2 * | 4/2006 | Gieskes | .......................... | 29/832 |
| 7,200,922 B2 * | 4/2007 | Kabeshita et al. | .............. | 29/740 |
| 7,222,413 B2 * | 5/2007 | Hamasaki et al. | .............. | 29/740 |
| 7,367,115 B2 * | 5/2008 | Nakai et al. | ..................... | 29/740 |
| 7,434,675 B1 * | 10/2008 | Rohm et al. | ............... | 198/346.2 |
| 8,162,128 B2 * | 4/2012 | Kimura et al. | ............. | 198/468.3 |

FOREIGN PATENT DOCUMENTS

| | | |
|---|---|---|
| CN | 1300530 A | 6/2001 |
| CN | 1703942 A | 11/2005 |
| JP | A-2002-118360 | 4/2002 |

OTHER PUBLICATIONS

Nov. 12, 2012 Office Action issued in Chinese Patent Application No. 200910252405.3, w/translation.
Nov. 2, 2012 Search Report issued in Chinese Patent Application No. 200910252405.3, w/translation.

* cited by examiner

*Primary Examiner* — William R Harp
(74) *Attorney, Agent, or Firm* — Oliff PLC

(57) ABSTRACT

A circuit board inspection apparatus is equipped with a plurality of lane divided sections for transferring circuit boards, a plurality of movable transfer devices disposed on the plurality of the lane divided sections and having transfer portions for transferring the circuit boards, and visual recognition positions disposed adjacent to the plurality of the lane divided sections in a Y direction. The plurality of the movable transfer devices transfer the circuit boards from the lane divided sections to the visual recognition positions. One of the movable transfer devices has a height adjustment portion that moves a corresponding one of the transfer portions in a Z direction to prevent the movable transfer device from interfering with a corresponding one of the lane divided sections, in transferring one of the circuit boards from one of the lane divided sections to one of the visual recognition positions.

10 Claims, 35 Drawing Sheets

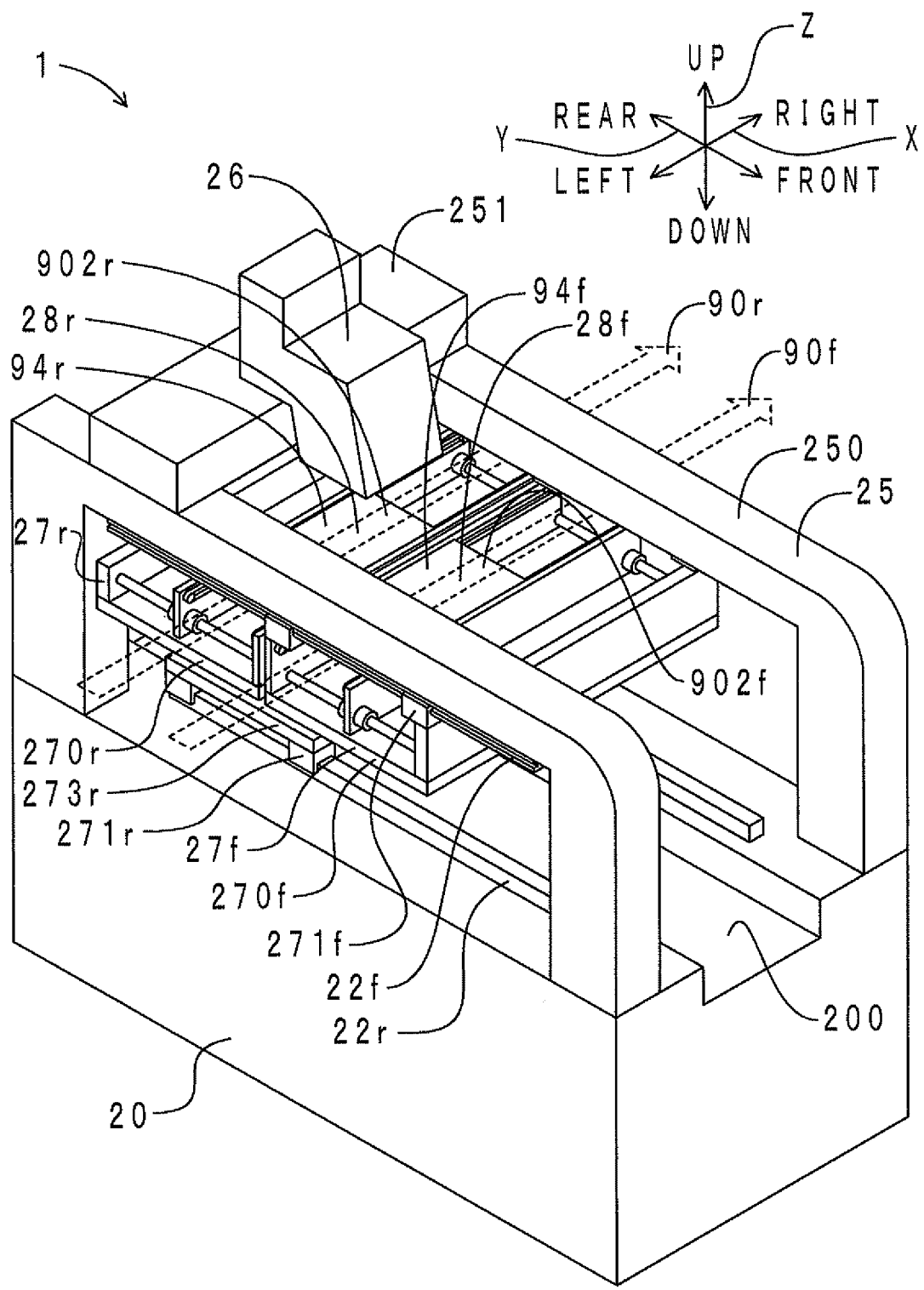
F I G. 2

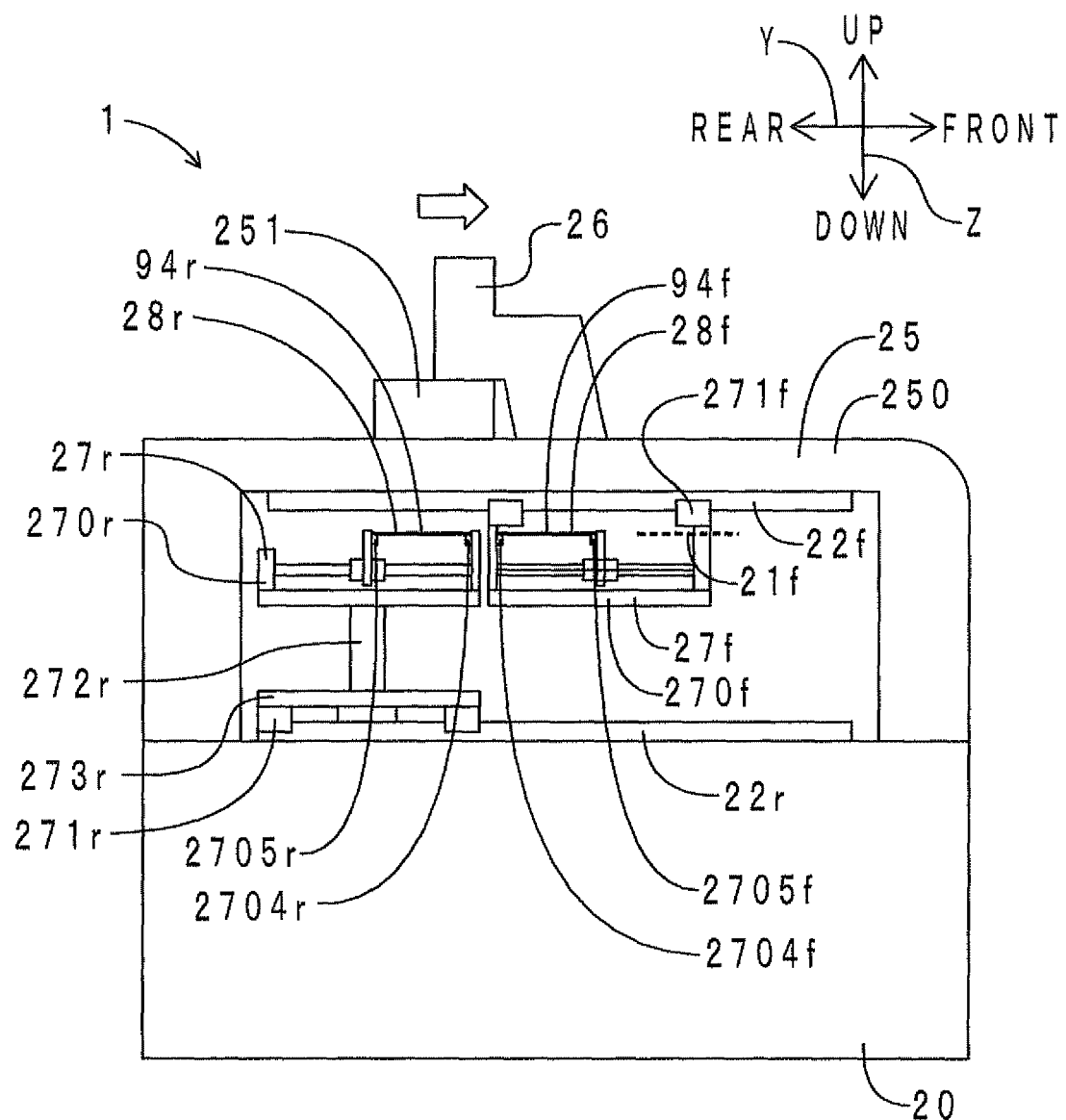
F I G. 10

CIRCUIT BOARD INSPECTION APPARATUS

INCORPORATION BY REFERENCE

The disclosure of Japanese Patent Application No. 2008-307378 filed on December 2 including the specification, drawings and abstract is incorporated herein by reference in its entirety.

BACKGROUND OF THE INVENTION

1. Field of the Invention

The present invention relates to a circuit board inspection apparatus for inspecting circuit boards.

2. Description of the Related Art

Along a production line of circuit boards, a board supply apparatus, a screen printing machine, a printed condition inspection apparatus, an electronic component mounting machine, and the like are arranged from an upstream side toward a downstream side in a transfer direction (e.g., see Japanese Patent Application Publication No. JP-A-2002-118360). That is, the circuit boards are supplied to the production line by the board supply apparatus. Solder is printed on lands (circuit electrode portions) of each supplied circuit board, according to a predetermined pattern by the screen printing machine. A printed condition of the solder on the circuit board is inspected by the printed condition inspection apparatus. If the circuit board is regarded as acceptable as a result of the inspection, electronic components are mounted thereon by the electronic component mounting machine.

In recent years, the production line of the circuit boards tends to have dualized lanes (transfer paths). However, conventional printed condition inspection apparatuses do not cope with the dualized lanes. Thus, two printed condition inspection apparatuses need to be disposed. Accordingly, low space efficiency is inevitable.

Further, in the printed condition inspection apparatus, it is determined from an image taken by an imaging device whether or not a printed condition of solder is acceptable. To confirm a result of an inspection by the imaging device, an operator conducts a visual inspection in some cases.

In this case, in visually inspecting a circuit board transferred on one of the dualized lanes that is located far from the operator, the operator is required to visually inspect the circuit board over one of the lanes that is located close to the operator. Further, in determining as a result of the visual inspection that the circuit board is unacceptable, the operator is required to remove the circuit board over the lane located close to the operator. Thus, low operability is inevitable.

SUMMARY OF THE INVENTION

A circuit board inspection apparatus according to the present invention has been completed in view of the aforementioned problems. It is therefore an object of the present invention to provide a circuit board inspection apparatus that can cope with pluralized lanes of a production line and that offers high space efficiency and high operability.

(1) In order to solve the aforementioned problems, a circuit board inspection apparatus according to a first aspect of the present invention is equipped with a plurality of lane divided sections, a plurality of movable transfer devices, and a visual recognition position. The plurality of the lane divided sections constitute part of a plurality of lanes extending in an X direction, in which circuit boards are transferred, to transfer the circuit boards, and are disposed side by side in a Y direction that is a substantially horizontal direction substantially perpendicular to the X direction. The plurality of the movable transfer devices are disposed on the plurality of the lane divided sections and have transfer portions for transferring the circuit boards respectively. The visual recognition position is disposed on at least one of both sides of the plurality of the lane divided sections in the Y direction to allow an operator to visually recognize the circuit boards directly or indirectly. In this circuit board inspection apparatus, the plurality of the movable transfer devices can transfer the circuit boards from the lane divided sections to the visual recognition position, and at least one of the plurality of the movable transfer devices has a height adjustment portion that moves a corresponding one of the transfer portions in a Z direction, which is a substantially vertical direction substantially perpendicular to the X direction and the Y direction, in transferring a corresponding one of the circuit boards from a corresponding one of the lane divided sections to the visual recognition position to prevent the movable transfer device from interfering with the lane divided sections other than the lane divided section on which the movable transfer device is disposed.

Disposed along an exemplary production line of the circuit boards are a board supply apparatus, a screen printing machine, a printed condition inspection apparatus, and an electronic component mounting machine in this order from an upstream side toward a downstream side in the X direction. In the present specification, regions of each lane of the production line that are disposed on the board supply apparatus, the screen printing machine, the printed condition inspection apparatus, and the electronic component mounting machine, respectively, are referred to as the lane divided sections. That is, the regions that constitute each lane of the production line and are assigned to the respective apparatuses are referred to as the lane divided sections.

The circuit board inspection apparatus according to the present invention is equipped with the plurality of the lane divided sections arranged side by side in the Y direction. Thus, the circuit board inspection apparatus can cope with the pluralized lanes of the production line. Further, there is no need to dispose a circuit board inspection apparatus on each of the lanes. Therefore, high space efficiency is achieved.

Further, the movable transfer devices of the circuit board inspection apparatus according to the present invention can transfer the circuit boards from the lane divided sections to the visual recognition position. Thus, in visually inspecting the circuit board transferred on one of the plurality of the lane divided sections that is located far from the operator, the operator is not required to visually inspect the circuit board over one of the plurality of the lane divided sections that is located close to the operator. Also, in determining that the circuit board is unacceptable, the operator is not required to remove the circuit board over the one of the lane divided sections that is located close to the operator. Thus, high operability is achieved.

Further, according to the circuit board inspection apparatus of the present invention, the height adjustment portion is disposed on at least one of the movable transfer devices. Thus, although the plurality of the lane divided sections are arranged side by side in the Y direction, at least one of the movable transfer devices does not interfere with the other lane divided sections, in transferring a corresponding one of the circuit boards from a corresponding one of the lane divided sections to the visual recognition position.

(2) According to a second aspect of the present invention, in the aforementioned configuration (1), it is preferable that the circuit board inspection apparatus further include a base having an operation area for the operator on a near side in the Y direction, a first guide portion extending in the Y direction, and a second guide portion extending in the Y direction. The plurality of the lane divided sections may be a first lane divided section for transferring a first circuit board, and a second lane divided section aligned with the first lane divided section on a far side in the Y direction to transfer a second circuit board. The plurality of the movable transfer devices may be a first movable transfer device having a first transfer portion that transfers the first circuit board and a first guided portion that slides on the first guide portion, and a second movable transfer device having a second transfer portion that is arranged above the base in the Z direction and aligned with the first movable transfer device on a far side in the Y direction to transfer the second circuit board and a second guided portion that slides on the second guide portion. The height adjustment portion may be disposed on the first movable transfer device or the second movable transfer device. The visual recognition position may be arranged on a near side of the first lane divided section in the Y direction. The first transfer portion may be disposed on the first lane divided section in producing the first circuit board. The second transfer portion may be disposed on the second lane divided section in producing the second circuit board. The first guided portion may slide on the first guide portion, and the first movable transfer device may move toward the near side in the Y direction to transfer the first circuit board from the first lane divided section to the visual recognition position in inspecting the first circuit board. The second guided portion may slide on the second guide portion, the second movable transfer device may move toward the near side in the Y direction, and the height adjustment portion may prevent the second transfer portion from interfering with the first lane divided section in inspecting the second circuit board.

According to this configuration, the visual recognition position is adjacent to the operation area for the operator. The first circuit board on the first lane divided section and the second circuit board on the second lane divided section are transferred to the visual recognition position. Thus, the operator can inspect both the first circuit board and the second circuit board from the operation area. That is, the operator can inspect from the operation area the second circuit board on the second lane divided section located far from the operation area, as well as the first circuit board on the first lane divided section located close to the operation area. Thus, there is no need to provide two operation areas on both sides of the base in the Y direction. Accordingly, high space efficiency is achieved.

(3) According to a third aspect of the present invention, in the aforementioned configuration (2), it is preferable that the circuit board inspection apparatus further include a frame provided over the first movable transfer device and the second movable transfer device in the Z direction. One of the first guide portion and the second guide portion may be disposed on the frame, and the other of the first guide portion and the second guide portion may be disposed on the base.

According to this configuration, when the first guide portion is disposed on the frame, the second guide portion is disposed on the base. Further, when the second guide portion is disposed on the frame, the first guide portion is disposed on the base. Thus, the first movable transfer device and the second movable transfer device are unlikely to interfere with each other.

(4) According to a fourth aspect of the present invention, in the aforementioned configuration (3), it is preferable that the first guide portion and the second guide portion be disposed opposite each other in the Z direction. According to this configuration, the first guide portion and the second guide portion are so disposed as to overlap with each other as viewed from above or below in the Z direction. Thus, the entire length of the circuit board inspection apparatus in the X direction can be made short.

(5) According to a fifth aspect of the present invention, in any one of the aforementioned configurations (2) to (4), it is preferable that at least one of the first movable transfer device and the second movable transfer device move in a reciprocating manner between the first lane divided section and the second lane divided section and ensure transfer of the first circuit board on the first lane divided section in the X direction and transfer of the second circuit board on the second lane divided section in the X direction, while the other of the first movable transfer device and the second movable transfer device transfers the first circuit board or the second circuit board between the first lane divided section or the second lane divided section and the visual recognition position.

According to this configuration, during the inspection of the first circuit board, production of first circuit boards on the first lane can be continued, using the second movable transfer device. Thus, an inspection of the first circuit board transferred for the n-th (n represents a natural number) time can be restrained from causing a delay in the transfer of the (n+1)-th and subsequent first circuit boards. That is, the production efficiency of the first circuit boards can be restrained from decreasing.

Further, during the inspection of the second circuit board, production of second circuit boards on the second lane can be continued, using the first movable transfer device. Thus, an inspection of the second circuit board transferred for the n-th time can be restrained from causing a delay in the transfer of the (n+1)-th and subsequent second circuit boards. That is, the production efficiency of the second circuit boards can be restrained from decreasing.

(6) According to a sixth aspect of the present invention, in the aforementioned configuration (2), it is preferable that the first guide portion and the second guide portion be disposed on the base opposite each other in the X direction, and the first movable transfer device further have a first support portion disposed below the first transfer portion in the Z direction, and a column portion interposed between the first transfer portion and the first support portion. The first guided portion may be disposed on the first support portion, and be in slidable contact with the first guide portion from above in the Z direction. The second movable transfer device may further have a second support portion that is disposed below the second transfer portion in the Z direction. The second guided portion may be disposed on the second support portion, and be in slidable contact with the second guide portion from above in the Z direction. The height adjustment portion may be interposed between the second transfer portion and the second support portion.

According to this configuration, both the first guide portion and the second guide portion are disposed on the base. Thus, in comparison with a case where the first guide portion is installed on the frame as in the cases of the aforementioned configurations (3) to (5), there is no need to install the frame. Further, there is no need to consider a fall of the first guided portion from the first guide portion in comparison with a case where the first guided portion is hung from the first guide portion. Thus, a structure for engaging the first guided portion with the first guide portion is simplified.

(7) According to a seventh aspect of the present invention, in the aforementioned configuration (6), it is preferable that the circuit board inspection apparatus further include an inspection transfer portion where the visual recognition position is disposed. In inspecting the first circuit board, the first circuit board may be delivered from the first transfer portion to the inspection transfer portion, and the first transfer portion may return to the first lane divided section. In inspecting the second circuit board, the second circuit board may be delivered from the second transfer portion to the inspection transfer portion, and the second transfer portion may return to the second lane divided section.

According to this configuration, the production efficiency of the first circuit boards can be restrained from decreasing even during the inspection thereof. Similarly, the production efficiency of the second circuit boards can be restrained from decreasing even during the inspection thereof.

(8) According to an eighth aspect of the present invention, in any one of the aforementioned configurations (2) to (7), it is preferable that the circuit board inspection apparatus further include a first imaging position disposed on the first lane divided section, a second imaging position disposed on the second lane divided section, and an imaging device disposed above the first imaging position and the second imaging position in the Z direction to allow the first circuit board at the first imaging position and the second circuit board at the second imaging position to be imaged. The first circuit board may be transferred to the visual recognition position when regarded as unacceptable as a result of an image inspection at the first imaging position, and the second circuit board may be transferred to the visual recognition position when regarded as unacceptable as a result of an image inspection at the second imaging position.

According to this configuration, the first circuit board can be inspected first at the first imaging position and then at the visual recognition position. Similarly, the second circuit board can be inspected first at the second imaging position and then at the visual recognition position. Thus, the accuracy of the inspection is enhanced in comparison with a case where each of the first circuit board and the second circuit board is inspected only at the visual recognition position.

(9) According to a ninth aspect of the present invention, in any one of the aforementioned configurations (1) to (8), it is preferable that a printed condition of a solder on the circuit board be visually recognized at the visual recognition position. This configuration realizes the circuit board inspection apparatus according to the present invention as a printed condition inspection apparatus. According to this configuration, the operator can easily inspect the printed condition of the solder on the circuit board.

The present invention can provide a circuit board inspection apparatus that can cope with pluralized lanes of a production line and that offers high space efficiency and high operability.

BRIEF DESCRIPTION OF THE DRAWINGS

FIG. 2 is a perspective view of the printed condition inspection apparatus;

FIG. 10 is a left view of the printed condition inspection apparatus in an imaging inspection step during the inspection of a first circuit board;

DETAILED DESCRIPTION OF THE EMBODIMENTS

Embodiments in which a circuit board inspection apparatus according to the present invention is embodied as a printed condition inspection apparatus will be described hereinafter.

First Embodiment

[Configuration of Production Line]

Figure 1:
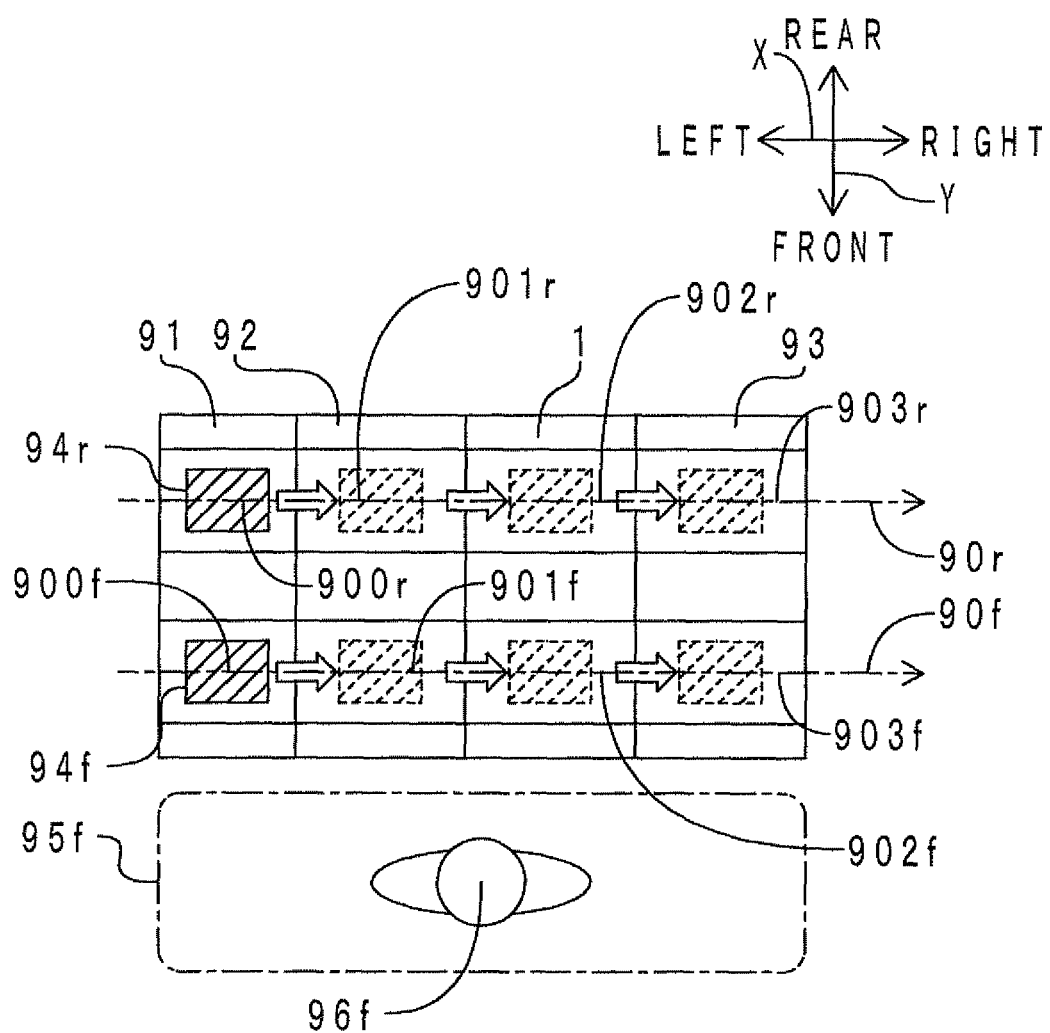
FIG. 1 is a schematic view of a production line on which a printed condition inspection apparatus according to a first embodiment of the present invention is disposed.

First of all, the configuration of a production line on which a printed condition inspection apparatus according to the present embodiment is disposed will be described. FIG. 1 is a schematic view showing the production line on which the printed condition inspection apparatus according to the present embodiment is disposed. In the following drawings, a left-right direction (a direction in which circuit boards are transferred) corresponds to an X direction of the present invention. A front-rear direction corresponds to a Y direction of the present invention. An up-down direction corresponds to a Z direction of the present invention. A front side in the Y direction corresponds to the near side in the Y direction of the present invention. A rear side in the Y direction corresponds to the far side in the Y direction of the present invention.

As shown in FIG. 1, a board supply apparatus 91, a screen printing machine 92, a printed condition inspection apparatus 1, and an electronic component mounting machine 93 are disposed side by side in the left-right direction on the production line. The production line has two lanes 90f and 90r arranged in the front-rear direction. The lane 90f transfers a first circuit board 94f. The lane 90r transfers a second circuit board 94r. An operation area 95f for an operator 96f is set in front of the lane 90f.

The board supply apparatus 91 is equipped with a first lane divided section 900f and a second lane divided section 900r. The screen printing machine 92 is equipped with a first lane divided section 901f and a second lane divided section 901r. The printed condition inspection apparatus 1 is equipped with a first lane divided section 902f and a second lane divided section 902r. The first lane divided section 902f is included in the first lane divided section of the present invention. The second lane divided section 902r is included in the second lane divided section of the present invention. The electronic component mounting machine 93 is equipped with a first lane divided section 903f and a second lane divided section 903r. The first lane divided sections 900f to 903f range in the left-right direction such that the first circuit board 94f can be transferred. The second lane divided sections 900r to 903r range in the left-right direction such that the second circuit board 94r can be transferred. The second lane divided sections 900r to 903r are disposed behind the first lane divided sections 900f to 903f, respectively.

[Configuration of Printed Condition Inspection Apparatus]

Figure 3:
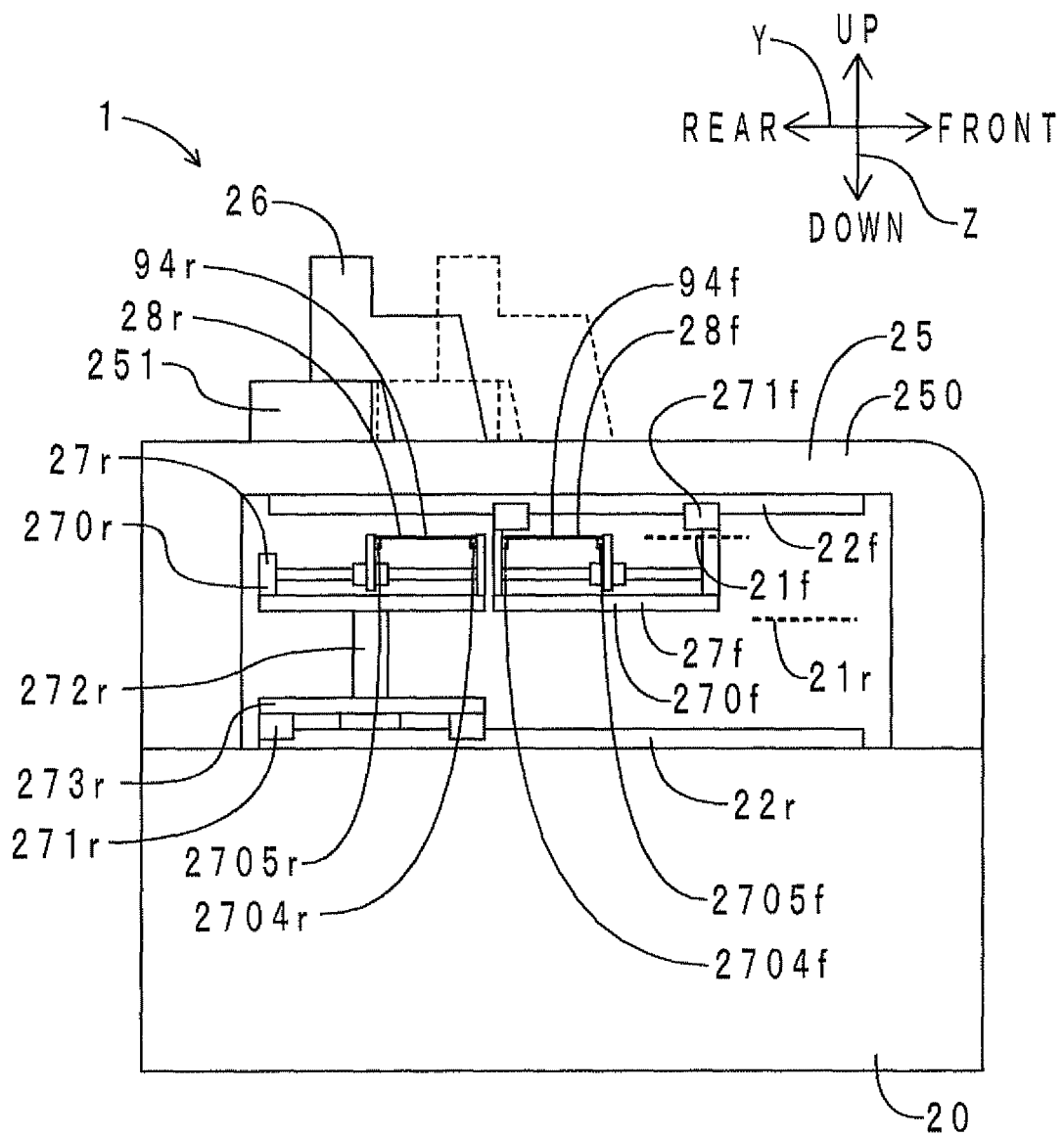
FIG. 3 is a left view of the printed condition inspection apparatus.

Next, the configuration of the printed condition inspection apparatus 1 according to the present embodiment will be described. FIG. 2 is a perspective view showing the printed condition inspection apparatus according to the present embodiment. FIG. 3 is a left view showing the printed condition inspection apparatus. As shown in FIGS. 1 to 3, the printed condition inspection apparatus 1 according to the present embodiment is equipped with a base 20, the first lane divided section 902f, the second lane divided section 902r, a first movable transfer device 27f, a second movable transfer device 27r, a pair of first guide portions 22f, a pair of second guide portions 22r, visual recognition positions 21f and 21r, a frame 25, a first imaging position 28f, a second imaging position 28r, and an imaging device 26.

(Base 20)

The base 20 assumes the shape of a rectangular parallelepiped block. The base 20 is laid on a floor of a plant. A groove portion 200 is provided in a top face of the base 20 substantially at a center thereof in the left-right direction. The groove portion 200 extends in the front-rear direction.

(Frame 25 and Imaging Device 26)

The frame 25 is equipped with a pair of left and right frame bodies 250 and a beam body 251. The frame bodies 250 assume the shape of C that opens downward. The pair of the frame bodies 250 are provided upright and upward from both left and right edges of the top face of the base 20. The beam body 251 assumes the shape of a rectangular parallelepiped that is long in the left-right direction. The beam body 251 is provided bridging upper-edge top faces of the pair of the frame bodies 250. The beam body 251 can slide in the front-rear direction with respect to the pair of the frame bodies 250. The imaging device 26 is disposed on the beam body 251. The imaging device 26 can slide in the left-right direction with respect to the beam body 251. The imaging device 26 can image a lower area.

(First Guide Portions 22f and Second Guide Portions 22r)

The pair of the first guide portions 22f are disposed on upper-edge lower faces of the pair of the frame bodies 250. The pair of the first guide portions 22f assume the shape of a rectangular column long in the front-rear direction. A pair of left and right engaged recess portions 220f (see later-described FIG. 6) are provided in both left and right faces of each of the first guide portions 22f respectively.

The pair of the second guide portions 22r are disposed on the top face of the base 20. More specifically, the pair of the second guide portions 22r are disposed on both left and right sides of the groove portion 200. The pair of the second guide portions 22r assume the shape of a rectangular column long in the front-rear direction. The pair of the second guide portions 22r face the pair of the first guide portions 22f, respectively, in the up-down direction.

(Second Lane Divided Section 902r, Second Movable Transfer Device 27r, and Second Imaging Position 28r)

Figure 4:
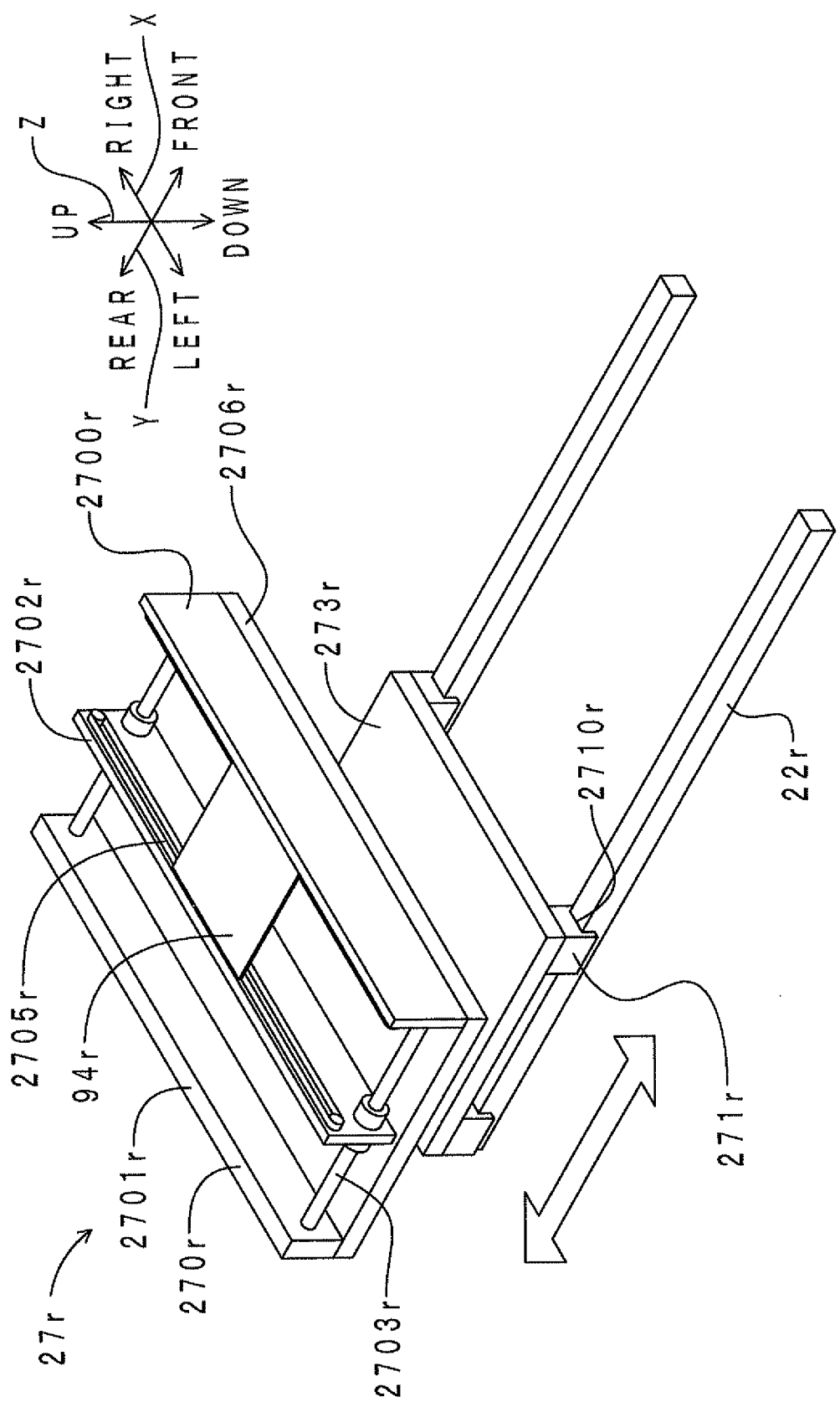
FIG. 4 is a perspective view of a second movable transfer device and second guide portions of the printed condition inspection apparatus.
Figure 5:
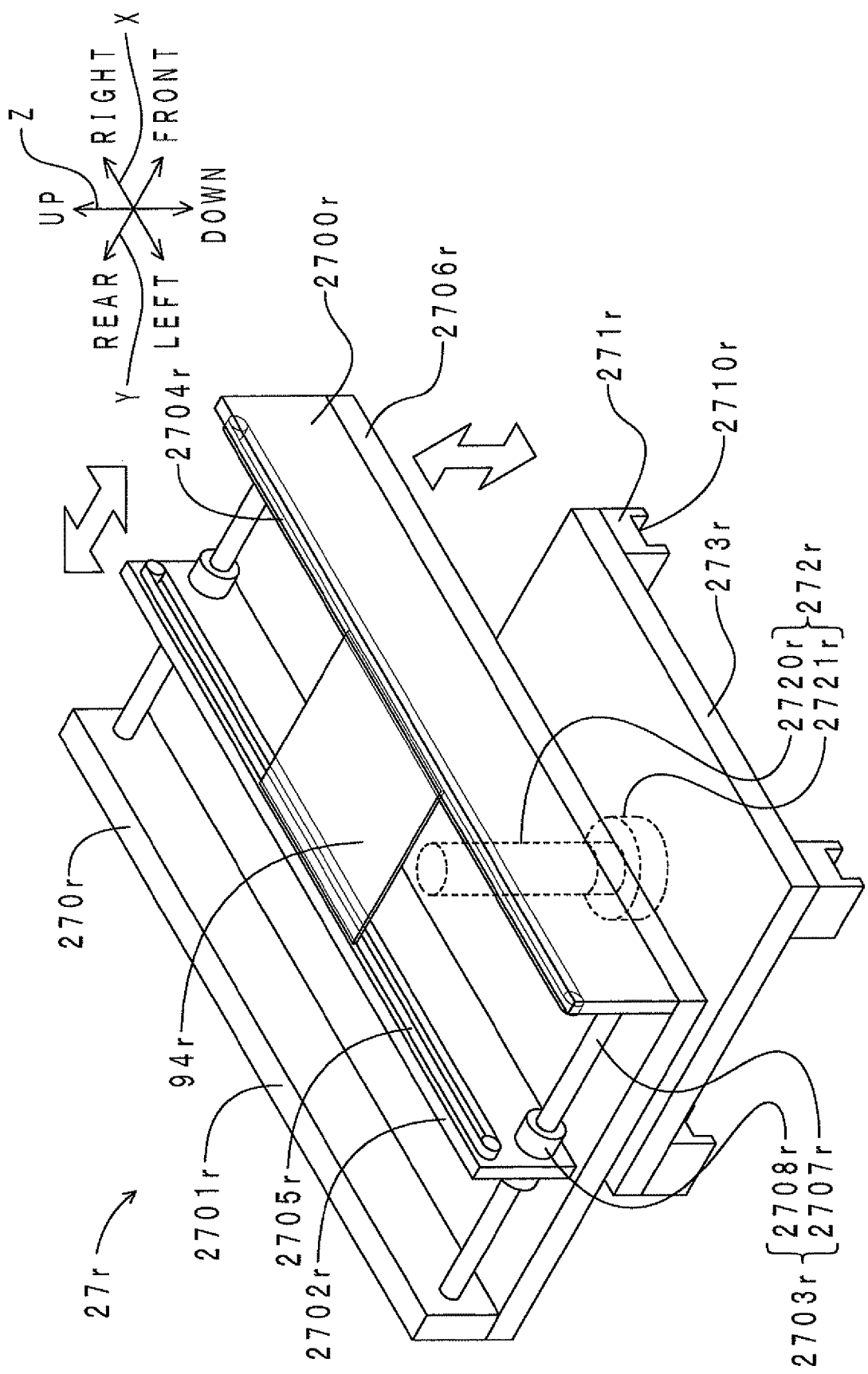
FIG. 5 is a perspective view of the second movable transfer device.

The second lane divided section 902r extends across the base 20 in the left-right direction. In producing the second circuit board 94r, the second movable transfer device 27r is disposed on the second lane divided section 902r. FIG. 4 is a perspective view showing the second movable transfer device and the second guide portions of the printed condition inspection apparatus according to the present embodiment. FIG. 5 is a perspective view showing the second movable transfer device. As shown in FIGS. 4 and 5, the second movable transfer device 27r is equipped with a second transfer portion 270r, four second guided portions 271r, a ball screw portion 272r, and a second support portion 273r. The ball screw portion 272r is included in the height adjustment portion of the present invention.

The second transfer portion 270r is equipped with a front fixed wall portion 2700r, a rear fixed wall portion 2701r, a movable wall portion 2702r, a pair of ball screw portions 2703r, a fixed conveyer 2704r, a movable conveyer 2705r, and a bottom plate 2706r. The bottom plate 2706r assumes the shape of a rectangular plate. The front fixed wall portion 2700r assumes the shape of a rectangular plate. The front fixed wall portion 2700r is provided upright and upward from a front edge of the bottom plate 2706r. The rear fixed wall portion 2701r assumes the shape of a rectangular plate. The rear fixed wall portion 2701r is provided upright and upward from a rear edge of the bottom plate 2706r. The movable wall portion 2702r assumes the shape of a rectangular plate. The movable wall portion 2702r is disposed between the front fixed wall portion 2700r and the rear fixed wall portion 2701r. The fixed conveyer 2704r, which is long in the left-right direction, is disposed on a rear face of the front fixed wall portion 2700r. The movable conveyer 2705r, which is long in the left-right direction, is disposed on a front face of the movable wall portion 2702r. The fixed conveyer 2704r and the movable conveyer 2705r face each other in the front-rear direction. The second circuit board 94r is provided bridging the fixed conveyer 2704r and the movable conveyer 2705r. In a state shown in FIG. 3, the imaging device 26 is disposed directly above the second circuit board 94r. A position allowing this state to be ensured is equivalent to the second imaging position 28r. The second circuit board 94r is transferred from the left side (upstream side) to the right side (downstream side) by the fixed conveyer 2704r and the movable conveyer 2705r. The pair of the ball screw portions 2703r are disposed in the vicinity of left and right edges of the second transfer portion 270r. The pair of the ball screw portions 2703r are interposed between the movable wall portion 2702r and a servomotor (not shown). To put it in more detail, each of the ball screw portions 2703r is equipped with a shaft portion 2707r and a nut portion 2708r. The shaft portion 2707r and the nut portion 2708r are screwed to each other via a large number of balls (not shown). The shaft portion 2707r is coupled to the servomotor. On the other hand, the nut portion 2708r is fixed to the movable wall portion 2702r. When the servomotor is driven, the shaft portion 2707r rotates around its axis. Thus, the nut portion 2708r moves in the front-rear direction along the axis of the shaft portion 2707r. Accordingly, the movable wall portion 2702r can be moved in the front-rear direction. That is, the clearance between the movable conveyer 2705r and the fixed conveyer 2704r can be adjusted.

The second support portion 273r assumes the shape of a rectangular plate. The second support portion 273r is disposed below the second transfer portion 270r.

The four second guided portions 271r are disposed at four corners of a lower face of the second support portion 273r. Out of these four second guided portions 271r, the two left second guided portions 271r are in slidable contact with the left second guide portion 22r. Similarly, the two right second guided portions 271r are in slidable contact with the right second guide portion 22r. Groove portions 2710r long in the front-rear direction are provided in lower faces of the second guided portions 271r. The groove portions 2710r are engaged with the second guide portions 22r.

The ball screw portion 272r is interposed between the second transfer portion 270r and the second support portion 273r. The ball screw portion 272r is equipped with a shaft portion 2720r and a nut portion 2721r. The shaft portion 2720r and the nut portion 2721r are screwed to each other via a large number of balls (not shown). The shaft portion 2720r is coupled to the servomotor (not shown). On the other hand, the nut portion 2721r is fixed to the second support position 273r. When the servomotor is driven, the shaft portion 2720r rotates around its axis. Thus, the shaft portion 2720r retracts below the second support position 273r. It should be noted that the groove portion 200 shown in FIG. 2 is an immersion space for the shaft portion 2720r. By immersing the shaft portion 2720r, the second transfer portion 270r can be lowered.

(First Lane Divided Section 902f, First Movable Transfer Device 27f, and First Imaging Position 28f)

Figure 6:
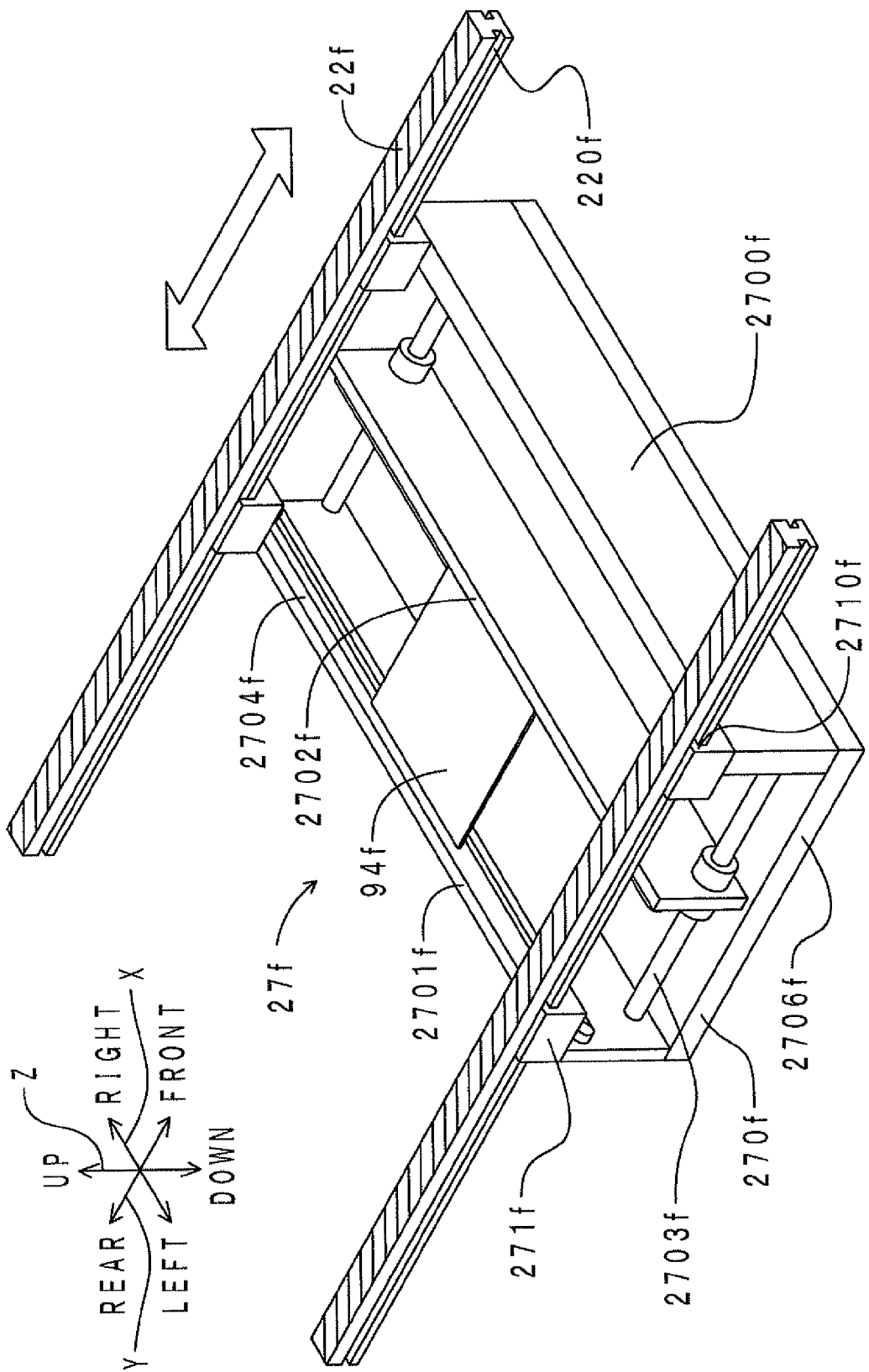
FIG. 6 is a perspective view of a first movable transfer device and first guide portions of the printed condition inspection apparatus.
Figure 7:
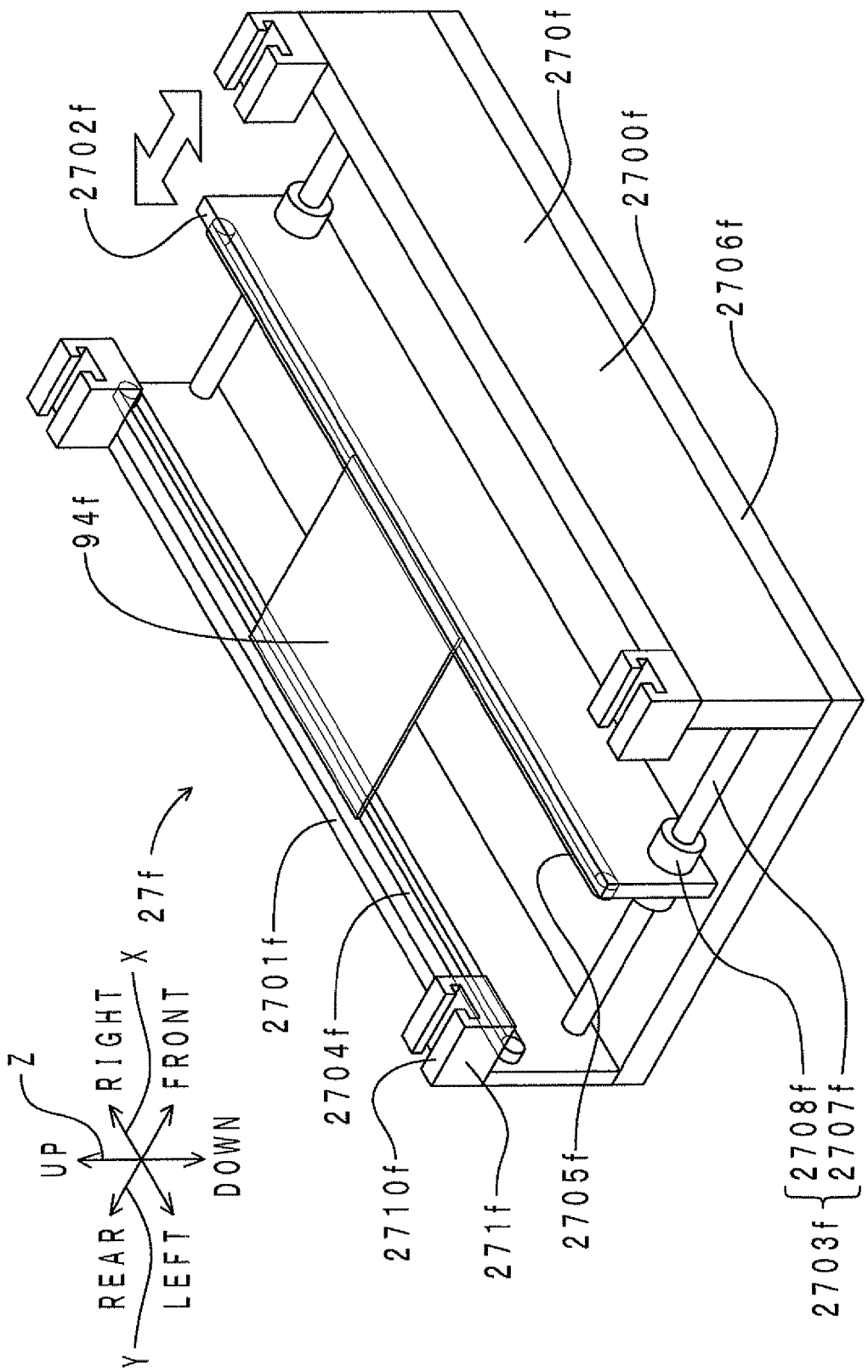
FIG. 7 is a perspective view of the first movable transfer device.

The first lane divided section 902f extends across the base 20 in the left-right direction. The first lane divided section 902f is disposed in front of the second lane divided section 902r. In producing the first circuit board 94f, the first movable transfer device 27f is disposed on the first lane divided section 902f. FIG. 6 is a perspective view showing the first movable transfer device and the first guide portions of the printed condition inspection apparatus according to the present embodiment. FIG. 7 is a perspective view showing the first movable transfer device. As shown in FIGS. 6 and 7, the first movable transfer device 27f is equipped with a first transfer portion 270f and four first guided portions 271f.

The first transfer portion 270f is equipped with a front fixed wall portion 2700f, a rear fixed wall portion 2701f, a movable wall portion 2702f, a pair of ball screw portions 2703f, a fixed conveyer 2704f, a movable conveyer 2705f, and a bottom plate 2706f. The bottom plate 2706f assumes the shape of a rectangular plate. The front fixed wall portion 2700f assumes the shape of a rectangular plate. The front fixed wall portion 2700f is provided upright and upward from a front edge of the bottom plate 2706f. The rear fixed wall portion 2701f assumes the shape of a rectangular plate. The rear fixed wall portion 2701f is provided upright and upward from a rear edge of the bottom plate 2706f. The movable wall portion 2702f assumes the shape of a rectangular plate. The movable wall portion 2702f is disposed between the front fixed wall portion 2700f and the rear fixed wall portion 2701f. The fixed conveyer 2704f, which is long in the left-right direction, is disposed on a front face of the rear fixed wall portion 2701f. The movable conveyer 2705f, which is long in the left-right direction, is disposed on a rear face of the movable wall portion 2702f. The movable conveyer 2705f and the fixed conveyer 2704f face each other in the front-rear direction. The first circuit board 94f is provided bridging the movable conveyer 2705f and the fixed conveyer 2704f. In a state indicated by dotted lines in FIG. 3, the imaging device 26 is disposed directly above the first circuit board 94f. A position allowing this state to be ensured is equivalent to the first imaging position 28f. The first circuit board 94f is transferred from the left side to the right side by the movable conveyer 2705f and the fixed conveyer 2704f. The pair of the ball screw portions 2703f are disposed in the vicinity of both left and right edges of the first transfer portion 270f. The pair of the ball screw portions 2703f are interposed between the movable wall portion 2702f and the servomotor (not shown). To put it in more detail, each of the ball screw portions 2703f is equipped with a shaft portion 2707f and a nut portion 2708f. The shaft portion 2707f and the nut portion 2708f are screwed to each other via a large number of balls (not shown). The shaft portion 2707f is coupled to the servomotor. On the other hand, the nut portion 2708f is fixed to the movable wall portion 2702f. When the servomotor is driven, the shaft portion 2707f rotates around its axis. Thus, the nut portion 2708f moves in the front-rear direction along the axis of the shaft portion 2707f. Accordingly, the movable wall portion 2702f can be moved in the front-rear direction. That is, the clearance between the movable conveyer 2705f and the fixed conveyer 2704f can be adjusted.

The four first guided portions 271f are disposed at four upper corners of the first transfer portion 270f. More specifically, two of the four first guided portions 271f are disposed at left and right ends of an upper edge of the front fixed wall portion 2700*f*. The other two of the four first guided portions 271*f* are disposed at left and right ends of an upper edge of the rear fixed wall portion 2701*f*. The two left first guided portions 271*f* are in slidable contact with the left first guide portion 22*f*. Similarly, the two right first guided portions 271*f* are in slidable contact with the right first guide portion 22*f*. A pair of left and right engaging pawls 2710*f* are provided upright on a top face of each of the first guided portions 271*f*. The pair of the engaging pawls 2710*f* are engaged from the outside with the pair of the engaged recess portions 220*f* of each of the first guide portions 22*f*. This engagement restrains the first guided portions 271*f*, namely, the first movable transfer device 27*f* from falling off from the pair of the first guide portions 22*f*.

(Visual Recognition Positions 21*f* and 21*r*)

As indicated by dotted lines in FIG. 3, the visual recognition position 21*f* is disposed in front of the first imaging position 28*f*. As indicated by dotted lines in FIG. 3, the visual recognition position 21*r* is disposed in front of and below the second imaging position 28*r*. The visual recognition positions 21*f* and 21*r* are adjacent to the operation area 95*f*.

[Motion of Printed Condition Inspection Apparatus]

Next, the motion of the printed condition inspection apparatus 1 according to the present embodiment will be described. That is, the motion in inspecting the printed condition of solder on the first circuit board 94*f* and the second circuit board 94*r* will be described.

(Motion in Inspecting Second Circuit Board 94*r*)

A method of inspecting the second circuit board 94*r* has an imaging inspection step, a transfer step, and a visual recognition inspection step.

In the imaging inspection step, as shown in FIG. 3, the second circuit board 94*r* that has passed the screen printing machine 92 (see FIG. 1) is imaged by the imaging device 26. This imaging is carried out when the second circuit board 94*r* passes the second imaging position 28*r* of the second lane divided section 902*r*. A calculation device (not shown) compares imaged data with a preset acceptance criterion. That is, the presence or absence of a printing failure such as "a thin spot", "a misalignment", "a bridge" or the like in the solder on the second circuit board 94*r* is inspected. When the calculation device determines, as a result of the comparison, that the printed condition of the solder on the second circuit board 94*r* is acceptable, the second circuit board 94*r* is transferred to the electronic component mounting machine 93 by the fixed conveyer 2704*r* and the movable conveyer 2705*r*. On the other hand, when the calculation device determines that the printed condition of the solder on the second circuit board 94*r* is unacceptable, a transition from the imaging inspection step to the transfer step is made.

Figure 8:
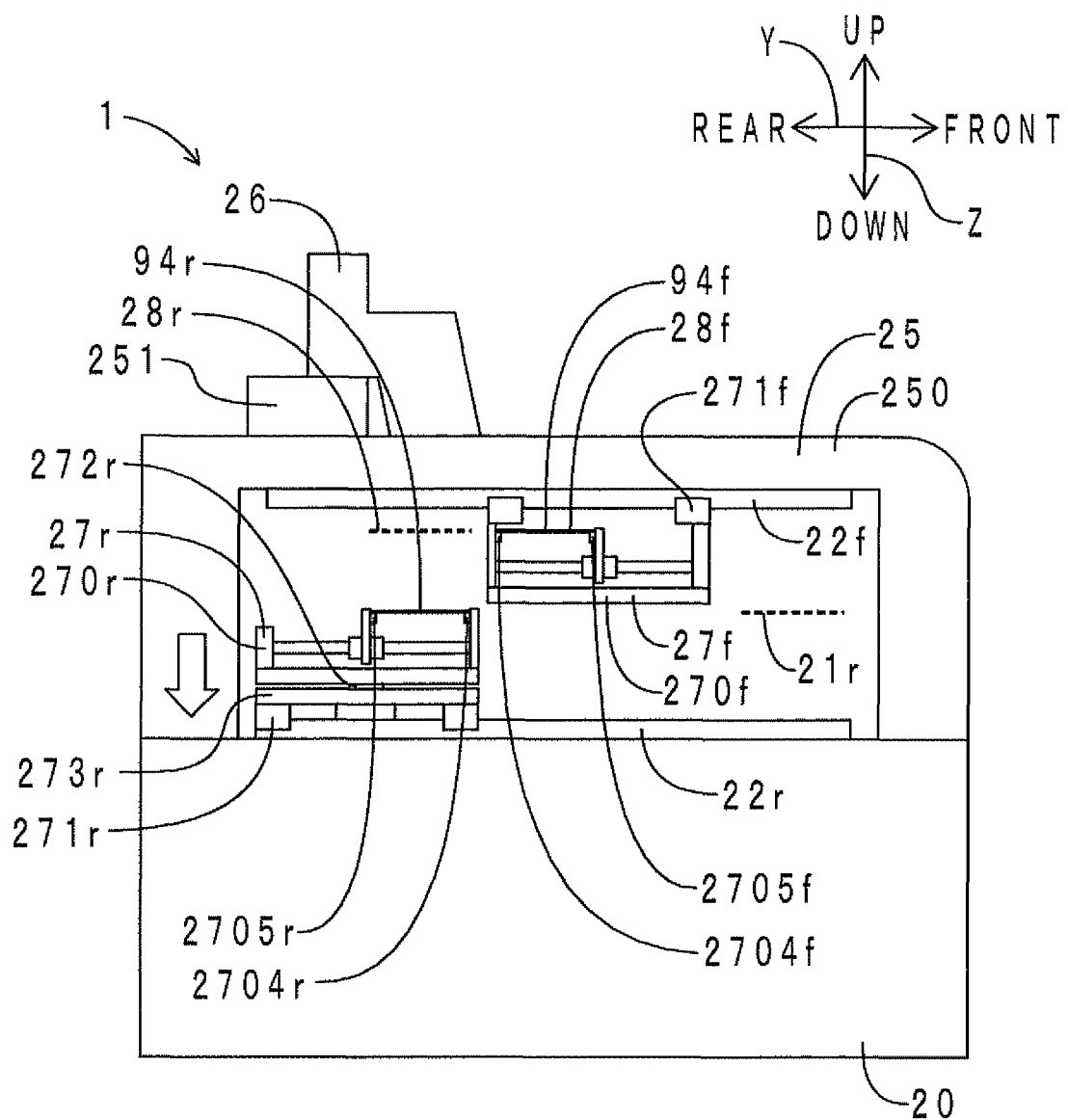
FIG. 8 is a left view of the printed condition inspection apparatus at a first stage of a transfer step during the inspection of a second circuit board.
Figure 9:
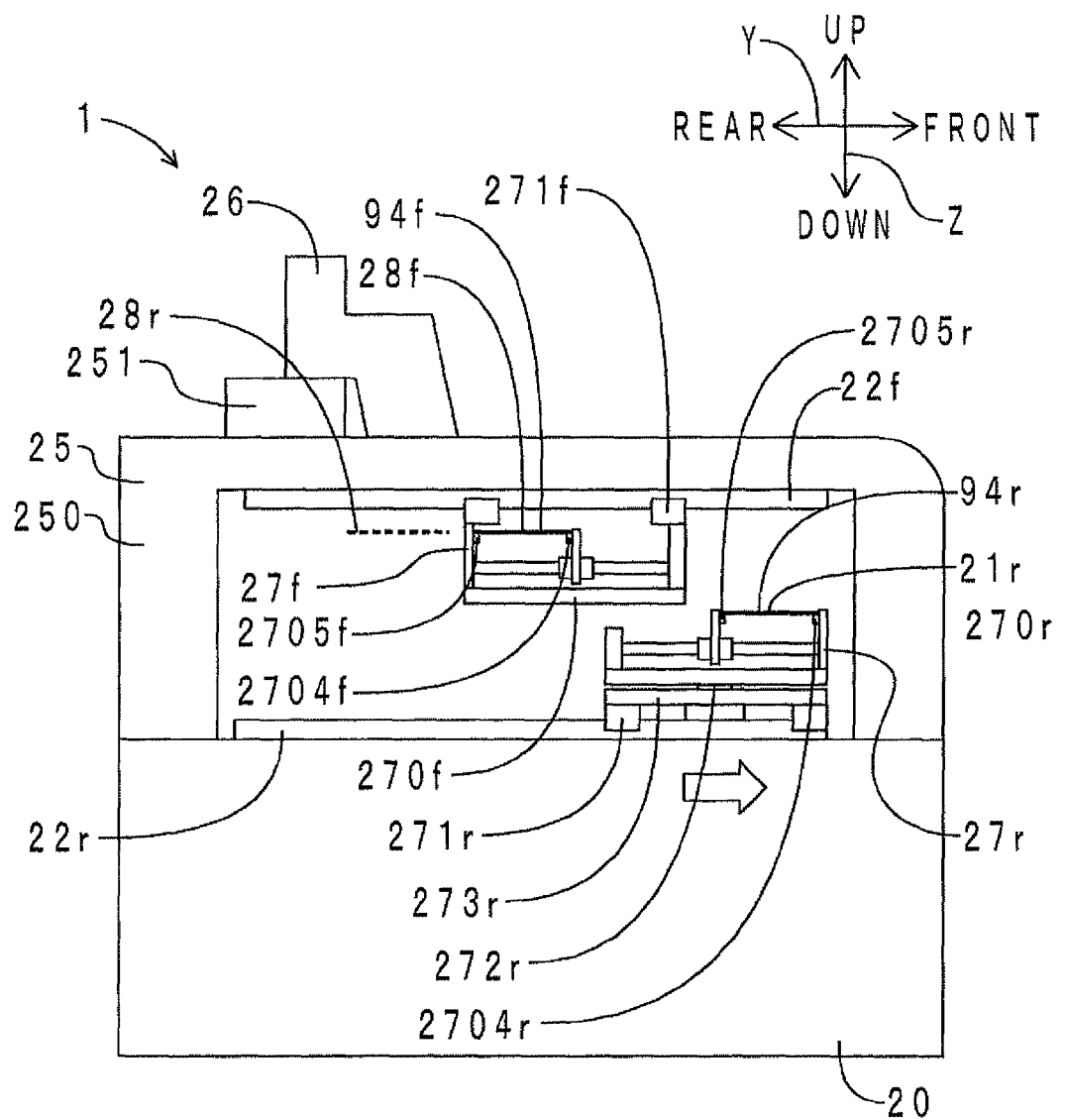
FIG. 9 is a left view of the printed condition inspection apparatus at a second stage of the transfer step.

In the transfer step, the second circuit board 94*r* is transferred from the second imaging position 28*r* to the visual recognition position 21*r*. FIG. 8 is a left view showing the printed condition inspection apparatus according to the present embodiment at the first stage of the transfer step in inspecting the second circuit board. FIG. 9 is a left view showing the printed condition inspection apparatus at the second stage of the transfer step. In FIG. 8, the second imaging position 28*r* and the visual recognition position 21*r* are indicated by dotted lines. In FIG. 9, the second imaging position 28*r* is indicated by dotted lines. At the first stage, as shown in FIG. 8, the second transfer portion 270*r* is lowered by the ball screw portion 272*r* to become adjacent to the second support portion 273*r*. More specifically, as shown in FIG. 5, the servomotor is driven, and the shaft portion 2720*r* retracts below the second support portion 273*r* while being rotated. At the second stage, as shown in FIG. 9, the four second guided portions 271*r* are slid forward with respect to the pair of the second guide portions 22*r*. At this moment, the second transfer portion 270*r* passes a space below the first transfer portion 270*f*. In this manner, the second circuit board 94*r* is transferred from the second imaging position 28*r* to the visual recognition position 21*r*.

In the visual recognition inspection step, the operator 96*f* in the operation area 95*f* visually inspects the printed condition of the solder on the second circuit board 94*r*. When the operator 96*f* determines that the printed condition of the solder on the second circuit board 94*r* is acceptable, the second circuit board 94*r* is returned to the second lane divided section 902*r* by the second movable transfer device 27*r*. Then, the second circuit board 94*r* thus returned is transferred to the electronic component mounting machine 93 by the fixed conveyer 2704*r* and the movable conveyer 2705*r*. When the operator 96*f* determines that the printed condition of the solder on the second circuit board 94*r* is unacceptable, the second circuit board 94*r* is removed from the second movable transfer device 27*r*. That is, the second circuit board 94*r* is removed from the lane 90*r*. The empty second movable transfer device 27*r* is then returned to the second lane divided section 902*r*. In this manner, the second circuit board 94*r* is inspected.

(Motion in Inspecting First Circuit Board 94*f*)

A method of inspecting the first circuit board 94*f* has an imaging inspection step, a transfer step, and a visual recognition inspection step. FIG. 10 is a left view showing the printed condition inspection apparatus according to the present embodiment in the imaging inspection step during the inspection of the first circuit board. In FIG. 10, the visual recognition position 21*f* is indicated by dotted lines. In the imaging inspection step, as shown in FIG. 10, the imaging device 26, namely, the beam body 251 is moved forward with respect to the pair of the left and right frame bodies 250. The first circuit board 94*f* that has passed the screen printing machine 92 (see FIG. 1) is then imaged by the imaging device 26. This imaging is carried out when the first circuit board 94*f* passes the first imaging position 28*f* on the first lane divided section 902*f*. As in the case of the inspection of the second circuit board 94*r*, the calculation device (not shown) makes a determination on the printed condition of the solder on the first circuit board 94*f*. When the calculation device determines that the printed condition of the solder on the first circuit board 94*f* is acceptable, the first circuit board 94*f* is transferred to the electronic component mounting machine 93 by the fixed conveyer 2704*f* and the movable conveyer 2705*f*. On the other hand, when the calculation device determines that the printed condition of the solder on the first circuit board 94*f* is unacceptable, a transition from the imaging inspection step to the transfer step is made.

Figure 11:
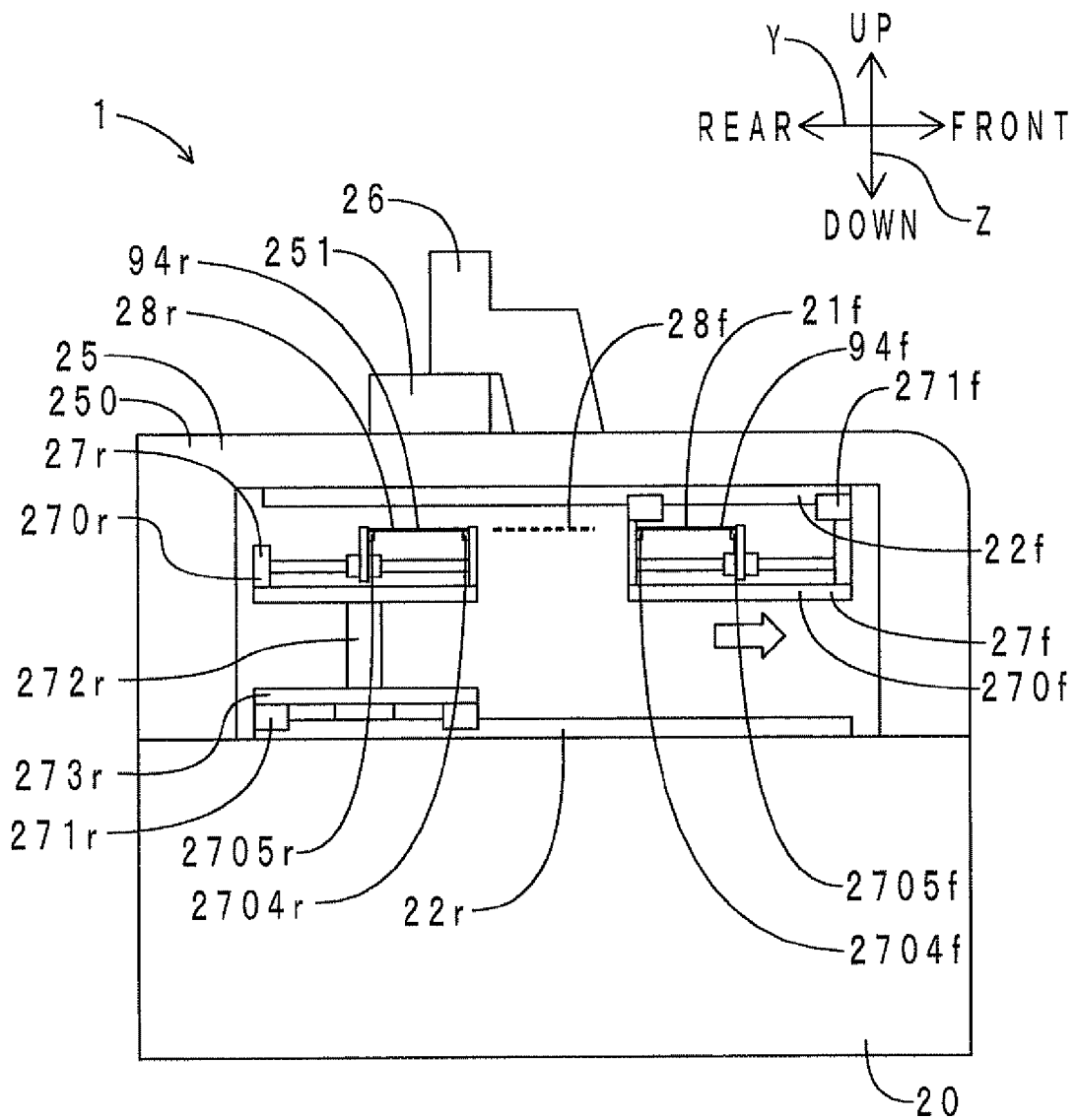
FIG. 11 is a left view of the printed condition inspection apparatus in a transfer step during the inspection of the first circuit board.

In the transfer step, the first circuit board 94*f* is transferred from the first imaging position 28*f* to the visual recognition position 21*f*. FIG. 11 is a left view of the printed condition inspection apparatus according to the present embodiment in the transfer step during the inspection of the first circuit board. In FIG. 11, the first imaging position 28*f* is indicated by dotted lines. In the transfer step, as shown in FIG. 11, the four first guided portions 271*f* are slid forward with respect to the pair of the first guide portions 22*f*. The first circuit board 94*f* is then transferred from the first imaging position 28*f* to the visual recognition position 21*f*.

In the visual recognition inspection step, as in the case of the inspection of the second circuit board 94*r*, the operator 96*f* in the operation area 95*f* visually inspects the printed condition of the solder on the first circuit board 94*f*. When the operator 96f determines that the printed condition of the solder on the first circuit board 94f is acceptable, the first circuit board 94f is returned to the first lane divided section 902f by the first movable transfer device 27f. The first circuit board 94f thus returned is then transferred to the electronic component mounting machine 93 by the fixed conveyer 2704f and the movable conveyer 2705f. When the operator 96f determines that the printed condition of the solder on the first circuit board 94f is unacceptable, the first circuit board 94f is removed from the first movable transfer device 27f. That is, the first circuit board 94f is removed from the lane 90f. The empty first movable transfer device 27f is then returned to the first lane divided section 902f. In this manner, the first circuit board 94f is inspected.

It should be noted that the first movable transfer device 27f comes off from the first lane divided section 902, namely, from the lane 90f during the inspection of the first circuit board 94f. Thus, instead of the first movable transfer device 27f, the second movable transfer device 27r transfers the first circuit board 94f (the first circuit board 94f produced subsequently to the first circuit board 94f under inspection) in the left-right direction. More specifically, the second movable transfer device 27r is moved in a reciprocating manner between the second lane divided section 902r and the first lane divided section 902f. In this case, the height of the second transfer portion 270r is held as shown in FIG. 3.

[Operation and Effect]

Next, the operation and effect of the printed condition inspection apparatus 1 according to the present embodiment will be described. According to the printed condition inspection apparatus 1 of the present embodiment, as shown in FIGS. 1 and 3, the operation area 95f, the visual recognition position 21r, the visual recognition position 21f, the first imaging position 28f (the first lane divided section 902f), and the second imaging position 28r (the second lane divided section 902r) are arranged in this order from the front side to the rear side. That is, the printed condition inspection apparatus 1 according to the present embodiment is equipped with two lane divided sections (the first lane divided section 902f and the second lane divided section 902r). Thus, the printed condition inspection apparatus 1 according to the present embodiment can cope with the dualized lanes 90f and 90r.

Further, according to the printed condition inspection apparatus 1 of the present embodiment, as shown in FIGS. 1 and 3, the visual recognition positions 21f and 21r are adjacent to the operation area 95f for the operator 96f. The first circuit board 94f on the first lane divided section 902f is transferred to the visual recognition position 21f. The second circuit board 94r on the second lane divided section 902r is transferred to the visual recognition position 21r. Thus, the operator 96f can inspect both the first circuit board 94f and the second circuit board 94r from the operation area 95f. That is, the first circuit board 94f on the first lane divided section 902f, which is located close to the operation area 95f, as well as the second circuit board 94r on the second lane divided section 902r, which is located far from the operation area 95f, can be inspected from the operation area 95f. Thus, there is no need to provide two operation areas 95f on both the sides of the base 20 in the front-rear direction. Accordingly, high space efficiency is achieved.

Further, according to the printed condition inspection apparatus 1 of the present embodiment, the ball screw portion 272r is disposed on the second movable transfer device 27r. Thus, when the second circuit board 94r is transferred from the second lane divided section 902r to the visual recognition position 21r, the second transfer portion 270r is unlikely to interfere with the first lane divided section 902f.

Further, according to the printed condition inspection apparatus 1 of the present embodiment, the first guide portions 22f are disposed on the frame 25. Also, the second guide portion 22r is disposed on the base 20. Thus, the first movable transfer device 271 and the second movable transfer device 27r are unlikely to interfere with each other.

Further, according to the printed condition inspection apparatus 1 of the present embodiment, the first guide portion 22f and the second guide portion 22r are so disposed as to overlap with each other as viewed from above or from below. Thus, the entire length of the printed condition inspection apparatus 1 in the left-right direction can be made short.

Further, according to the printed condition inspection apparatus 1 of the present embodiment, even during the inspection of the first circuit board 94f, production of first circuit boards 94f on the first lane divided section 902f can be continued, using the second movable transfer device 27r. Thus, the inspection of the first circuit board 94f transferred for the n-th time can be restrained from causing a delay in the transfer of the (n+1)-th and subsequent first circuit boards 94f. That is, the production efficiency of the first circuit boards 94f can be restrained from decreasing.

Further, according to the printed condition inspection apparatus 1 of the present embodiment, even during the inspection of the second circuit board 94r, production of second circuit boards 94r on the second lane divided section 902r can be continued, using the first movable transfer device 27f. Thus, the inspection of the second circuit board 94r transferred for the n-th time can be restrained from causing a delay in the transfer of the (n+1)-th and subsequent second circuit boards 94r. That is, the production efficiency of the second circuit boards 94r can be restrained from decreasing.

Further, according to the printed condition inspection apparatus 1 of the present embodiment, the first circuit board 94f can be inspected first at the first imaging position 28f and then at the visual recognition position 21f. Similarly, the second circuit board 94r can be inspected first at the second imaging position 28r and then at the visual recognition position 21r. Thus, the accuracy of the inspection is enhanced in comparison with a case where the first circuit board 94f and the second circuit board 94r are inspected only at the visual recognition positions 21f and 21r, respectively.

Second Embodiment

[Configuration of Production Line]

A production line on which a printed condition inspection apparatus according to the present embodiment is disposed is the same as the production line on which the printed condition inspection apparatus according to the first embodiment is disposed. Accordingly, the description of the production line is omitted herein.

[Configuration of Printed Condition Inspection Apparatus]

Figure 12:
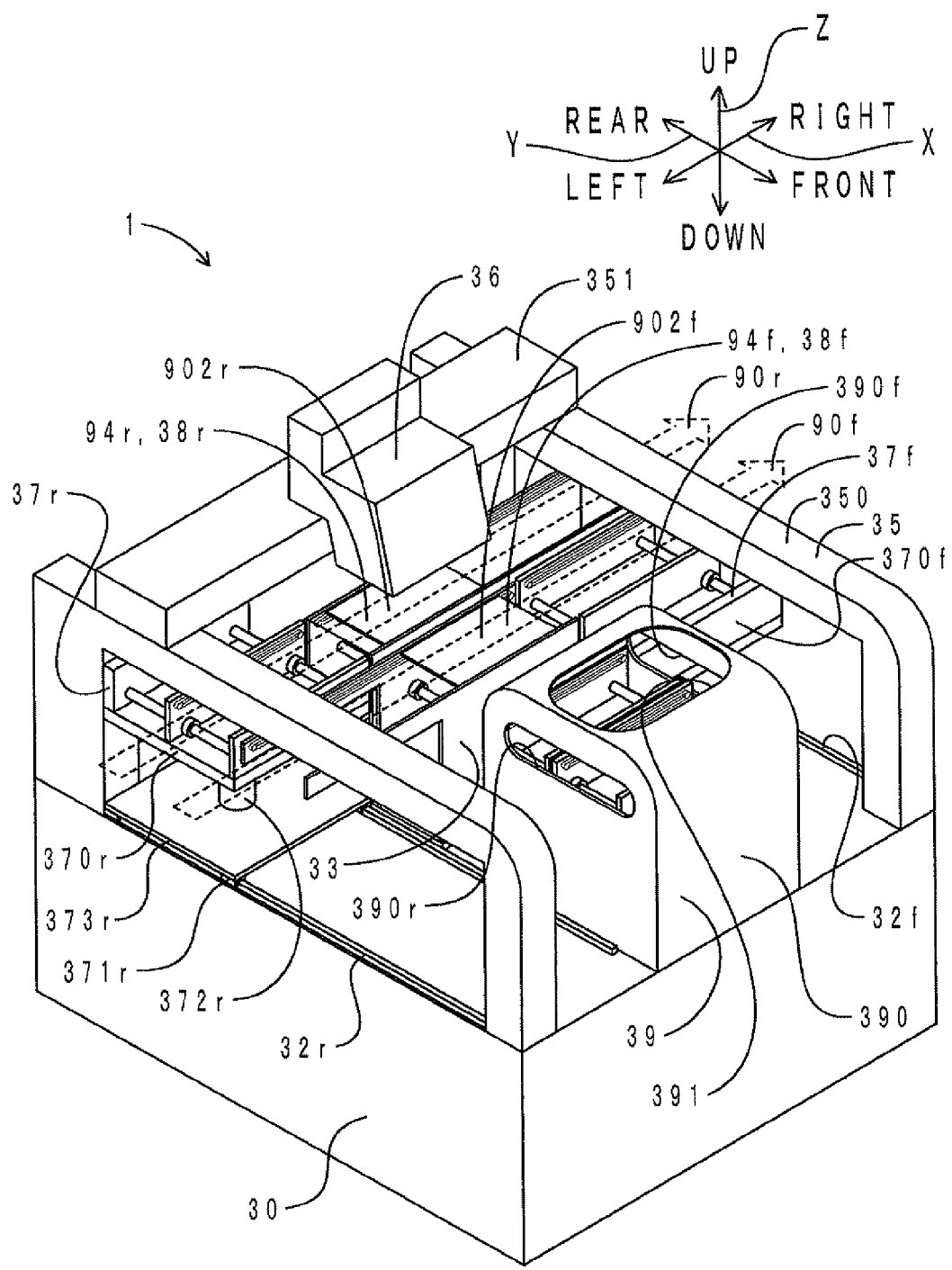
FIG. 12 is a perspective view of a printed condition inspection apparatus according to a second embodiment of the present invention.
Figure 13:
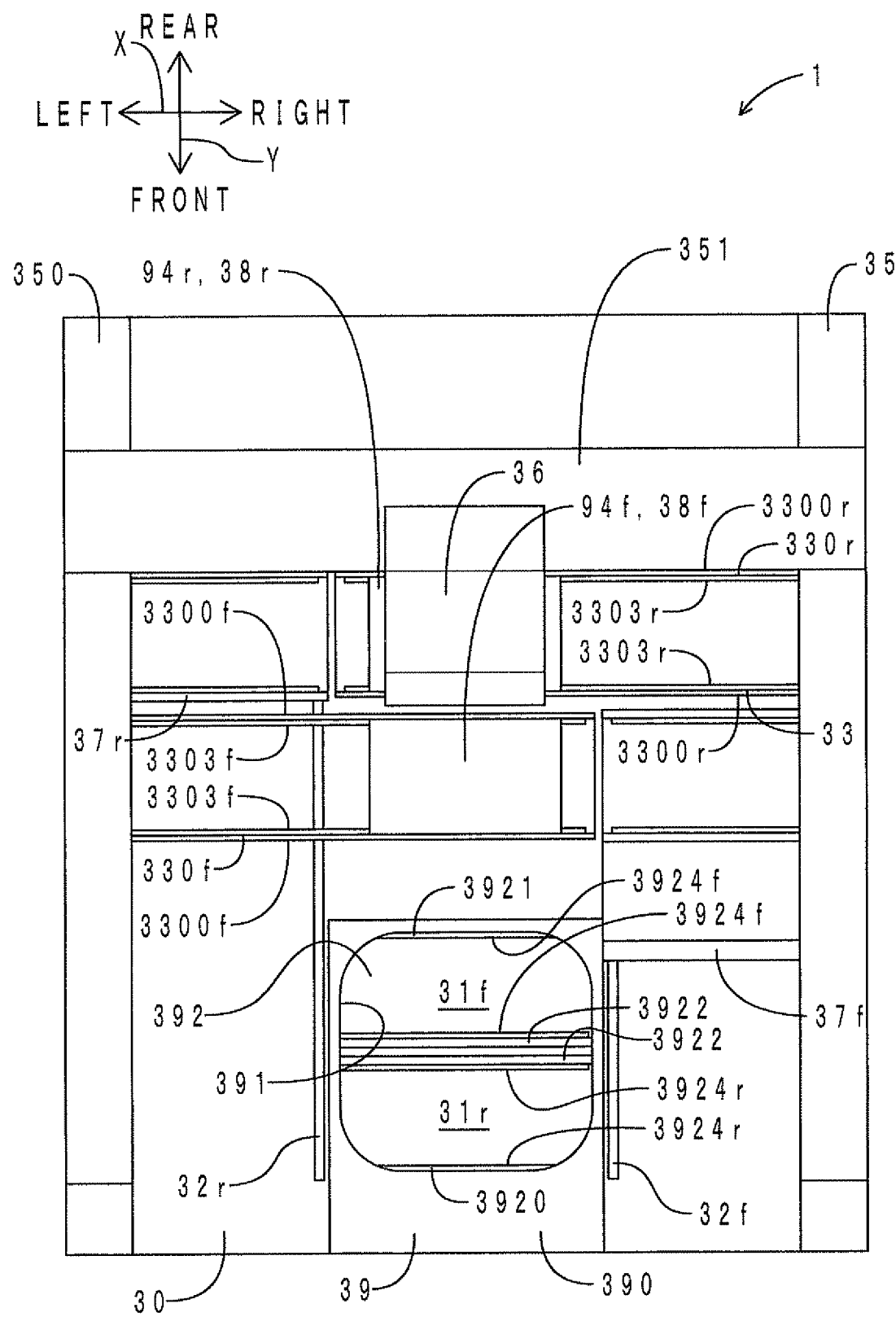
FIG. 13 is a top view of the printed condition inspection apparatus.
Figure 14:
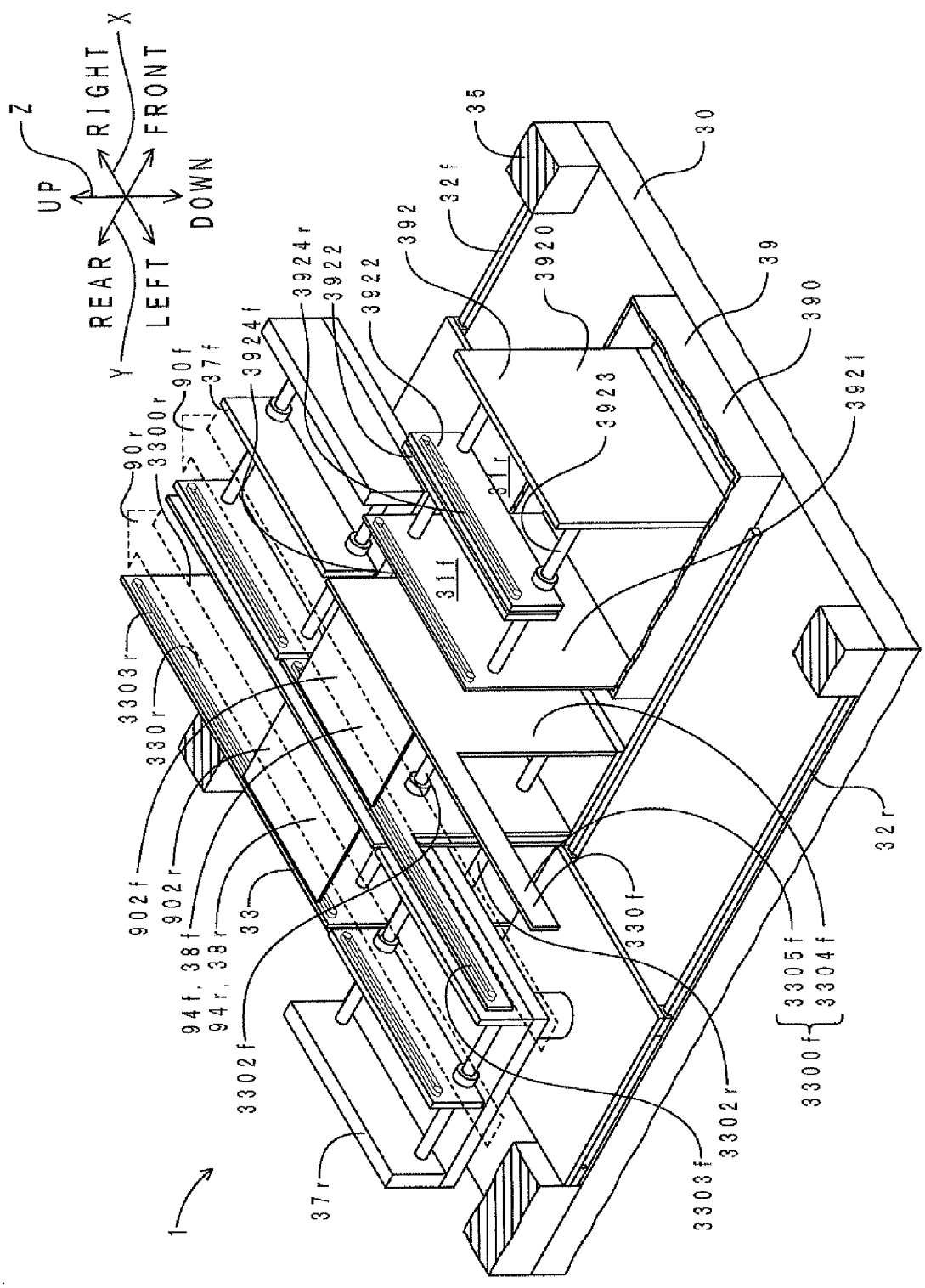
FIG. 14 is a perspective view of the printed condition inspection apparatus with a frame and a case of a stacker cut away therefrom.

Next, the configuration of the printed condition inspection apparatus according to the present embodiment will be described. FIG. 12 is a perspective view showing the printed condition inspection apparatus according to the present embodiment. It should be noted in FIG. 12 that components corresponding to those of FIG. 2 are denoted by the same reference symbols. FIG. 13 is a top view showing the printed condition inspection apparatus. It should be noted that the ball screw portions are omitted for convenience of explanation. FIG. 14 is a perspective view showing the printed condition inspection apparatus according to the present embodiment with a frame and a case of a stacker cut away therefrom. It should be noted in FIG. 14 that components corresponding to those of FIG. 2 are denoted by the same reference symbols.

Figure 15:
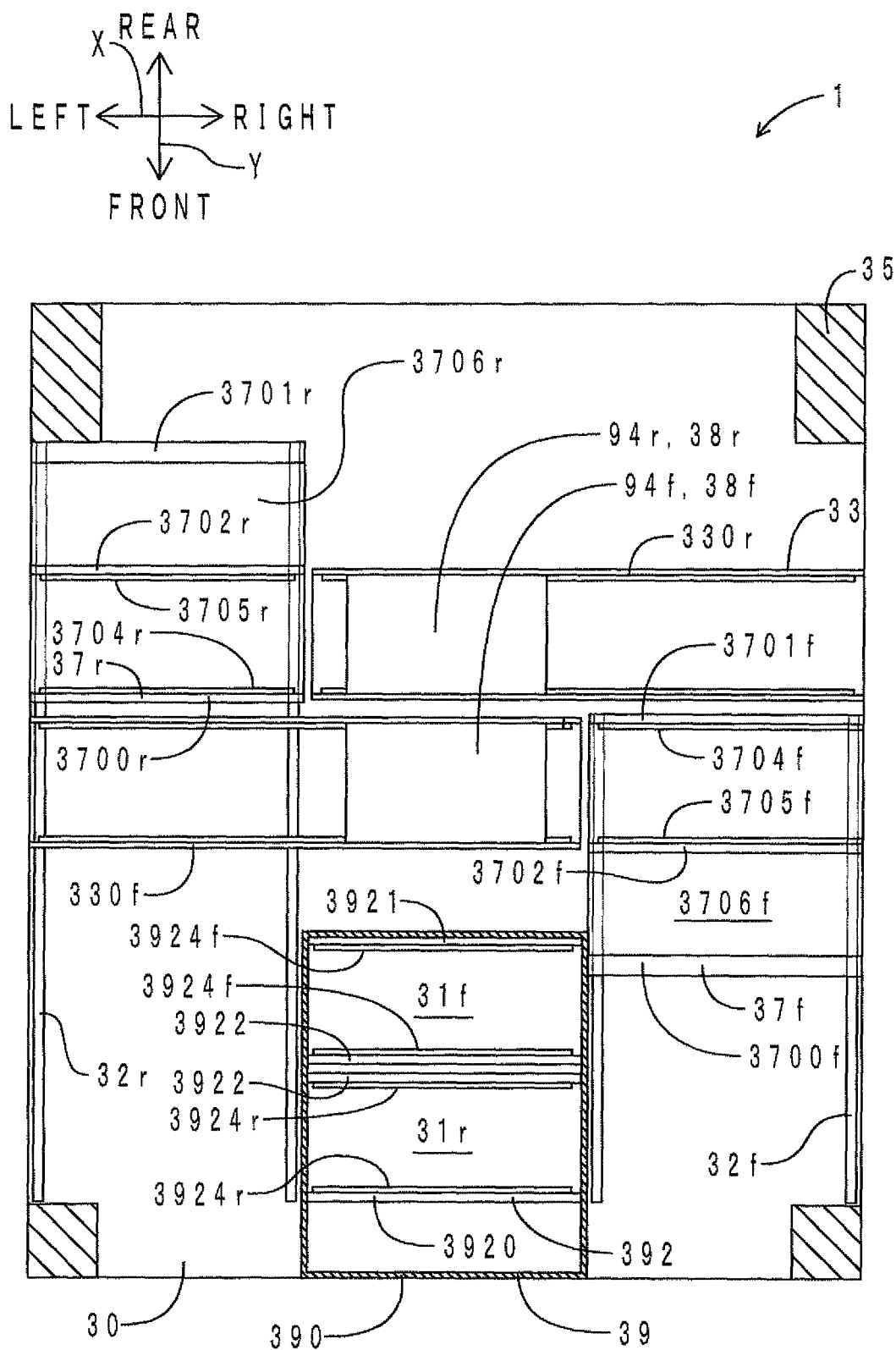
FIG. 15 is a top view of the printed condition inspection apparatus with the frame and the case of the stacker cut away therefrom.

FIG. 15 is a top view showing the printed condition inspection apparatus with the frame and the case of the stacker cut away therefrom. It should be noted that the ball screw portions are omitted for convenience of explanation.

As shown in FIGS. 12 to 15, the printed condition inspection apparatus 1 according to the present embodiment is equipped with a base 30, the first lane divided section 902f, the second lane divided section 902r, a first movable transfer device 37f, a second movable transfer device 37r, a pair of first guide portions 32f, a pair of second guide portions 32r, visual recognition positions 31f and 31r, a frame 35, a first imaging position 38f, a second imaging position 38r, an imaging device 36, a fixed transfer device 33, and a stacker 39.

(Base 30)

The base 30 assumes the shape of a rectangular parallelepiped block. The base 30 is laid on a floor of a plant. A groove portion (not shown) is provided in a top-face left portion of the base 30 between the later-described pair of the second guide portions 32r. The groove portion extends in the front-rear direction.

(Frame 35 and Imaging Device 36)

The frame 35 is equipped with a pair of left and right frame bodies 350 and a beam body 351. The frame bodies 350 assume the shape of C that opens downward. The pair of the frame bodies 350 are provided upright and upward from left and right edges of the top face of the base 30. The beam body 351 assumes the shape of a rectangular parallelepiped that is long in the left-right direction. The beam body 351 is provided bridging upper-edge top faces of the pair of the frame bodies 350. The beam body 351 can slide in the front-rear direction with respect to the pair of the frame bodies 350. The imaging device 36 is disposed on the beam body 351. The imaging device 36 can slide in the left-right direction with respect to the beam body 351. The imaging device 36 can image a lower area.

(First Guide Portions 32f and Second Guide Portions 32r)

The pair of the first guide portions 32f are disposed on a top-face right portion of the base 30. The pair of the first guide portions 32f assume the shape of a rectangular column long in the front-rear direction. The pair of the second guide portions 32r are disposed on the top-face left portion of the base 30. The pair of the second guide portions 32r assume the shape of a rectangular column long in the front-rear direction.

(Second Lane Divided Section 902r and Second Movable Transfer Device 37r)

Figure 16:
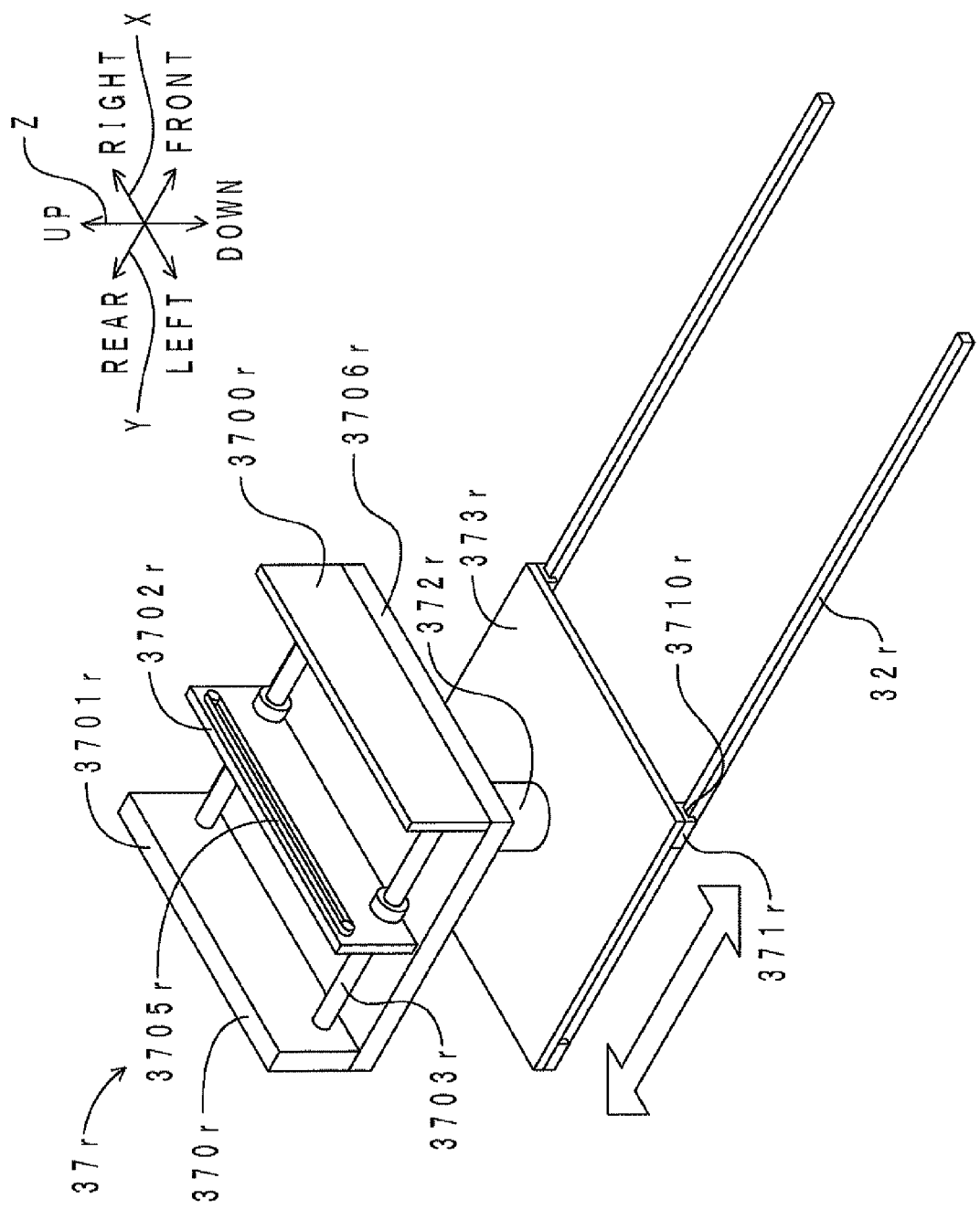
FIG. 16 is a perspective view of a second movable transfer device and second guide portions of the printed condition inspection apparatus.
Figure 17:
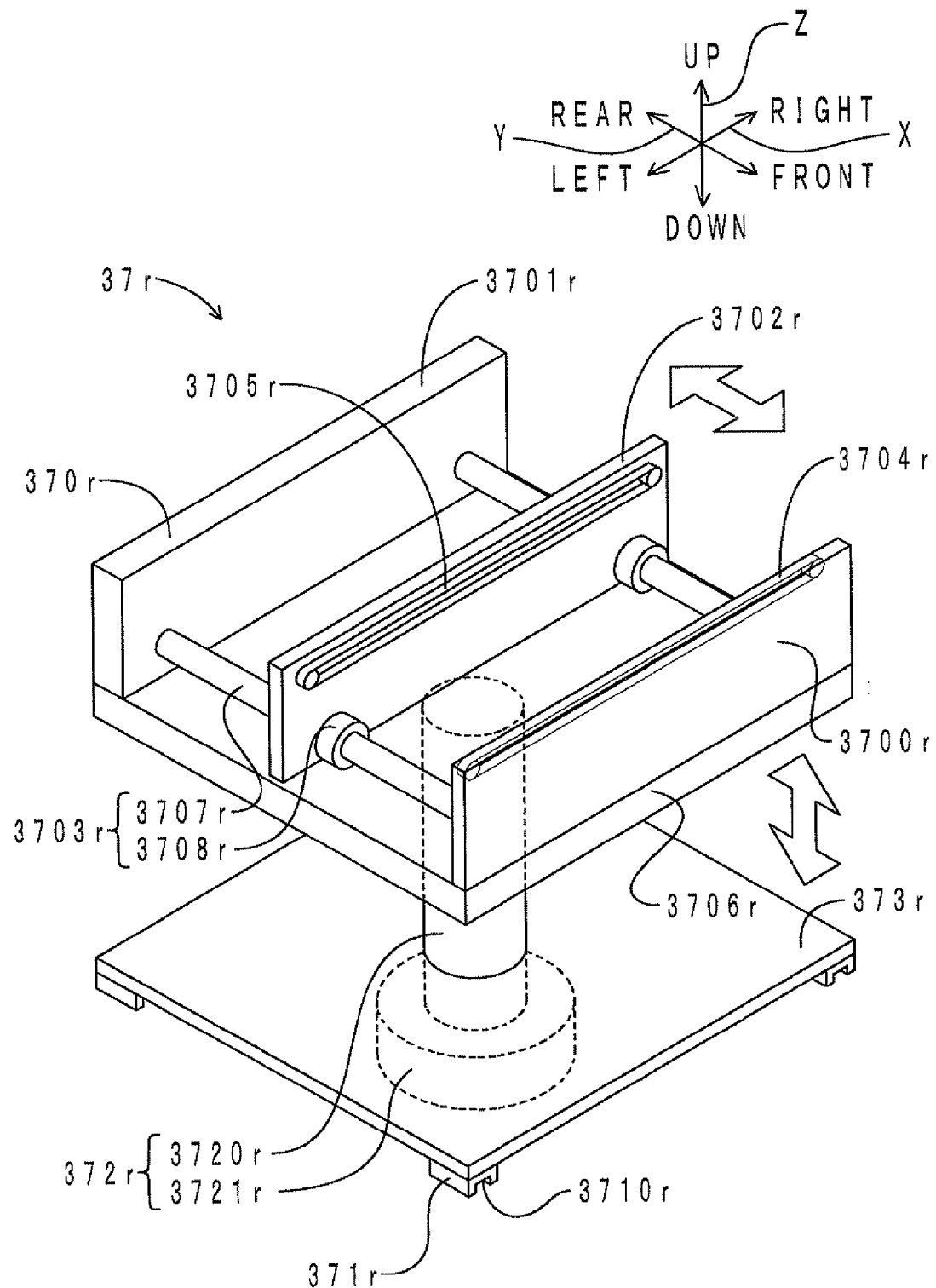
FIG. 17 is a perspective view of the second movable transfer device.

The second lane divided section 902r extends across the base 30 in the left-right direction. In producing the second circuit board 94r, the second movable transfer device 37r is disposed on the second lane divided section 902r. FIG. 16 is a perspective view showing the second movable transfer device and the second guide portions of the printed condition inspection apparatus according to the present embodiment. It should be noted in FIG. 16 that components corresponding to those of FIG. 4 are denoted by the same reference symbols. FIG. 17 is a perspective view showing the second movable transfer device. It should be noted in FIG. 17 that components corresponding to those of FIG. 5 are denoted by the same reference symbols.

As shown in FIGS. 16 and 17, the second movable transfer device 37r is equipped with a second transfer portion 370r, four second guided portions 371r, a ball screw portion 372r, and a second support portion 373r. The ball screw portion 372r is included in the height adjustment portion of the present invention.

The second transfer portion 370r is equipped with a front fixed wall portion 3700r, a rear fixed wall portion 3701r, a movable wall portion 3702r, a pair of ball screw portions 3703r, a fixed conveyer 3704r, a movable conveyer 3705r, and a bottom plate 3706r. The bottom plate 3706r assumes the shape of a rectangular plate. The front fixed wall portion 3700r assumes the shape of a rectangular plate. The front fixed wall portion 3700r is provided upright and upward from a front edge of the bottom plate 3706r. The rear fixed wall portion 3701r assumes the shape of a rectangular plate. The rear fixed wall portion 3701r is provided upright and upward from a rear edge of the bottom plate 3706r. The movable wall portion 3702r assumes the shape of a rectangular plate. The movable wall portion 3702r is disposed between the front fixed wall portion 3700r and the rear fixed wall portion 3701r. The fixed conveyer 3704r, which is long in the left-right direction, is disposed on a rear face of the front fixed wall portion 3700r. The movable conveyer 3705r, which is long in the left-right direction, is disposed on a front face of the movable wall portion 3702r. The fixed conveyer 3704r and the movable conveyer 3705r face each other in the front-rear direction. The pair of the ball screw portions 3703r are disposed in the vicinity of left and right edges of the second transfer portion 370r. The pair of the ball screw portions 3703r are interposed between the movable wall portion 3702r and a servomotor (not shown). To put it in more detail, each of the ball screw portions 3703r is equipped with a shaft portion 3707r and a nut portion 3708r. The shaft portion 3707r and the nut portion 3708r are screwed to each other via a large number of balls (not shown). The shaft portion 3707r is coupled to the servomotor. On the other hand, the nut portion 3708r is fixed to the movable wall portion 3702r. When the servomotor is driven, the shaft portion 3707r rotates around its axis. Thus, the nut portion 3708r moves in the front-rear direction along the axis of the shaft portion 3707r. Accordingly, the movable wall portion 3702r can be moved in the front-rear direction. That is, the clearance between the movable conveyer 3705r and the fixed conveyer 3704r can be adjusted.

The second support portion 373r assumes the shape of a rectangular plate. The second support portion 373r is disposed below the second transfer portion 370r.

The four second guided portions 371r are disposed at four corners of a lower face of the second support portion 373r. Out of these four second guided portions 371r, the two left second guided portions 371r are in slidable contact with the left second guide portion 32r. Similarly, the two right second guided portions 371r are in slidable contact with the right second guide portion 32r. Groove portions 3710r long in the front-rear direction are provided in lower faces of the second guided portions 371r. The groove portions 3710r are engaged with the second guide portions 32r.

The ball screw portion 372r is interposed between the second transfer portion 370r and the second support portion 373r. The ball screw portion 372r is equipped with a shaft portion 3720r and a nut portion 3721r. The shaft portion 3720r and the nut portion 3721r are screwed to each other via a large number of balls (not shown). The shaft portion 3720r is coupled to the servomotor (not shown). On the other hand, the nut portion 3721r is fixed to the second support position 373r. When the servomotor is driven, the shaft portion 3720r rotates around its axis. Thus, the shaft portion 3720r retracts below the second support portion 373r. It should be noted that the groove portion of the base 30 is an immersion space for the shaft portion 3720r. By immersing the shaft portion 3720r, the second transfer portion 370r can be lowered.

(First Lane Divided Section 902f and First Movable Transfer Device 37f)

Figure 18:
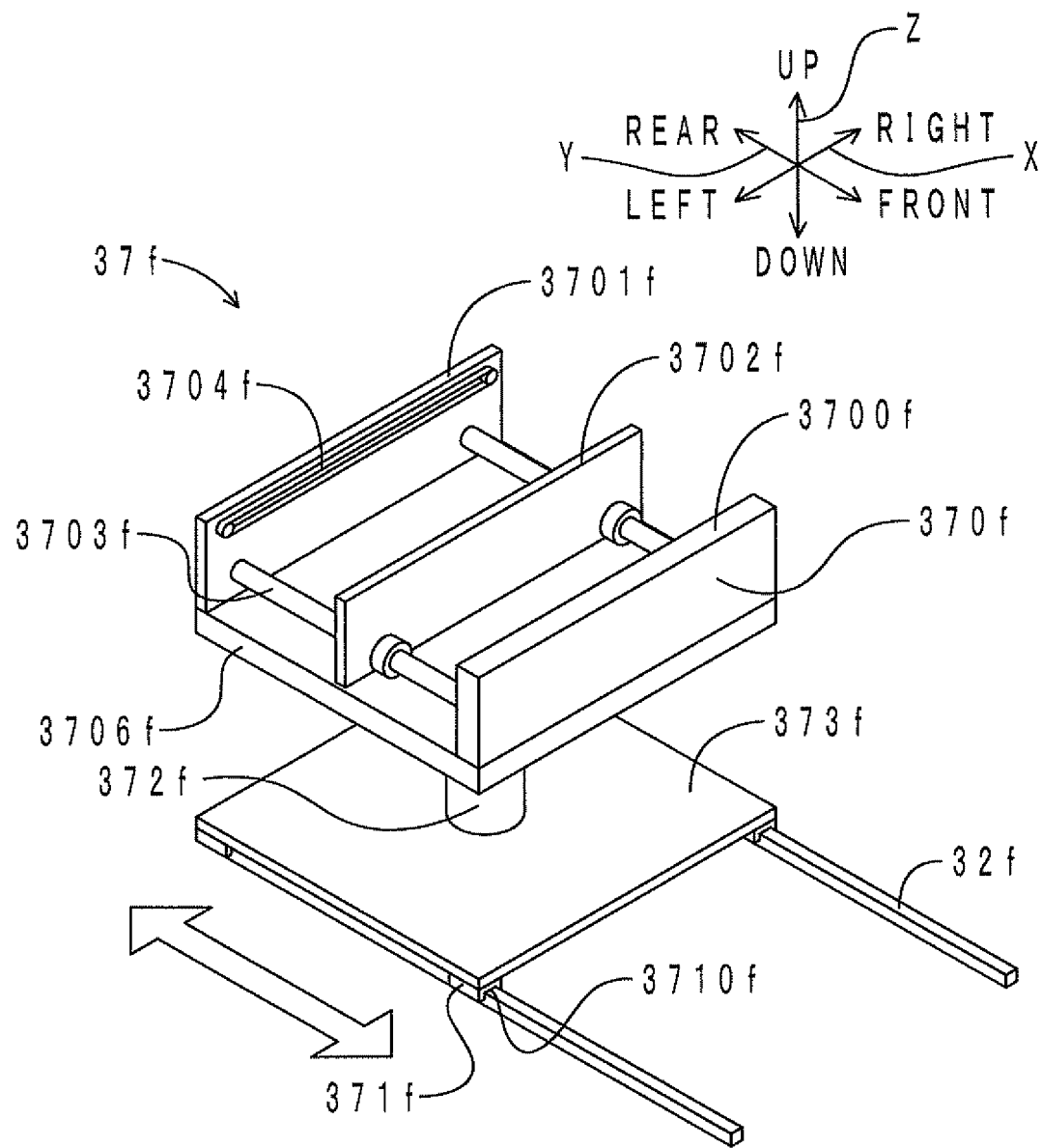
FIG. 18 is a perspective view of a first movable transfer device and first guide portions of the printed condition inspection apparatus.
Figure 19:
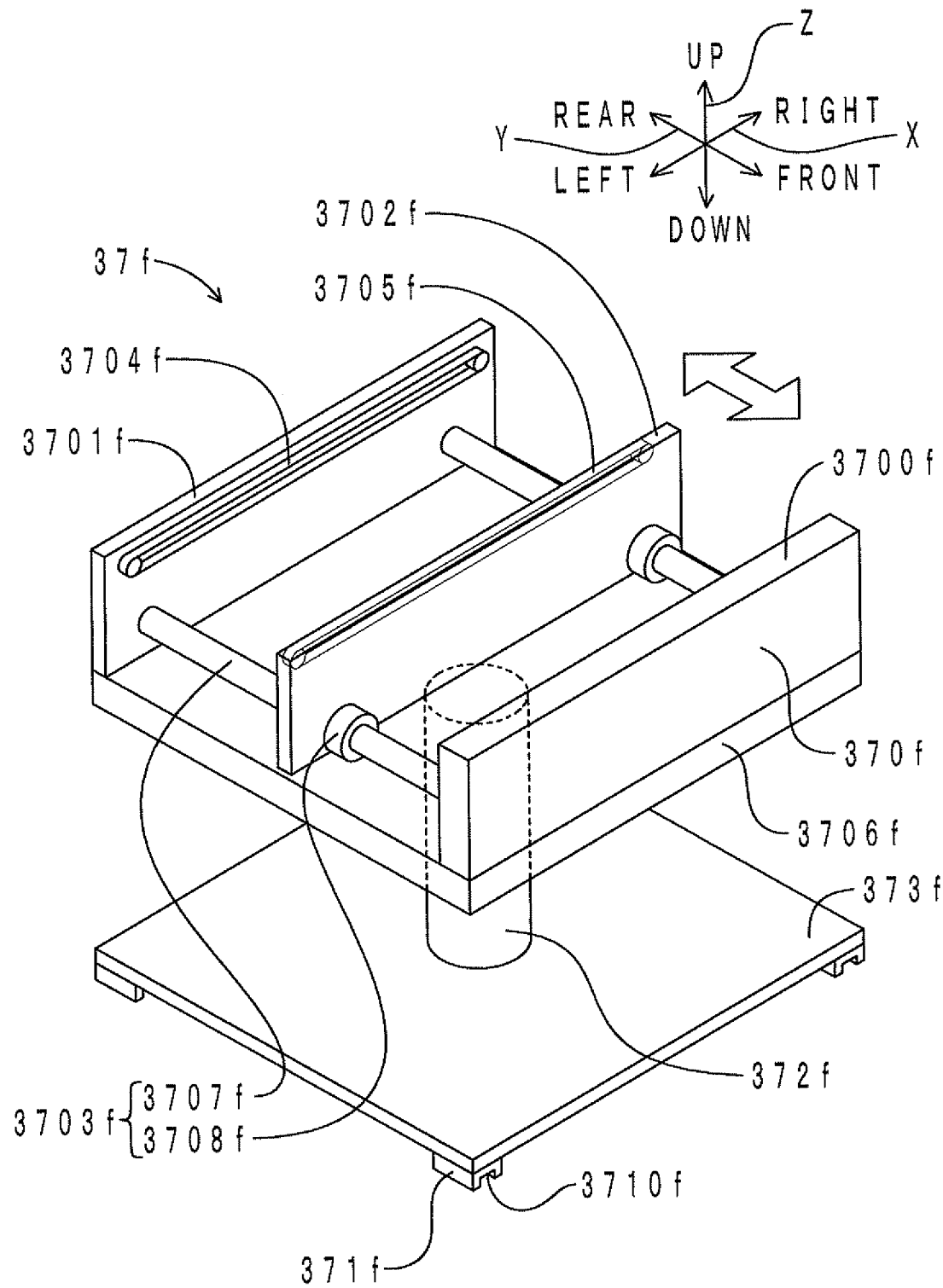
FIG. 19 is a perspective view of the first movable transfer device.

The first lane divided section 902f extends across the base 30 in the left-right direction. The first lane divided section 902f is disposed in front of the second lane divided section 902r. In producing the first circuit board 94f, the first movable transfer device 37f is disposed on the first lane divided section 902f. FIG. 18 is a perspective view showing the first movable transfer device and the first guide portions of the printed condition inspection apparatus according to the present embodiment. It should be noted in FIG. 18 that components corresponding to those of FIG. 6 are denoted by the same reference symbols. FIG. 19 is a perspective view showing the first movable transfer device. It should be noted in FIG. 19 that components corresponding to those of FIG. 7 are denoted by the same reference symbols. As shown in FIGS. 18 and 19, the first movable transfer device 37f is equipped with a first transfer portion 370f, four first guided portions 371f, a column portion 372f, and a first support portion 373f.

The first transfer portion 370f is equipped with a front fixed wall portion 3700f, a rear fixed wall portion 3701f, a movable wall portion 3702f, a pair of ball screw portions 3703f, a fixed conveyer 3704f, a movable conveyer 3705f, and a bottom plate 3706f. The bottom plate 3706f assumes the shape of a rectangular plate. The front fixed wall portion 3700f assumes the shape of a rectangular plate. The front fixed wall portion 3700f is provided upright and upward from a front edge of the bottom plate 3706f. The rear fixed wall portion 3701f assumes the shape of a rectangular plate. The rear fixed wall portion 3701f is provided upright and upward from a rear edge of the bottom plate 3706f. The movable wall portion 3702f assumes the shape of a rectangular plate. The movable wall portion 3702f is disposed between the front fixed wall portion 3700f and the rear fixed wall portion 3701f. The fixed conveyer 3704f, which is long in the left-right direction, is disposed on a front face of the rear fixed wall portion 3701f. The movable conveyer 3705f, which is long in the left-right direction, is disposed on a rear face of the movable wall portion 3702f. The movable conveyer 3705f and the fixed conveyer 3704f face each other in the front-rear direction. The pair of the ball screw portions 3703f are disposed in the vicinity of left and right edges of the first transfer portion 370f. The pair of the ball screw portions 3703f are interposed between the movable wall portion 3702f and the servomotor (not shown). To put it in more detail, each of the ball screw portions 3703f is equipped with a shaft portion 3707f and a nut portion 3708f. The shaft portion 3707f and the nut portion 3708f are screwed to each other via a large number of balls (not shown). The shaft portion 3707f is coupled to the servomotor. On the other hand, the nut portion 3708f is fixed to the movable wall portion 3702f. When the servomotor is driven, the shaft portion 3707f rotates around its axis. Thus, the nut portion 3708f moves in the front-rear direction along the axis of the shaft portion 3707f. Accordingly, the movable wall portion 3702f can be moved in the front-rear direction. That is, the clearance between the movable conveyer 3705f and the fixed conveyer 3704f can be adjusted.

The first support portion 373f assumes the shape of a rectangular plate. The first support portion 373f is disposed below the first transfer portion 370f.

The four first guided portions 371f are disposed at four corners of a lower face of the first support portion 373f. Out of these four first guided portions 371f, the two left first guided portions 371f are in slidable contact with the left first guide portion 32f. Similarly, the two right first guided portions 371f are in slidable contact with the right first guide portion 32f. Groove portions 3710f long in the front-rear direction are provided in lower faces of the first guided portions 371f. The groove portions 3710f are engaged with the first guide portions 32f. The column portion 372f is interposed between the first transfer portion 370f and the first support portion 373f.

(Fixed Transfer Device 33, First Imaging Position 38f, and Second Imaging Position 38r)

Returning to FIGS. 12 to 15, the fixed transfer device 33 is equipped with a first fixed transfer portion 330f and a second fixed transfer portion 330r. The first fixed transfer portion 330f is disposed on the first lane divided section 902f. The first fixed transfer portion 330f is disposed on the left of the first movable transfer device 37f. The first fixed transfer portion 330f is equipped with a pair of wall portions 3300f, a ball screw portion 3302f, and a pair of conveyers 3303f. As shown in FIG. 13, out of the pair of the front and rear wall portions 3300f, the front wall portion 3300f is provided upright from the top face of the base 30. Out of the pair of the front and rear wall portions 3300f, the rear wall portion 3300f can be moved in the front-rear direction by the ball screw portion 3302f shown in FIG. 14. That is, the clearance between the pair of the front and rear wall portions 3300f can be adjusted. Each of the pair of the wall portions 3300f is equipped with a base portion 3304f and an arm portion 3305f. The base portion 3304f is provided upright between the first guide portion 32f and the second guide portion 32r. The base portion 3304f assumes the shape of a rectangular plate. The base portion 3304f extends in the left-right direction. The arm portion 3305f assumes the shape of a narrow plate long in the left-right direction. The arm portion 3305f protrudes leftward from an upper left corner of the base portion 3304f. One of the pair of the conveyers 3303f is disposed on a rear face of the front wall portion 3300f. The other of the pair of the conveyers 3303f is disposed on a front face of the rear wall portion 3300f. The pair of the conveyers 3303f face each other in the front-rear direction. The first circuit board 94f is transferred from the left side to the right side by the pair of the conveyers 3303f. A position where the imaging device 36 is disposed directly above the first circuit board 94f is equivalent to the first imaging position 38f.

The second fixed transfer portion 330r is disposed on the second lane divided section 902r. The second fixed transfer portion 330r is disposed on the right of the second movable transfer device 37r. The second fixed transfer portion 330r is equipped with a pair of wall portions 3300r, a ball screw portion 3302r, and a pair of conveyers 3303r. As shown in FIG. 13, out of the pair of the front and rear wall portions 3300r, the rear wall portion 3300r is provided upright from the top face of the base 30. Out of the pair of the front and rear wall portions 3300r, the front wall portion 3300r can be moved in the front-rear direction by the ball screw portion 3302r shown in FIG. 14. That is, the clearance between the pair of the front and rear wall portions 3300r can be adjusted. The pair of the wall portions 3300r are provided upright from the top face of the base 30. The pair of the wall portions 3300r assume the shape of a rectangular plate. The wall portions 3300r extend in the left-right direction. One of the pair of the conveyers 3303r is disposed on a rear face of the front wall portion 3300r. The other of the pair of the conveyers 3303r is disposed on a front face of the rear wall portion 3300r. The pair of the conveyers 3303r face each other in the front-rear direction. The second circuit board 94r is transferred from the left side to the right side by the pair of the conveyers 3303r. A position where the imaging device 36 is disposed directly above the second circuit board 94r is equivalent to the second imaging position 38r.

(Stacker 39 and Visual Recognition Positions 31f and 31r)

The stacker 39 is equipped with a case 390, a first opening 390f, a second opening 390r, an inspection window 391, and an inspection transfer portion 392. The case 390 assumes the shape of a box. The first opening 390f is opened through a right-wall upper portion of the case 390. The second opening 390r is opened through a left-wall upper portion of the case 390. The inspection window 391 is opened through an upper wall of the case 390. A magnifying lens (not shown) is fitted in the inspection window 391.

The inspection transfer portion 392 is disposed inside the case 390. The inspection transfer portion 392 is equipped with a front fixed wall portion 3920, a rear fixed wall portion 3921, a pair of movable wall portions 3922, a pair of ball screw portions 3923, a pair of first inspection conveyers 3924f, and a pair of second inspection conveyers 3924r. The front fixed wall portion 3920 assumes the shape of a rectangular plate. The front fixed wall portion 3920 is disposed in the vicinity of a front wall of the case 390. The rear fixed wall portion 3921 assumes the shape of a rectangular plate. The rear fixed wall portion 3921 is disposed in the vicinity of a rear wall of the case 390. The pair of the movable wall portions 3922 assume the shape of a rectangular plate. The pair of the movable wall portions 3922 are disposed between the front fixed wall portion 3920 and the rear fixed wall portion 3921.

Out of the pair of the front and rear movable wall portions 3922, the front movable wall portion 3922 can be moved in the front-rear direction by the left ball screw portion 3923 as one of the pair of the left and right ball screw portions 3923. Out of the pair of the front and rear movable wall portions 3922, the rear movable wall portion 3922 can be moved in the front-rear direction by the right ball screw portion 3923 as one of the pair of the left and right ball screw portions 3923.

One of the pair of the first inspection conveyers 3924f is disposed on a front face of the rear fixed wall portion 3921. The other of the pair of the first inspection conveyers 3924f is disposed on a rear face of the rear movable wall portion 3922. The pair of the first inspection conveyers 3924f extend in the left-right direction. The visual recognition position 31f is disposed between the pair of the first inspection conveyers 3924f. The visual recognition position 31f is disposed in front of the first imaging position 38f. The visual recognition position 31f is adjacent to the operation area for the operator.

One of the pair of the second inspection conveyers 3924r is disposed on a rear face of the front fixed wall portion 3920. The other of the pair of the second inspection conveyers 3924r is disposed on a front face of the front movable wall portion 3922. The pair of the second inspection conveyers 3924r extend in the left-right direction. The visual recognition position 31r is disposed between the pair of the second inspection conveyers 3924r. The visual recognition position 31r is disposed in front of the second imaging position 38r. The visual recognition position 31r is adjacent to the operation area for the operator.

[Motion of Printed Condition Inspection Apparatus]

Next, the motion of the printed condition inspection apparatus 1 according to the present embodiment will be described. That is, the motion in inspecting the printed condition of a solder on the first circuit board 94f and the second circuit board 94r will be described.

(Motion in Inspecting Second Circuit Board 94r)

A method of inspecting the second circuit board 94r has an imaging inspection step, a transfer step, and a visual recognition inspection step.

In the imaging inspection step, as shown in FIG. 13, the second circuit board 94r that has passed the screen printing machine is imaged by the imaging device 36. This imaging is carried out when the second circuit board 94r passes the second imaging position 38r of the second lane divided section 902r. A calculation device (not shown) compares imaged data with a preset acceptance criterion. That is, the presence or absence of a printing failure such as "a thin spot", "a misalignment", "a bridge" or the like in the solder on the second circuit board 94r is inspected. When the calculation device determines as a result of this comparison that the printed condition of the solder on the second circuit board 94r is acceptable, the second circuit board 94r is transferred to the electronic component mounting machine by the pair of the conveyers 3303r of the second fixed transfer portion 330r. On the other hand, when the calculation device determines that the printed condition of the solder on the second circuit board 94r is unacceptable, a transition from the imaging inspection step to the transfer step is made.

Figure 20:
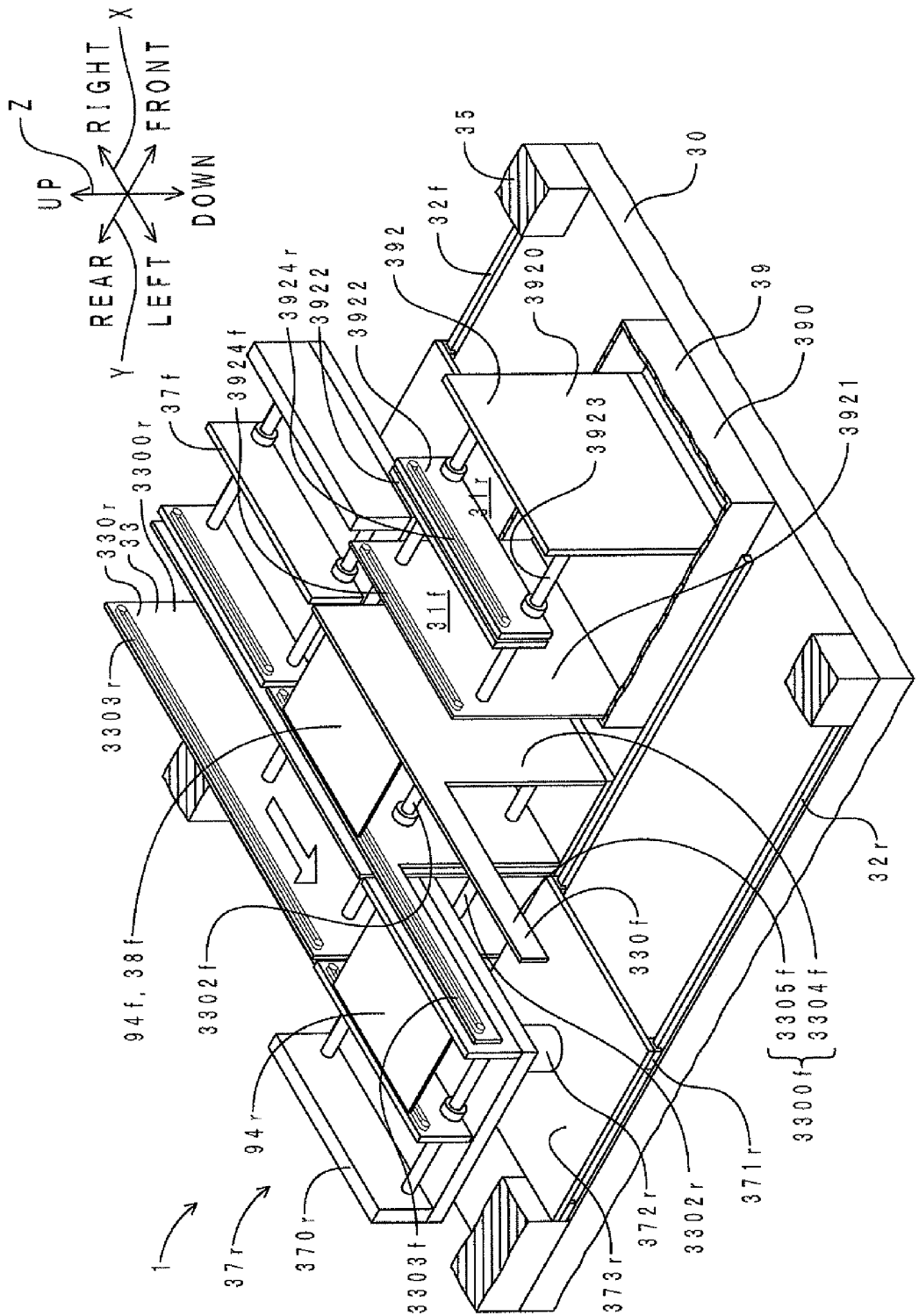
FIG. 20 is a perspective view of the printed condition inspection apparatus (with the frame and the case of the stacker cut away therefrom) at a first stage of a transfer step during the inspection of a second circuit board.
Figure 21:
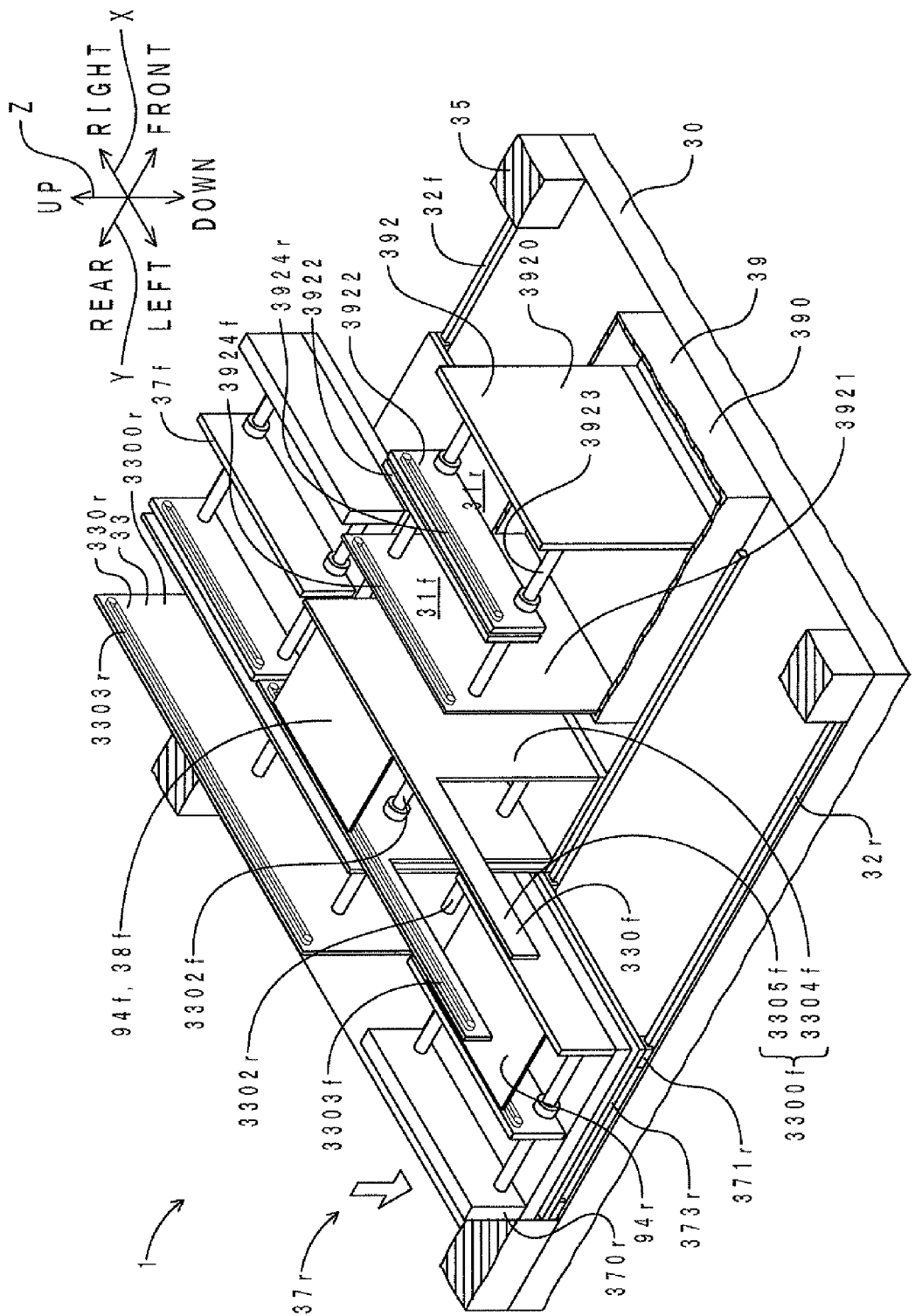
FIG. 21 is a perspective view of the printed condition inspection apparatus at a second stage of the transfer step.
Figure 22:
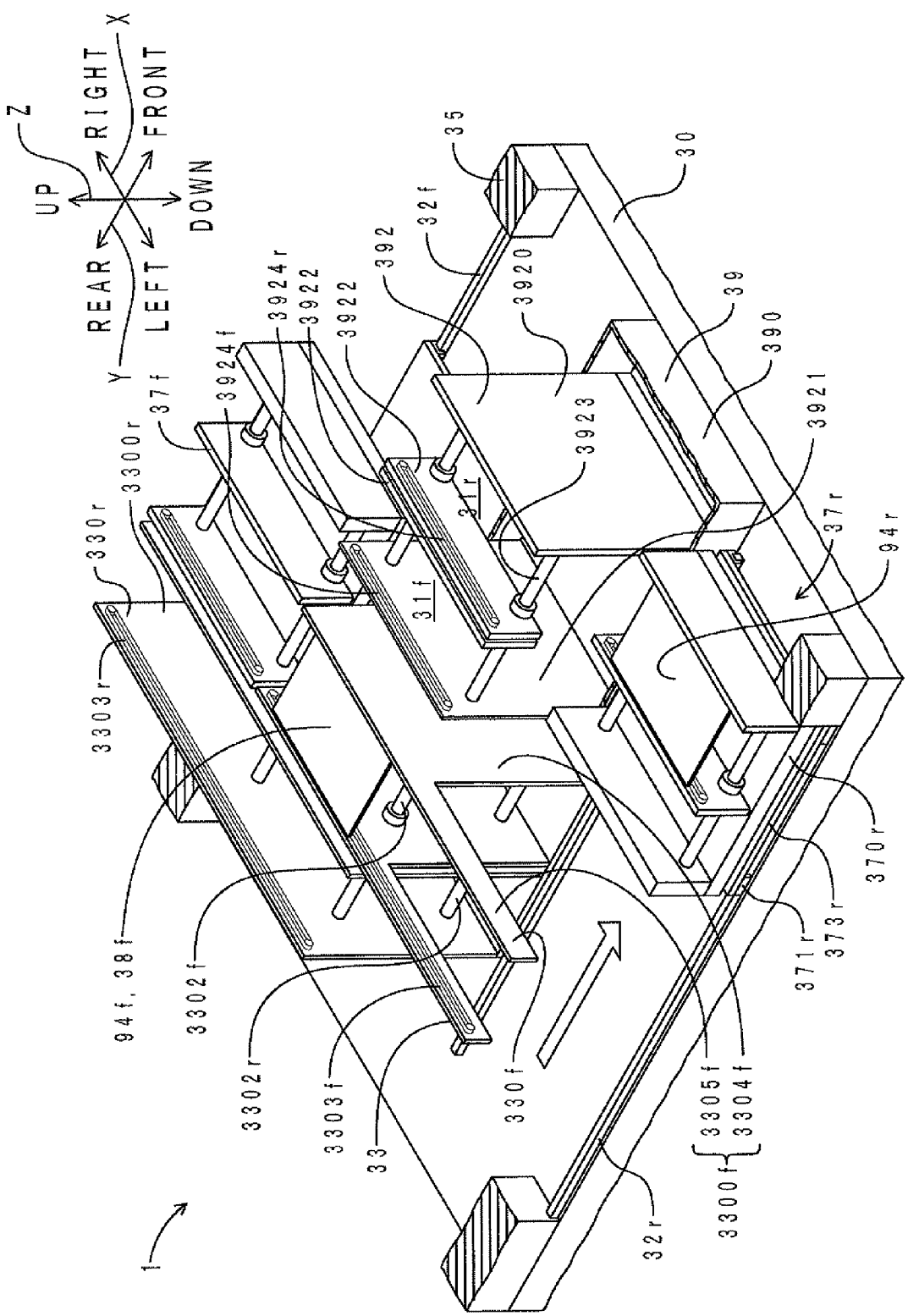
FIG. 22 is a perspective view of the printed condition inspection apparatus at a third stage of the transfer step.
Figure 23:
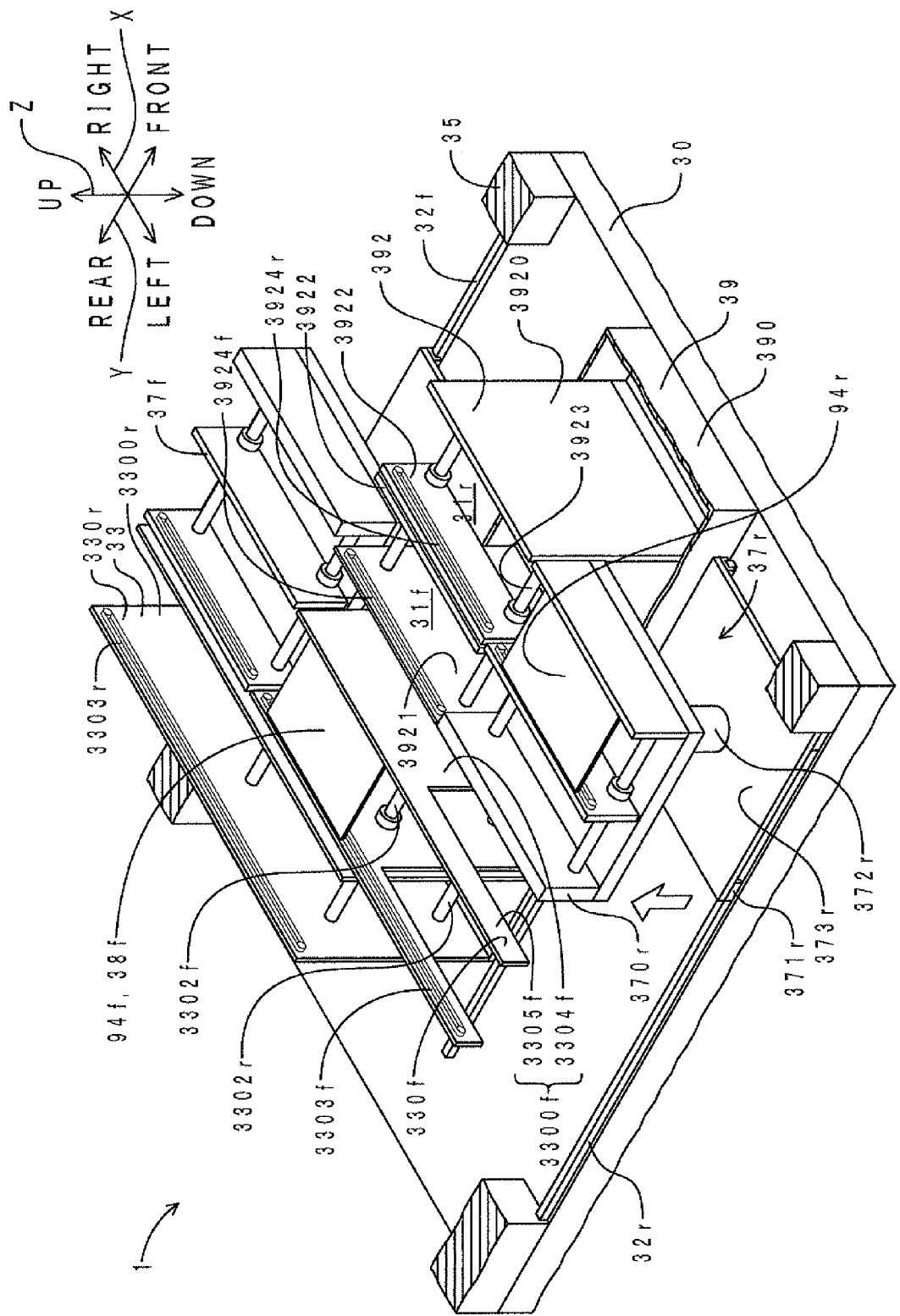
FIG. 23 is a perspective view of the printed condition inspection apparatus at a fourth stage of the transfer step.
Figure 24:
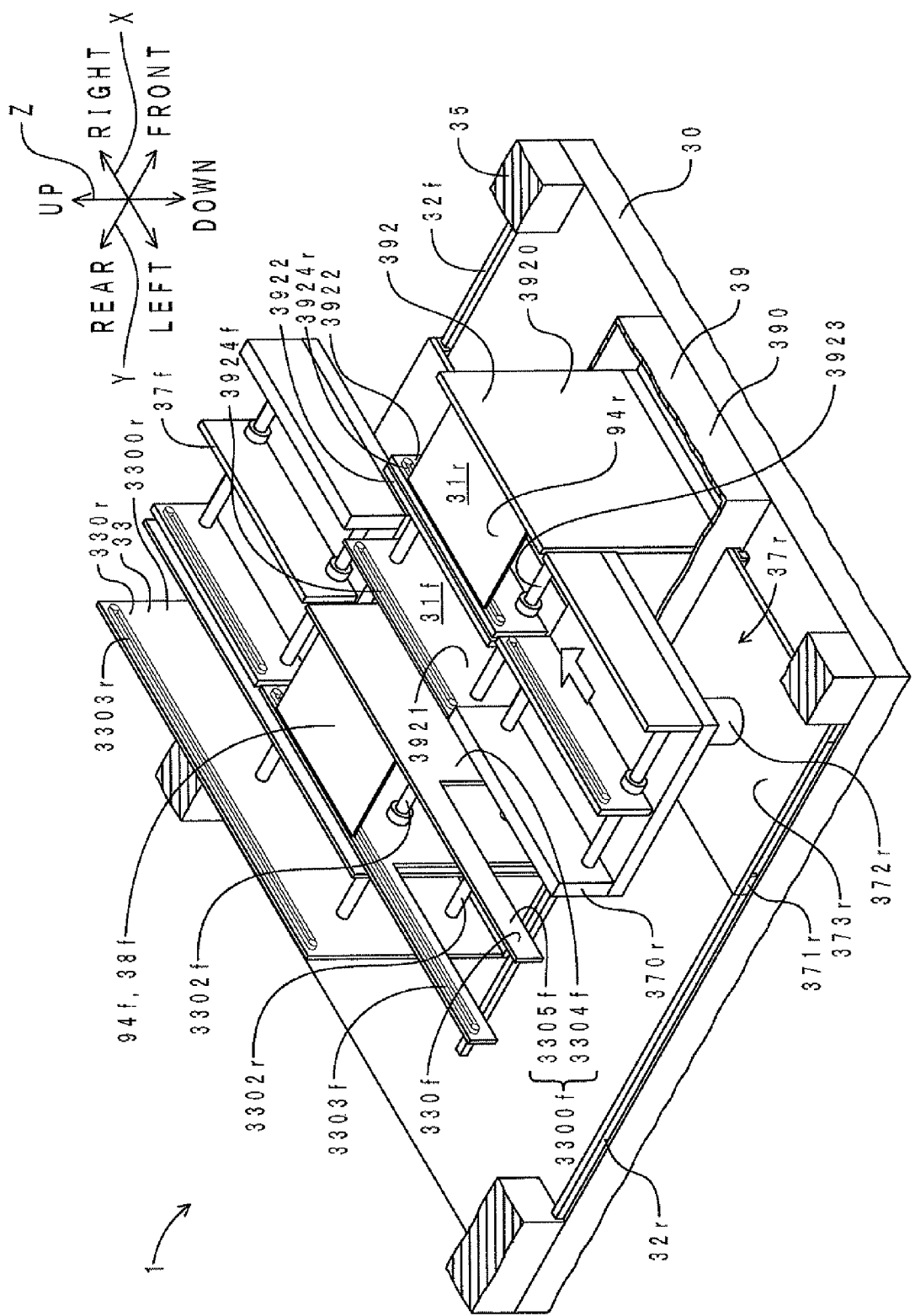
FIG. 24 is a perspective view of the printed condition inspection apparatus at a fifth stage of the transfer step.

In the transfer step, the second circuit board 94r is transferred from the second imaging position 38r to the visual recognition position 31r. FIG. 20 is a perspective view showing the printed condition inspection apparatus according to the present embodiment (with the frame and the case of the stacker cut away therefrom) at the first stage of the transfer step in inspecting the second circuit board. FIG. 21 is a perspective view showing the printed condition inspection apparatus at the second stage of the transfer step. FIG. 22 is a perspective view showing the printed condition inspection apparatus at the third stage of the transfer step. FIG. 23 is a perspective view showing the printed condition inspection apparatus at the fourth stage of the transfer step. FIG. 24 is a perspective view showing the printed condition inspection apparatus at the fifth stage of the transfer step.

At the first stage, as shown in FIG. 20, the pair of the conveyers 3303r are driven in a line-reverse direction. The second circuit board 94r is then transferred from the pair of the conveyers 3303r to the second transfer portion 370r on the left. At the second stage, as shown in FIG. 21, the second transfer portion 370r is lowered by the ball screw portion 372r to become adjacent to the second support portion 373r. More specifically, as shown in FIG. 17, the servomotor is driven, and the shaft portion 3720r retracts below the second support portion 373r while being rotated. At the third stage, as shown in FIG. 22, the four second guided portions 371r are slid forward with respect to the pair of the second guide portions 32r. In this case, the second transfer portion 370r passes a space below the arm portion 3305f of the first fixed transfer portion 330f of the fixed transfer device 33. At the fourth stage, as shown in FIG. 23, the second transfer portion 370r is raised by the ball screw portion 372r. More specifically, as shown in FIG. 17, the servomotor is driven, and the shaft portion 3720r is raised while being rotated. At the fifth stage, as shown in FIG. 24, the second circuit board 94r is transferred from the second transfer portion 370r to the pair of the second inspection conveyers 3924r via the second opening 390r of the case 390 (see FIG. 12). In this manner, the second circuit board 94r is transferred from the second imaging position 38r to the visual recognition position 31r. It should be noted that the empty second movable transfer device 37r is promptly returned to the second lane divided section 902r after the second circuit board 94r has been transferred.

In the visual recognition inspection step, the operator in the operation area visually inspects the printed condition of the solder on the second circuit board 94r via the inspection window 391 (where the magnifying lens is disposed) of the case 390 shown in FIG. 12. When the operator determines that the printed condition of the solder on the second circuit board 94r is acceptable, the second movable transfer device 37r is moved from the second lane divided section 902r shown in FIG. 14 to a position adjacent to the stacker 39 shown in FIG. 24. The second circuit board 94r is then returned to the second lane divided section 902r by the second movable transfer device 37r. The second circuit board 94r thus returned is transferred to the electronic component mounting machine via the second transfer portion 370r and the second fixed transfer portion 330r. When the operator determines that the printed condition of the solder on the second circuit board 94r is unacceptable, the second circuit board 94r is removed to a space below the case 390 of the stacker 39. That is, the second circuit board 94r is removed from the lane 90r. In this manner, the second circuit board 94r is inspected.

(Motion in Inspecting First Circuit Board 94f)

Figure 25:
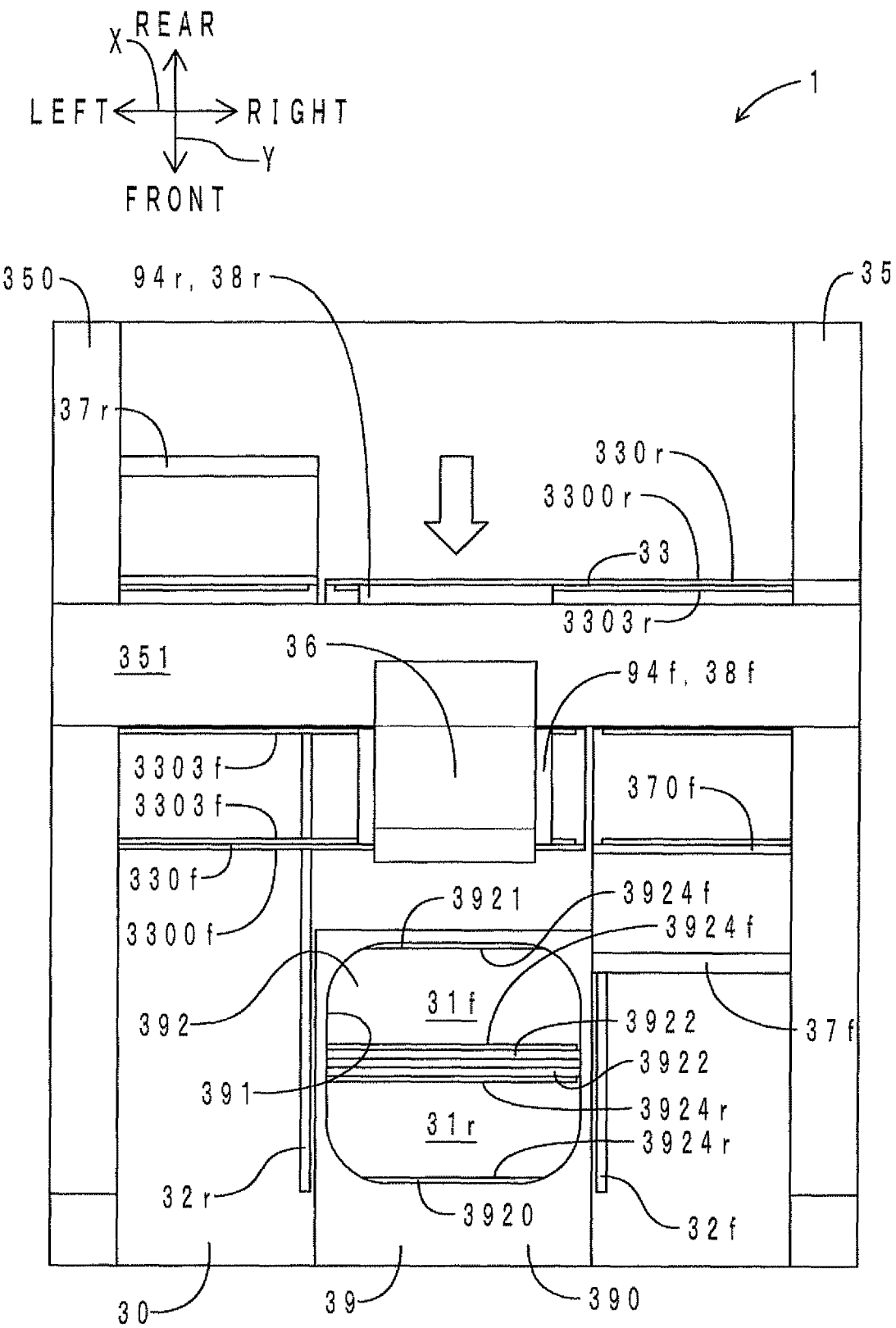
FIG. 25 is a top view of the printed condition inspection apparatus in an imaging inspection step during the inspection of a first circuit board.

A method of inspecting the first circuit board 94f has an imaging inspection step, a transfer step, and a visual recognition inspection step. FIG. 25 is a top view showing the printed condition inspection apparatus according to the present embodiment in the imaging inspection step during the inspection of the first circuit board. In the imaging inspection step, as shown in FIG. 25, the imaging device 36, that is, the beam body 351 is moved forward with respect to the pair of the left and right frame bodies 350. The first circuit board 94f that has passed the screen printing machine is then imaged by the imaging device 36. This imaging is carried out when the first circuit board 94f passes the first imaging position 38f of the first lane divided section 902f (see FIG. 12). As in the case of the inspection of the second circuit board 94r, the calculation device (not shown) makes a determination on the printed condition of the solder on the first circuit board 94f. When the calculation device determines that the printed condition of the solder on the first circuit board 94f is acceptable, the first circuit board 94f is transferred to the electronic component mounting machine by the pair of the conveyers 3303f of the first fixed transfer portion 330f and the first transfer portion 370f of the first movable transfer device 37f. On the other hand, when the calculation device determines that the printed condition of the solder on the first circuit board 94f is unacceptable, a transition from the imaging inspection step to the transfer step is made.

Figure 26:
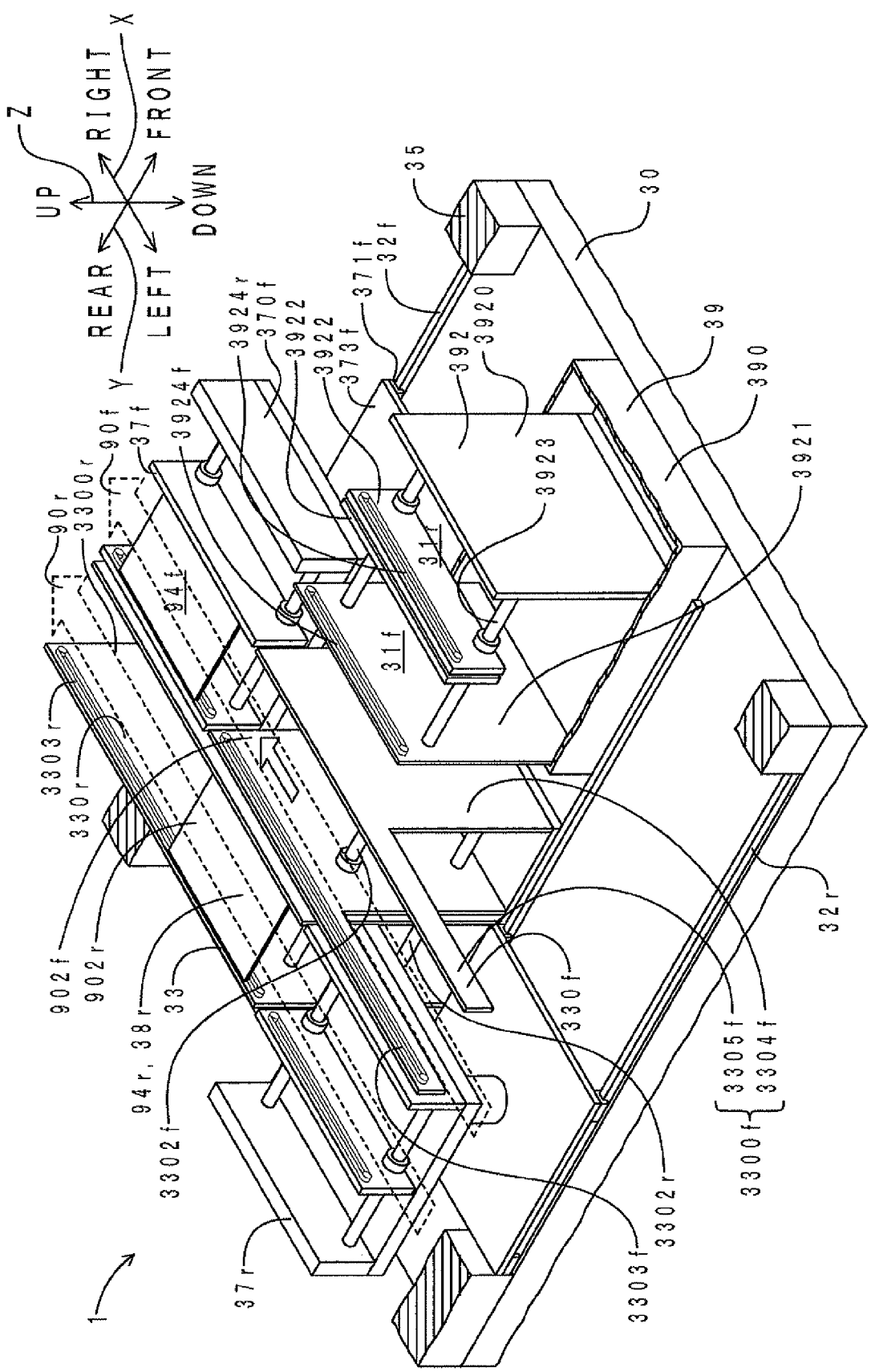
FIG. 26 is a perspective view of the printed condition inspection apparatus (with the frame and the case of the stacker cut away therefrom) at a first stage of a transfer step during the inspection of the first circuit board.
Figure 27:
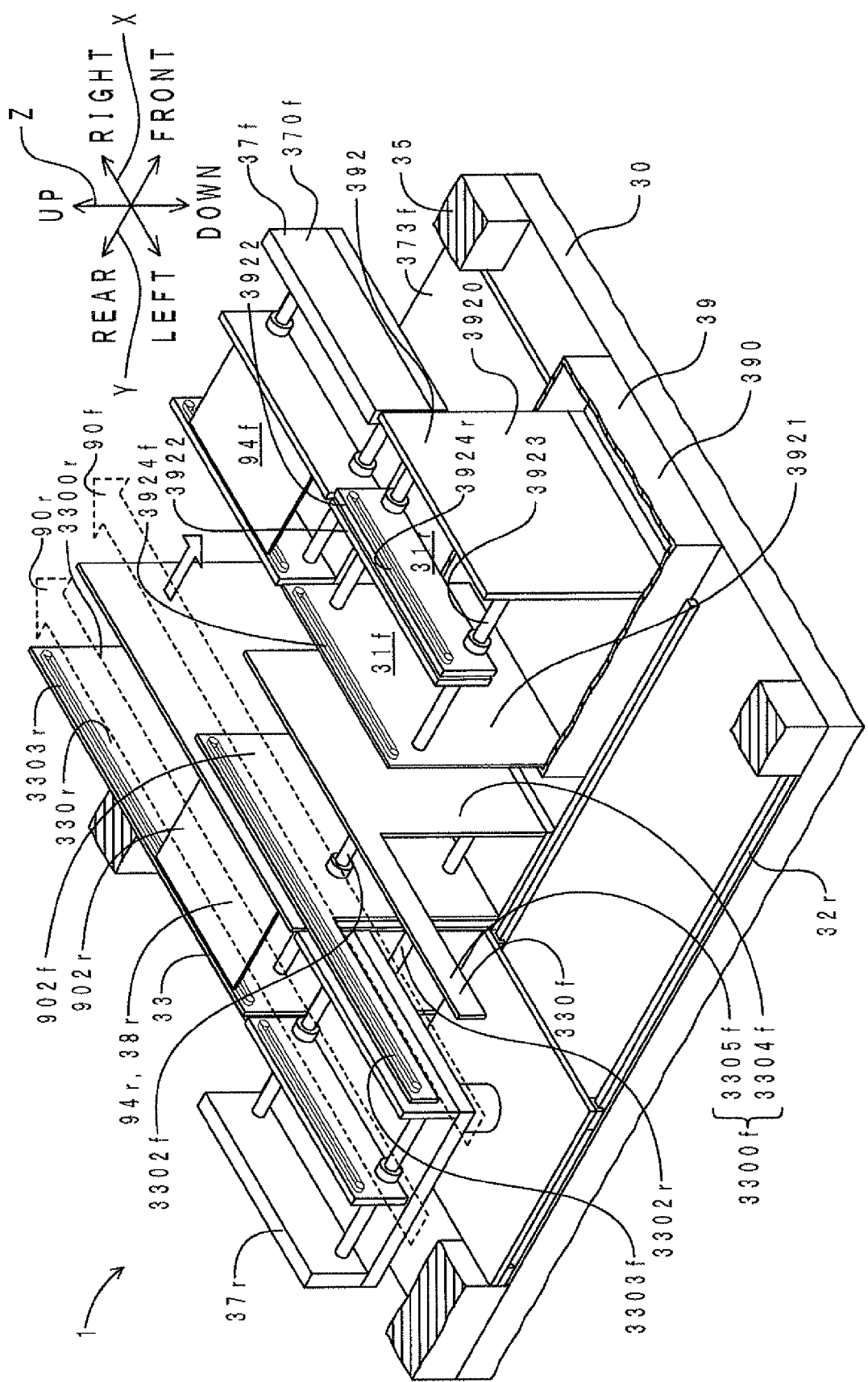
FIG. 27 is a perspective view of the printed condition inspection apparatus at a second stage of the transfer step.
Figure 28:
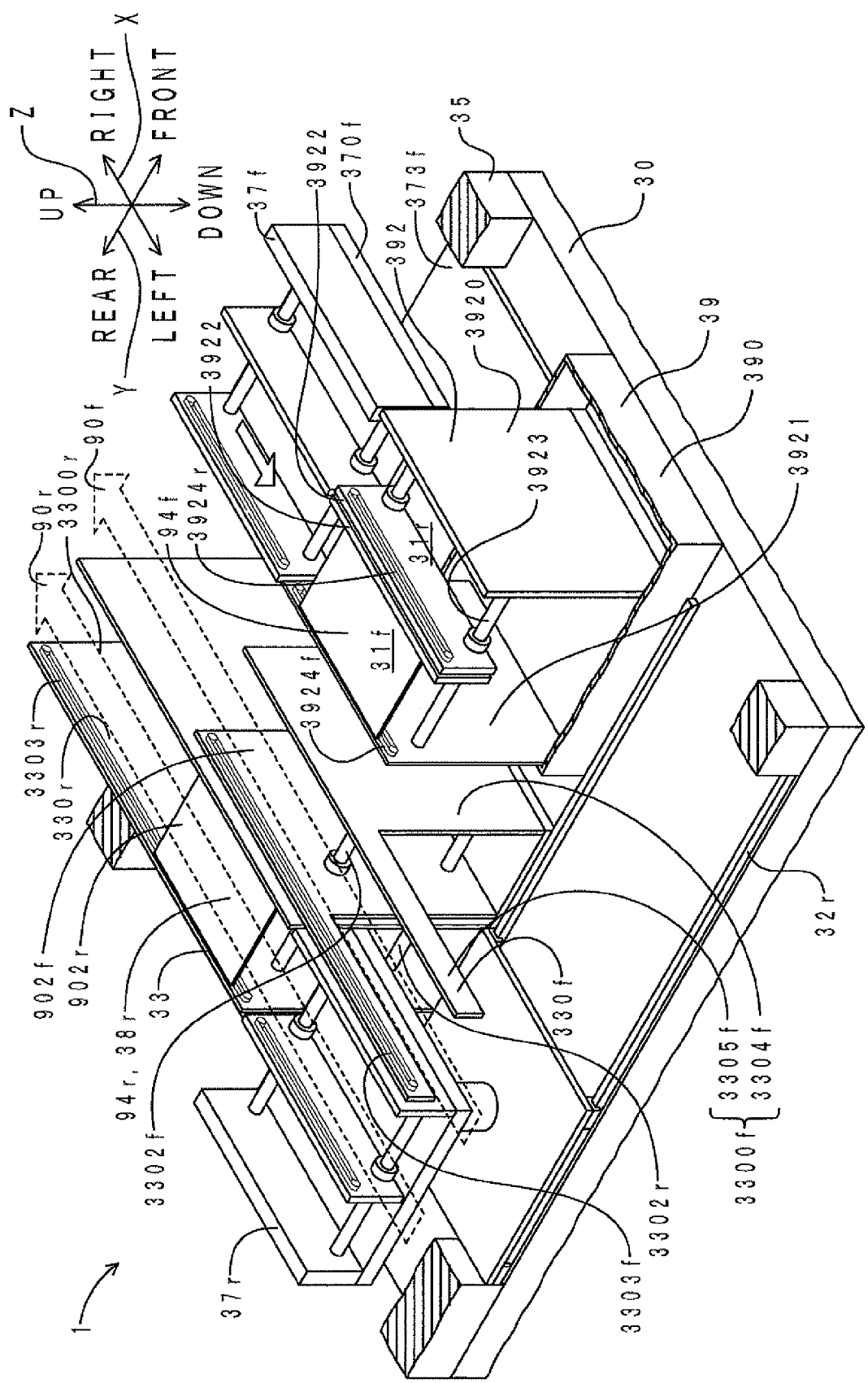
FIG. 28 is a perspective view of the printed condition inspection apparatus at a third stage of the transfer step.

In the transfer step, the first circuit board 94f is transferred from the first imaging position 38f to the visual recognition position 31f. FIG. 26 is a perspective view showing the printed condition inspection apparatus according to the present embodiment (with the frame and the case of the stacker cut away therefrom) at the first stage of the transfer step during the inspection of the first circuit board. FIG. 27 is a perspective view showing the printed condition inspection apparatus at the second stage of the transfer step. FIG. 28 is a perspective view showing the printed condition inspection apparatus at the third stage of the transfer step.

At the first stage, as shown in FIG. 26, the pair of the conveyers 3303f are driven in a line-advancing direction. The first circuit board 94f is then transferred from the pair of the conveyers 3303f to the first transfer portion 370f on the right. At the second stage, as shown in FIG. 27, the four first guided portions 371f are slid forward with respect to the pair of the first guide portions 32f. At the third stage, as shown in FIG. 28, the first circuit board 94f is transferred from the first transfer portion 370f to the pair of the first inspection conveyers 3924f via the first opening 390f of the case 390 (see FIG. 12). In this manner, the first circuit board 94f is transferred from the first imaging position 38f to the visual recognition position 31f. It should be noted that the empty first movable transfer device 37f is promptly returned to the first lane divided section 902f after the first circuit board 94f has been transferred.

In the visual recognition inspection step, the operator in the operation area visually inspects the printed condition of the solder on the first circuit board 94f via the inspection window 391 (where the magnifying lens is disposed) of the case 390 shown in FIG. 12. When the operator determines that the printed condition of the solder on the first circuit board 94f is acceptable, the first movable transfer device 37f is moved from the first lane divided section 902f shown in FIG. 14 to a position adjacent to the stacker 39 shown in FIG. 28. The first circuit board 94f is then returned to the first lane divided section 902f by the first movable transfer device 37f. The first circuit board 94f thus returned is transferred from the first transfer portion 370f to the electronic component mounting machine. When the operator determines that the printed condition of the solder on the first circuit board 94f is unacceptable, the first circuit board 94f is removed to a space below the case 390 of the stacker 39. That is, the first circuit board 94f is removed from the lane 90f. In this manner, the first circuit board 94f is inspected.

[Operation and Effect]

Next, the operation and effect of the printed condition inspection apparatus 1 according to the present embodiment will be described. The printed condition inspection apparatus 1 according to the present embodiment has the same operation and effect as the printed condition inspection apparatus according to the first embodiment as far as the components common in configuration are concerned.

According to the printed condition inspection apparatus 1 of the present embodiment, both the first guide portions 32f and the second guide portions 32r are disposed on the base 30. Thus, there is no need to install the frame 35 in comparison with a case where the first guide portions 32f are installed on the frame 35. Further, there is no need to consider a fall of the first guided portions 371f from the first guide portions 32f in comparison with a case where the first guided portions 371f are hung from the first guide portions 32f. Thus, a structure for engaging the first guided portions 371f with the first guide portions 32f is simplified.

Further, according to the printed condition inspection apparatus 1 of the present embodiment, the unacceptable first circuit board 94f or the unacceptable second circuit board 94r can be held at the inspection transfer portion 392 of the stacker 39. Thus, the first transfer portion 370f can be promptly returned to the first lane divided section 902f after the unacceptable first circuit board 94f has been transferred to the visual recognition position 31f. Also, the second transfer portion 370r can be promptly returned to the second lane divided section 902r after the unacceptable second circuit board 94r has been transferred to the visual recognition position 31r. Accordingly, the production efficiency of the first circuit boards 94f and the second circuit boards 94r can be restrained from decreasing. Further, a predetermined number of unacceptable first circuit boards 94f or unacceptable second circuit boards 94r can be stored in the stacker 39. Thus, every predetermined number of unacceptable first circuit boards 94f or unacceptable second circuit boards 94r can be removed all together.

Third Embodiment

The printed condition inspection apparatus according to the present embodiment is different from the printed condition inspection apparatus according to the second embodiment in that a first movable transfer device is partially accommodated below a second fixed transfer portion of a fixed transfer device during the production of first circuit boards, and also in that there is a visual recognition position common to the first circuit boards and second circuit boards. Accordingly, these differences will be mainly described herein.

[Configuration of Production Line]

A production line on which a printed condition inspection apparatus according to the present embodiment is disposed is the same as the production line on which the printed condition inspection apparatus according to the second embodiment is disposed. Accordingly, the description of the production line is omitted herein.

[Configuration of Printed Condition Inspection Apparatus]

Figure 29:
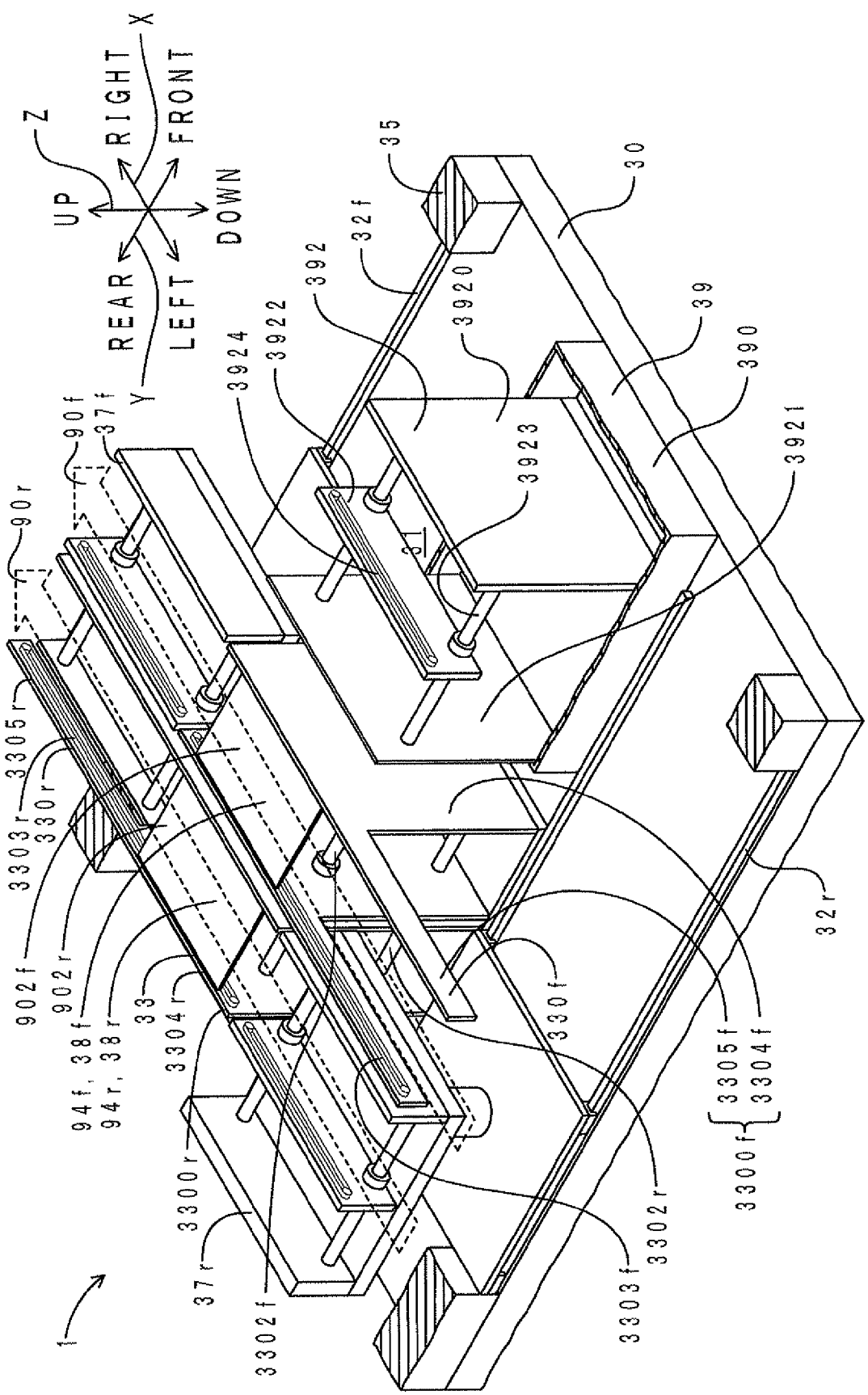
FIG. 29 is a perspective view of a printed condition inspection apparatus according to a third embodiment of the present invention with a frame and a case of a stacker cut away therefrom.
Figure 30:
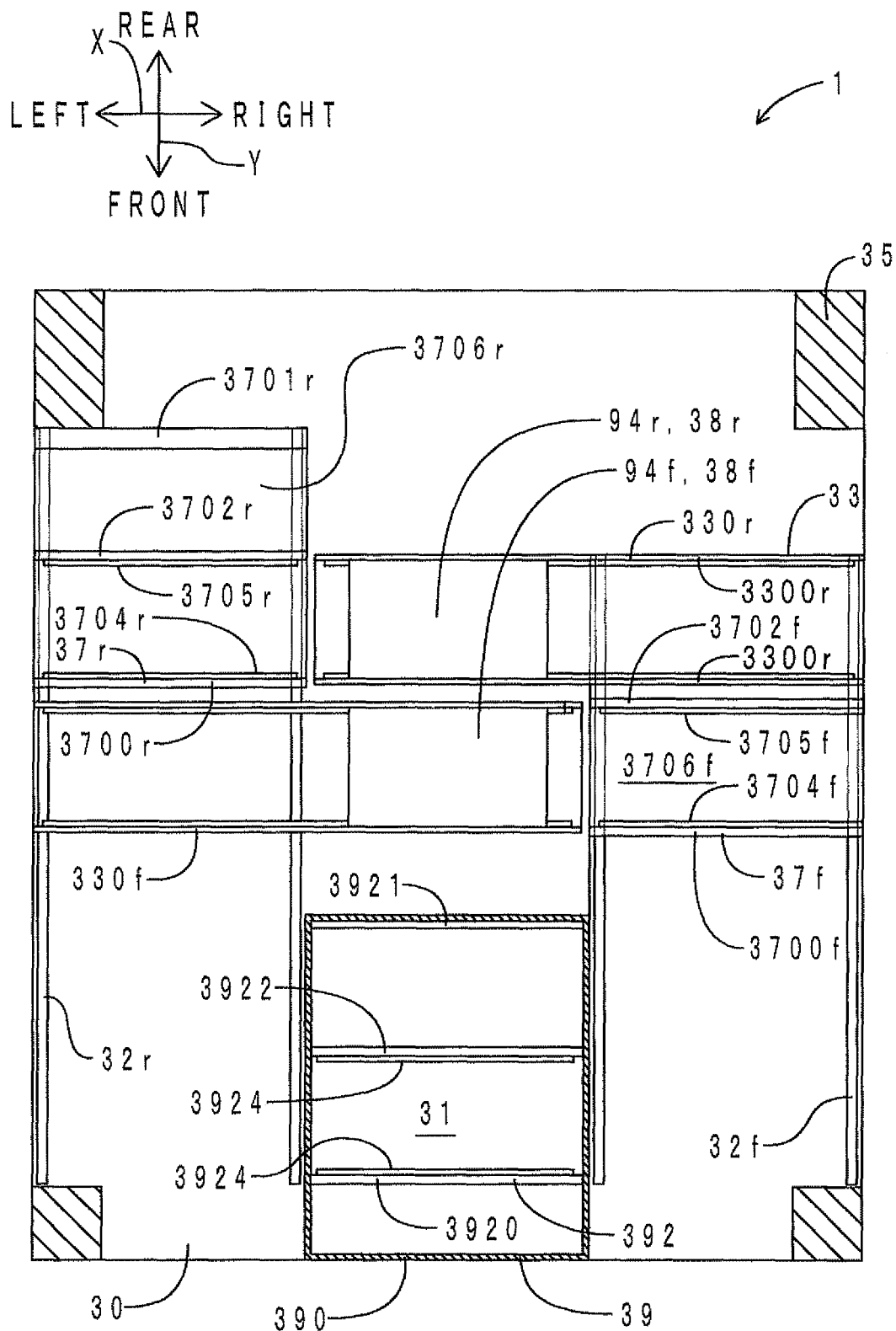
FIG. 30 is a top view of the printed condition inspection apparatus with the frame and the case of the stacker cut away therefrom.

Next, the configuration of the printed condition inspection apparatus according to the present embodiment will be described. FIG. 29 is a perspective view showing the printed condition inspection apparatus according to the present embodiment with a frame and a case of a stacker cut away therefrom. It should be noted in FIG. 29 that components corresponding to those of FIG. 14 are denoted by the same reference symbols. FIG. 30 is a top view showing the printed condition inspection apparatus with the frame and the case of the stacker cut away therefrom. It should be noted in FIG. 30 that components corresponding to those of FIG. 15 are denoted by the same reference symbols.

As shown in FIGS. 29 and 30, the printed condition inspection apparatus 1 according to the present embodiment is equipped with the base 30, the first lane divided section 902f, the second lane divided section 902f, the first movable transfer device 37f, the second movable transfer device 37r, the pair of the first guide portions 32f, the pair of the second guide portions 32r, the visual recognition position 31, the frame 35, the first imaging position 38f, the second imaging position 38r, the imaging device 36 (see FIG. 12), the fixed transfer device 33, and the stacker 39.

(Base 30, Frame 35, Imaging Device 36, First Guide Portions 32f, Second Guide Portions 32r, First Lane Divided Section 902f, Second Lane Divided Section 902r, Second Movable Transfer Device 37r, First Imaging Position 38f, and Second Imaging Position 38r)

The base 30, the frame 35, the imaging device 36, the first guide portions 32f, the second guide portions 32r, the first lane divided section 902f, the second lane divided section 902r, and the second movable transfer device 37r of the printed condition inspection apparatus 1 according to the present embodiment are identical in configuration to the base, the frame, the imaging device, the first guide portions, the second guide portions, the first lane divided section, the second lane divided section, and the second movable transfer device of the printed condition inspection apparatus according to the second embodiment, respectively. Accordingly, the description of these components is omitted herein.

Further, the first imaging position 38f and the second imaging position 38r are arranged in the same manner as the first imaging position and the second imaging position of the printed condition inspection apparatus according to the second embodiment, respectively. Accordingly, the description of these positions is omitted herein.

(First Movable Transfer Device 37f)

Figure 31:
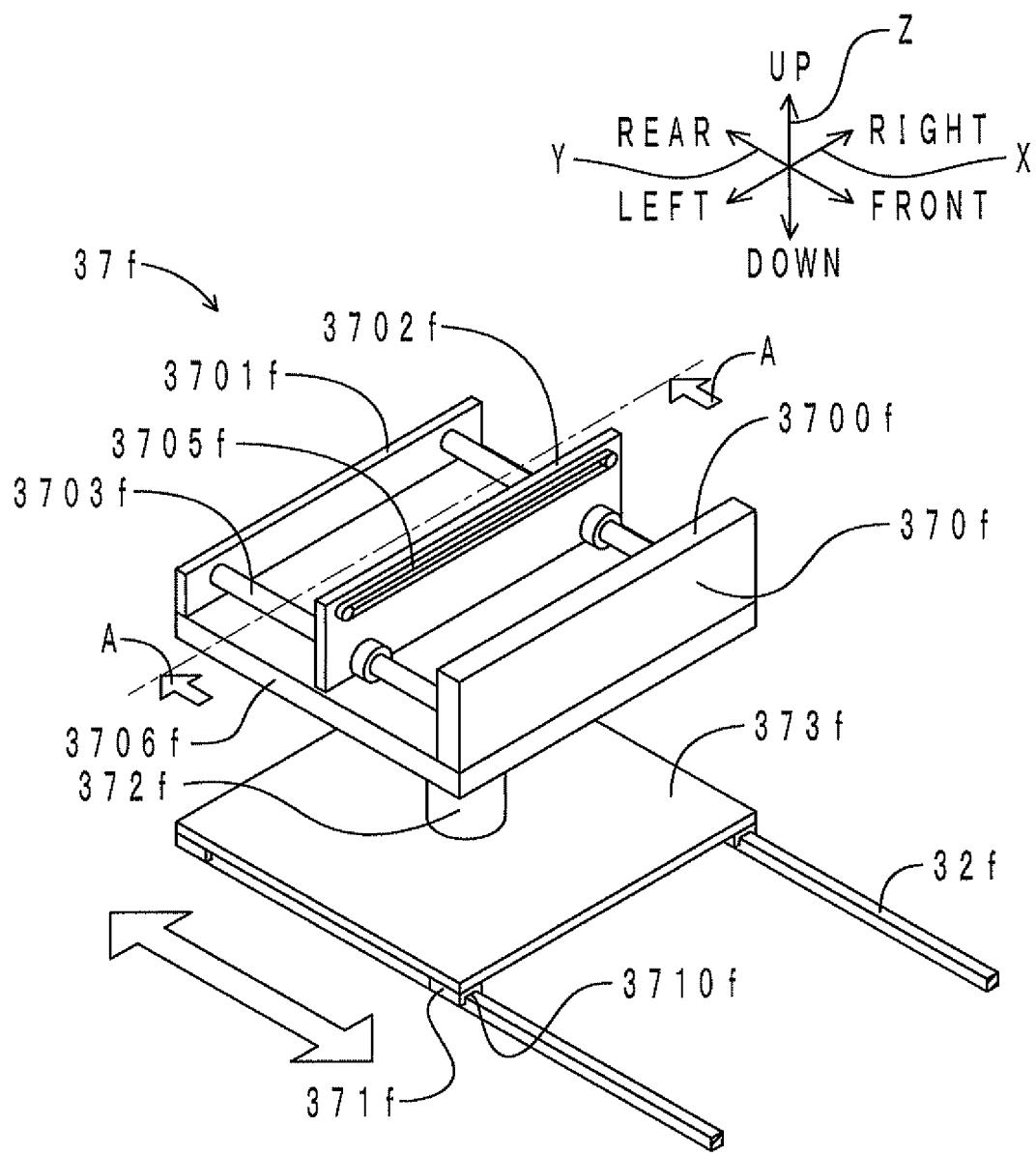
FIG. 31 is a perspective view of a first movable transfer device and first guide portions of the printed condition inspection apparatus.
Figure 32:
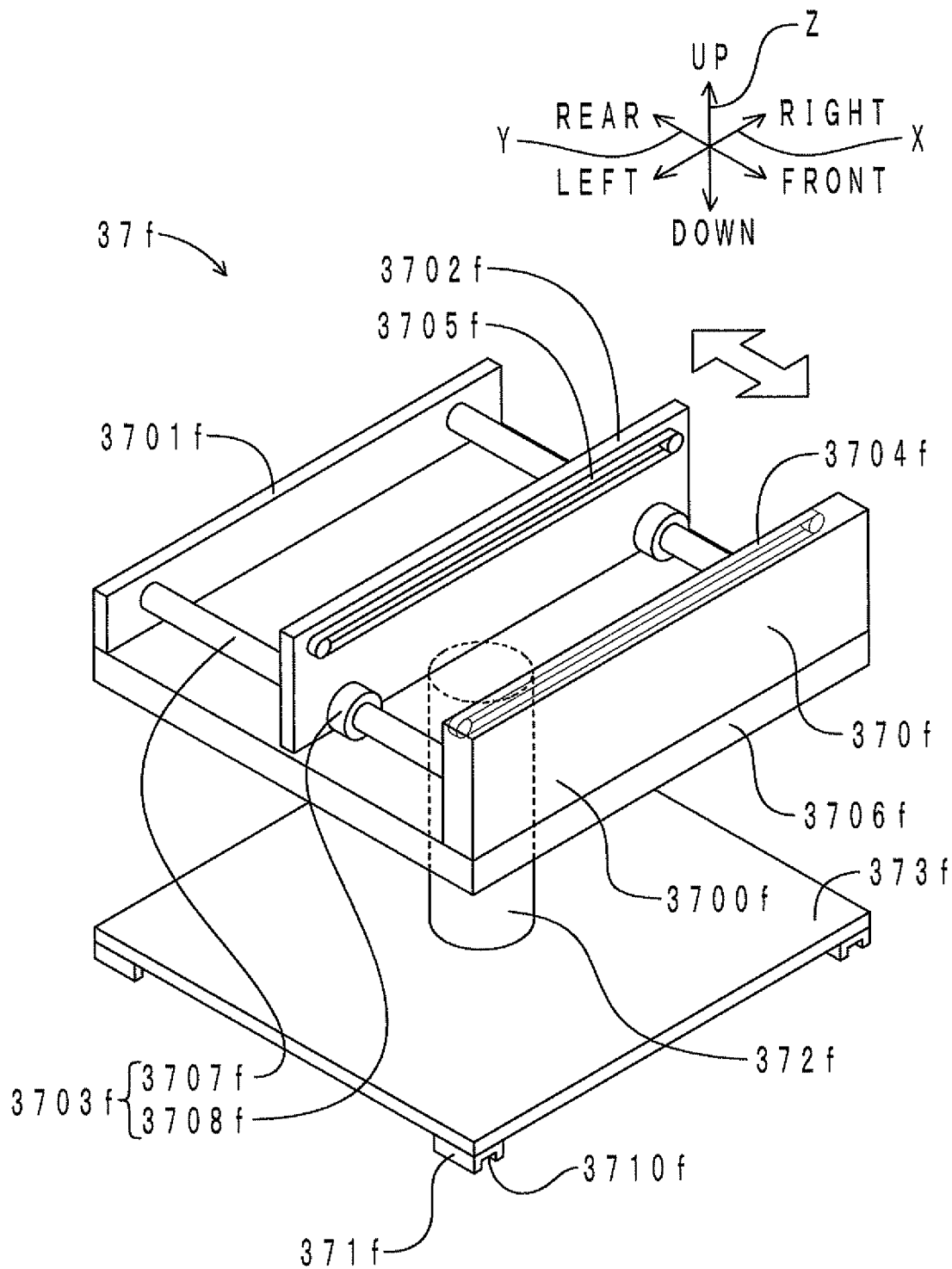
FIG. 32 is a perspective view of the first movable transfer device.

FIG. 31 is a perspective view showing the first movable transfer device and the first guide portions of the printed condition inspection apparatus according to the present embodiment. It should be noted in FIG. 31 that components corresponding to those of FIG. 18 are denoted by the same reference symbols. FIG. 32 is a perspective view showing the first movable transfer device. It should be noted in FIG. 32 that components corresponding to those of FIG. 19 are denoted by the same reference symbols. As shown in FIGS. 31 and 32, the first movable transfer device 37f is equipped with the first transfer portion 370f, the four first guided portions 371f, the column portion 372f, and the first support portion 373f.

The first transfer portion 370f is equipped with the front fixed wall portion 3700f, the rear fixed wall portion 3701f, the movable wall portion 3702f, the pair of the ball screw portions 3703f, the fixed conveyer 3704f, the movable conveyer 3705f, and the bottom plate 3706f. The bottom plate 3706f assumes the shape of a rectangular plate. The front fixed wall portion 3700f assumes the shape of a rectangular plate. The front fixed wall portion 3700f is provided upright and upward from the front edge of the bottom plate 3706f. The rear fixed wall portion 3701f assumes the shape of a rectangular plate. The rear fixed wall portion 3701f is provided upright and upward from the rear edge of the bottom plate 3706f. The movable wall portion 3702f assumes the shape of a rectangular plate. The movable wall portion 3702f is disposed between the front fixed wall portion 3700f and the rear fixed wall portion 3701f. The fixed conveyer 3704f, which is long in the left-right direction, is disposed on a rear face of the front fixed wall portion 3700f. The movable conveyer 3705f, which is long in the left-right direction, is disposed on a front face of the movable wall portion 3702f. The fixed conveyer 3704f and the movable conveyer 3705f face each other in the front-rear direction. The pair of the ball screw portions 3703f are disposed in the vicinity of left and right edges of the first transfer portion 370f. The pair of the ball screw portions 3703f are interposed between the movable wall portion 3702f and the servomotor (not shown). By driving the ball screw portions 3703f, the clearance between the fixed conveyer 3704f and the movable conveyer 3705f can be adjusted.

The first support portion 373f, the four first guided portions 371f, and the column portion 372f are identical in configuration to the first support portion, the four first guided portions, and the column portion of the first movable transfer device of the printed condition inspection apparatus according to the second embodiment, respectively. Accordingly, the description of these components is omitted herein.

(Fixed Transfer Device 33)

The fixed transfer device 33 is equipped with the first fixed transfer portion 330f and the second fixed transfer portion 330r. The first fixed transfer portion 330f is identical in configuration to the first fixed transfer portion of the fixed transfer device of the printed condition inspection apparatus according to the second embodiment. Accordingly, the description of the first fixed transfer portion 3301 is omitted herein.

The second fixed transfer portion 330r is disposed on the second lane divided section 902r. The second fixed transfer portion 330r is disposed on the right of the second movable transfer device 37r. The second fixed transfer portion 330r is equipped with the pair of the wall portions 3300r, the ball screw portion 3302r, and the pair of the conveyers 3303r. Each of the pair of the wall portions 3300r is equipped with a base portion 3304r and an arm portion 3305r. As shown in FIG. 30, the rear wall portion 3300r as one of the pair of the front and rear wall portions 3300r is provided upright from the top face of the base 30. The front wall portion 3300r as the other of the pair of the front and rear wall portions 3300r can be moved in the front-rear direction by the ball screw portion 3302r shown in FIG. 29. That is, the clearance between the pair of the front and rear wall portions 3300r can be adjusted. The base portions 3304r are provided upright between the first guide portions 32f and the second guide portions 32r. The base portions 3304r assume the shape of a rectangular plate. The base portions 3304r extend in the left-right direction. The arm portions 3305r assume the shape of a narrow plate long in the left-right direction. The arm portions 3305r protrude rightward from right upper corners of the base portions 3304r. In producing the first circuit board 94f, a region of the first transfer portion 370f that is located behind the movable wall portion 3702f (a region behind an arrow A-A in FIG. 31) is accommodated below the pair of the arm portions 3305r. One of the pair of the conveyers 3303r is disposed on a rear face of the front wall portion 3300r. The other of the pair of the conveyers 3303r is disposed on a front face of the rear wall portion 3300r. The pair of the conveyers 3303r face each other in the front-rear direction.

(Stacker 39 and Visual Recognition Position 31)

As shown in the aforementioned drawing of FIG. 12, the stacker 39 is equipped with the case 390, the first opening 390f, the second opening 390r, the inspection window 391, and the inspection transfer portion 392. The case 390, the first opening 390f, the second opening 390r, and the inspection window 391 are identical in configuration to the case of the stacker, the first opening, the second opening, and the inspection window of the printed condition inspection apparatus according to the second embodiment, respectively. Accordingly, the description of these components is omitted herein.

The inspection transfer portion 392 is disposed inside the case 390. The inspection transfer portion 392 is equipped with the front fixed wall portion 3920, the rear fixed wall portion 3921, a single movable wall portion 3922, the pair of the ball screw portions 3923, and a pair of common inspection conveyers 3924. The front fixed wall portion 3920 assumes the shape of a rectangular plate. The front fixed wall portion 3920 is disposed in the vicinity of the front wall of the case 390. The rear fixed wall portion 3921 assumes the shape of a rectangular plate. The rear fixed wall portion 3921 is disposed in the vicinity of the rear wall of the case 390. The movable wall portion 3922 assumes the shape of a rectangular plate. The movable wall portion 3922 is disposed between the front fixed wall portion 3920 and the rear fixed wall portion 3921. The movable wall portion 3922 can be moved in the front-rear direction by the pair of the ball screw portions 3923.

One of the pair of the common inspection conveyers 3924 is disposed on the rear face of the front fixed wall portion 3920. The other of the pair of the common inspection conveyers 3924 is disposed on the front face of the movable wall portion 3922. The pair of the common inspection conveyers 3924 extend in the left-right direction. The visual recognition position 31 is disposed between the pair of the common inspection conveyers 3924. The visual recognition position 31 is disposed in front of the first imaging position 38f and the second imaging position 38r. The visual recognition position 31 is adjacent to the operation area for the operator.

[Motion of Printed Condition Inspection Apparatus]

Next, the motion of the printed condition inspection apparatus 1 according to the present embodiment will be described. That is, the motion in inspecting the printed condition of the solder on the first circuit board 94f and the second circuit board 94r will be described.

(Motion in Inspecting Second Circuit Board 94r)

A method of inspecting the second circuit board 94r is substantially the same as the method of inspecting the second circuit board in the printed condition inspection apparatus according to the second embodiment. Accordingly, the description of this method is omitted herein. The second circuit board 94r regarded as unacceptable as a result of the imaging inspection is transferred from the second imaging position 38r of the second lane divided section 902r to the visual recognition position 31 of the common inspection conveyers 3924 by the second movable transfer device 37r.

(Motion in Inspecting First Circuit Board 94f)

A method of inspecting the first circuit board 94f has an imaging inspection step, a transfer step, and a visual recognition inspection step. The imaging inspection step is the same as the imaging inspection step of the method of inspecting the first circuit board in the printed condition inspection apparatus according to the second embodiment. Accordingly, the description of this step is omitted herein.

Figure 33:
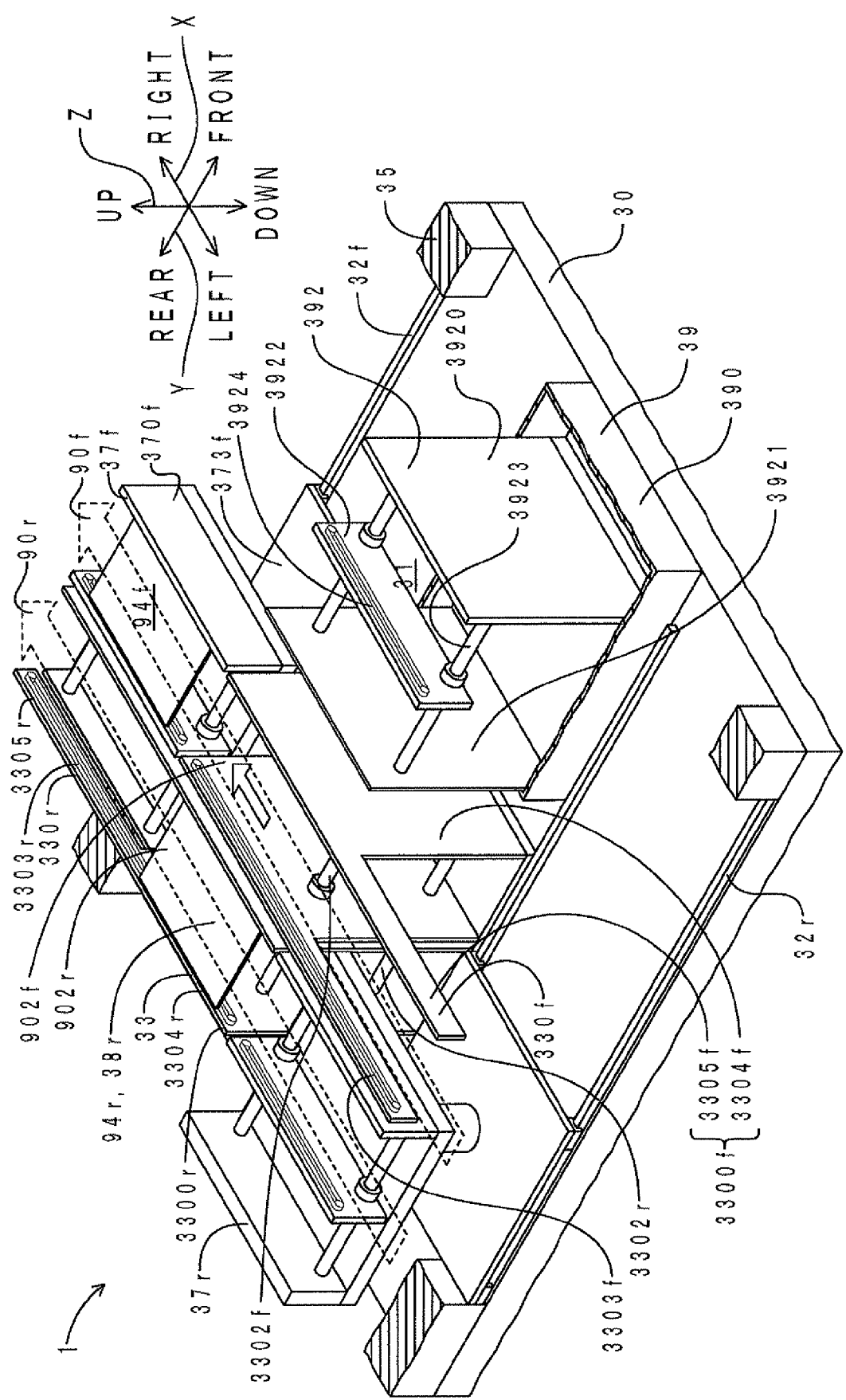
FIG. 33 is a perspective view of the printed condition inspection apparatus (with the frame and the case of the stacker cut away therefrom) at a first stage of a transfer step during the inspection of a first circuit board.
Figure 34:
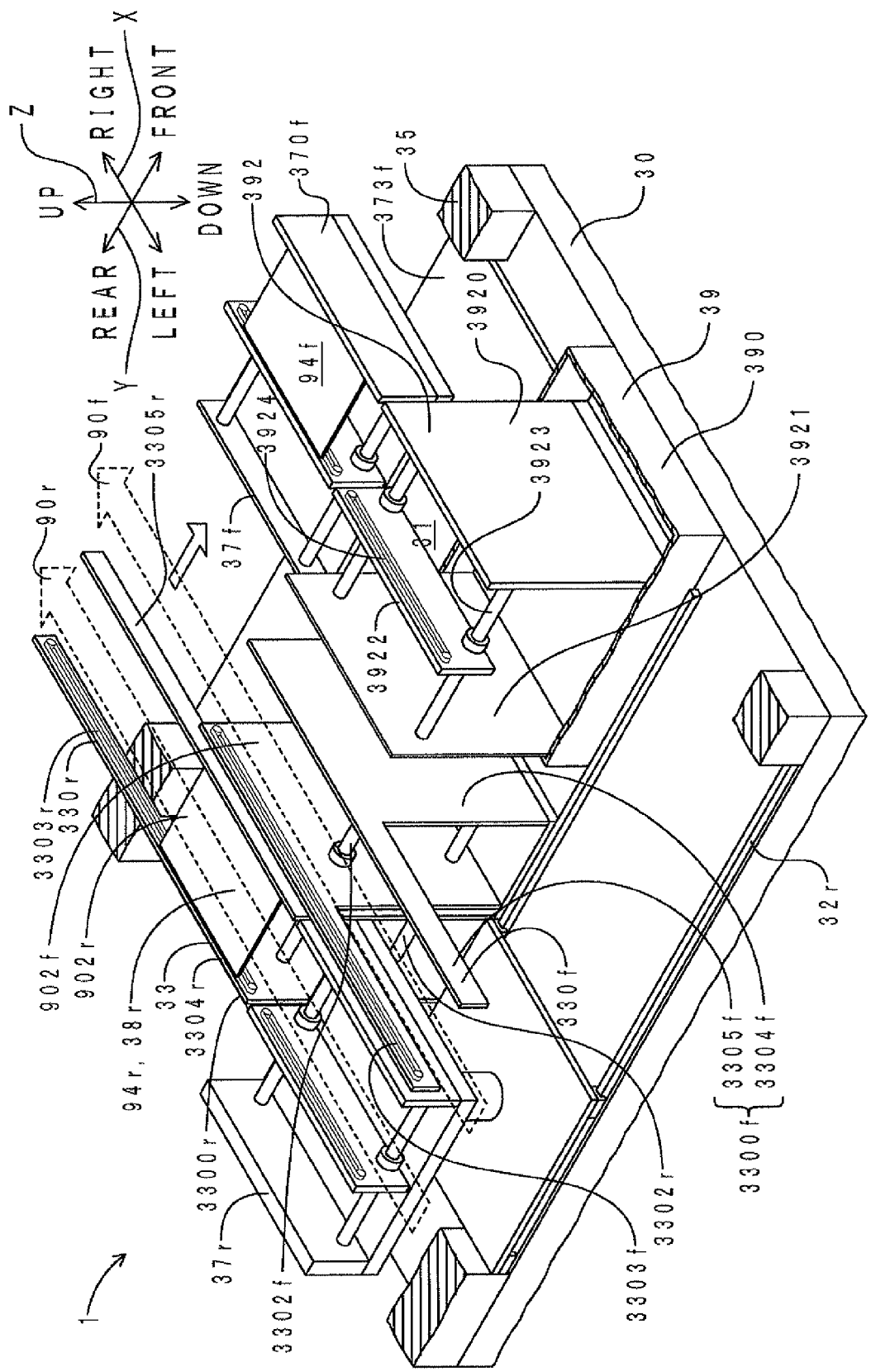
FIG. 34 is a perspective view of the printed condition inspection apparatus at a second stage of the transfer step.
Figure 35:
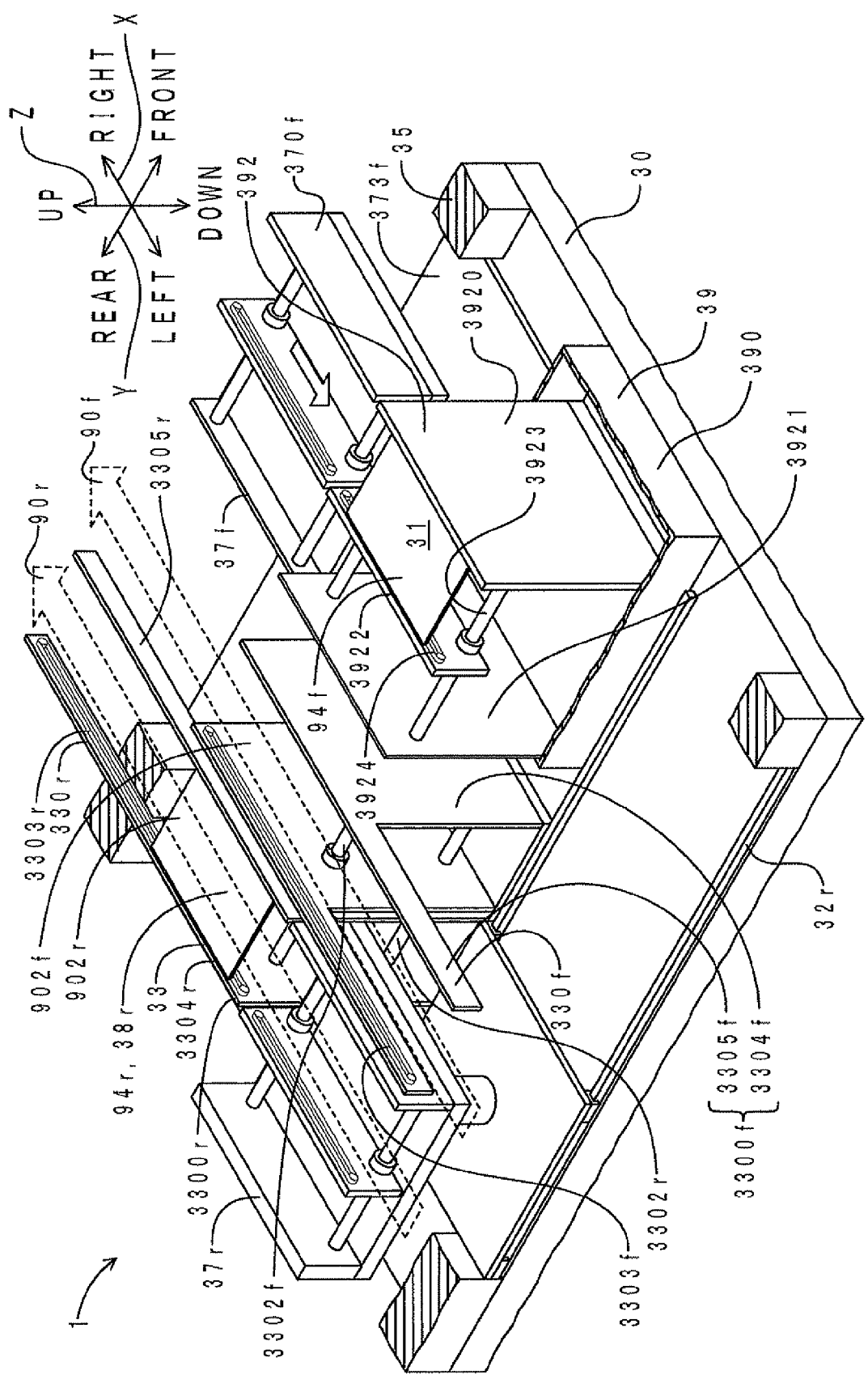
FIG. 35 is a perspective view of the printed condition inspection apparatus at a third stage of the transfer step.

In the transfer step, the first circuit board 94f is transferred from the first imaging position 38f to the visual recognition position 31. FIG. 33 is a perspective view showing the printed condition inspection apparatus according to the present embodiment (with the frame and the case of the stacker cut away therefrom) at the first stage of the transfer step during the inspection of the first circuit board. FIG. 34 is a perspective view showing the printed condition inspection apparatus at the second stage of the transfer step. FIG. 35 is a perspective view showing the printed condition inspection apparatus at the third stage of the transfer step. It should be noted in FIGS. 33 to 35 that components corresponding to those of FIGS. 26 to 28 are denoted by the same reference symbols.

At the first stage, as shown in FIG. 33, the pair of the conveyers 3303f are driven in the line-advancing direction. The first circuit board 94f is then transferred from the pair of the conveyers 3303f to the first transfer portion 370f on the right. At the second stage, as shown in FIG. 34, the four first guided portions 371f are slid forward with respect to the pair of the first guide portions 32f. At the third stage, as shown in FIG. 35, the first circuit board 94f is transferred from the first transfer portion 370f to the pair of the common inspection conveyers 3924 via the first opening 390f of the case 390 (see the aforementioned drawing of FIG. 12). In this manner, the first circuit board 94f is transferred from the first imaging position 38f to the visual recognition position 31. It should be noted that the empty first movable transfer device 37f is promptly returned to the first lane divided section 902f after the first circuit board 94f has been transferred.

The visual recognition inspection step is the same as the visual recognition inspection step of the method of inspecting the first circuit board in the printed condition inspection apparatus according to the second embodiment. Accordingly, the description of this step is omitted herein.

[Operation and Effect]

Next, the operation and effect of the printed condition inspection apparatus 1 according to the present embodiment will be described. The printed condition inspection apparatus 1 according to the present embodiment has the same operation and effect as the printed condition inspection apparatus according to the second embodiment as far as the components common in configuration are concerned.

According to the printed condition inspection apparatus 1 of the present embodiment, the pair of the common inspection conveyers 3924 are disposed on the stacker 39. The clearance between the pair of the common inspection conveyers 3924 can be changed by moving the movable wall portion 3922. Thus, the clearance between the pair of the common inspection conveyers 3924 can be adjusted in accordance with the width of the first circuit board 94f and the second circuit board 94r in the front-rear direction. Accordingly, the first circuit board 94f and the second circuit board 94r can be inspected, regardless of the dimensions thereof, at the visual recognition position 31.

⟨Other Forms⟩

The embodiments of the circuit board inspection apparatus according to the present invention have been described hitherto. However, the embodiments of the present invention should not be limited to the foregoing in particular. The present invention can also be implemented in various modified or improved forms that may occur to those skilled in the art.

For example, in each of the foregoing embodiments of the present invention, the ball screw portions are disposed to adjust the width between the conveyers in the front-rear direction. However, a different type of mechanism such as a hydraulic cylinder mechanism, an air cylinder mechanism, or the like may be employed to adjust the width between the conveyers in the front-rear direction. Further, in each of the foregoing embodiments of the present invention, by lowering the second transfer portion 370r during the inspection of the second circuit board 94r, the second transfer portion 370r and the first lane divided section 902f are prevented from interfering with each other. However, it is also appropriate to raise the second transfer portion 370r to prevent the second transfer portion 370r and the first lane divided section 902f from interfering with each other. For example, it is appropriate to support the first lane divided section 902f from below, suspend the second transfer portion 370r from above, and raise the second transfer portion 370r to move the second transfer portion 370r over the first lane divided section 902f during the inspection of the second circuit board 94r so that the second transfer portion 370r and the first lane divided section 902f are prevented from interfering with each other. Further, it is also appropriate to lower or raise the first transfer portion 370f to prevent the second transfer portion 370r and the first lane divided section 902f from interfering with each other.

Further, in each of the foregoing embodiments of the present invention, the circuit board inspection apparatus according to the present invention is realized as the printed condition inspection apparatus 1. However, the circuit board inspection apparatus according to the present invention may also be realized as an inspection apparatus for inspecting the mounting positions of electronic components on a circuit board.

What is claimed is:

1. A circuit board inspection apparatus comprising:
a plurality of lane-divided sections constituting part of a plurality of lanes and being disposed side-by-side in a Y direction and configured to transfer circuit boards in the plurality of lanes, the plurality of lanes being disposed side-by-side in the Y direction and extending in an X direction, which is a substantially horizontal direction substantially perpendicular to the Y direction;
a plurality of movable transfer platforms, a movable transfer platform of the plurality of movable transfer platforms being disposed on each lane-divided section of the plurality of the lane divided sections, each movable transfer platform of the plurality of movable transfer platforms having a transfer channel configured to transfer the circuit boards, and the each movable transfer platform being movable in the Y direction independently of each other movable transfer platform of the plurality of movable transfer platforms; and
a height adjustment mechanism disposed on at least one of the plurality of movable transfer platforms, the height adjustment mechanism being configured to move the transfer channel of the at least one movable transfer platform in a Z direction, which is a substantially vertical direction substantially perpendicular to the X direction and the Y direction, wherein
each movable transfer platform is configured to move independently of each other movable transfer platform and to transfer the circuit boards from the plurality of lane-divided sections to a visual recognition position, the visual recognition position being disposed on at least one side of the plurality of the lane-divided sections in the Y direction and being configured to allow an operator to visually recognize the circuit boards directly or indirectly, and
the at least one of the plurality of the movable transfer platforms that has the height adjustment mechanism is configured such that, during the transfer of a corresponding one of the circuit boards by the at least one movable transfer platform from a corresponding one of the lane-divided sections to the visual recognition position, the at least one movable transfer platform does not interfere with the lane-divided sections other than the corresponding lane-divided section on which the at least one movable transfer platform is disposed.

2. The circuit board inspection apparatus according to claim 1, further comprising:
a base having an operation area for the operator on a side in the Y direction, the side defining an operator side;
a first guide portion extending in the Y direction; and
a second guide portion extending in the Y direction, wherein
the plurality of the lane-divided sections include:
a first lane-divided section configured to transfer a first circuit board; and
a second lane-divided section aligned with the first lane-divided section on a far side in the Y direction and configured to transfer a second circuit board,
the plurality of the movable transfer platforms include:
a first movable transfer platform having a first transfer channel that is disposed above the base in the Z direction and that is configured to transfer the first circuit board and a first guided portion that slides on the first guide portion; and
a second movable transfer platform having a second transfer channel that is arranged above the base in the Z direction and aligned with the first movable transfer platform on a far side relative to the operator side in the Y direction and that is configured to transfer the second circuit board and a second guided portion that slides on the second guide portion,
the height adjustment mechanism is disposed on the first movable transfer platform or the second movable transfer platform,
the visual recognition position is arranged on the operator side of the first lane-divided section in the Y direction,
the first transfer channel is disposed on the first lane-divided section in producing the first circuit board,
the second transfer channel is disposed on the second lane-divided section in producing the second circuit board,
the first guided portion slides on the first guide portion, and the first movable transfer platform moves toward the operator side in the Y direction to transfer the first circuit board from the first lane-divided section to the visual recognition position in inspecting the first circuit board, and
the second guided portion slides on the second guide portion, the second movable transfer platform moves toward the operator side in the Y direction, and the height adjustment mechanism prevents the second transfer channel from interfering with the first lane-divided section in inspecting the second circuit board.

3. The circuit board inspection apparatus according to claim 2, further comprising a frame provided over the first movable transfer platform and the second movable transfer platform in the Z direction, wherein
one of the first guide portion and the second guide portion is disposed on the frame, and the other of the first guide portion and the second guide portion is disposed on the base.

4. The circuit board inspection apparatus according to claim 3, wherein the first guide portion and the second guide portion are disposed opposite each other in the Z direction.

5. The circuit board inspection apparatus according to claim 2, wherein
at least one of the first movable transfer platform and the second movable transfer platform is configured to move in a reciprocating manner between the first lane-divided section and the second lane-divided section while the other of the first movable transfer platform and the second movable transfer platform transfers the first circuit board or the second circuit board between the first lane-divided section or the second lane-divided section and the visual recognition position, and
by moving in a reciprocating manner between the first lane-divided section and the second lane-divided section, the at least one of the first movable transfer platform and the second movable transfer platform is configured to transfer the first circuit board on the first lane-divided section in the X direction and to transfer the second circuit board on the second lane-divided section in the X direction during the transfer of the first circuit board or the second circuit board between the first lane-divided section or the second lane-divided section and the visual recognition position by the other of the first movable transfer platform and the second movable transfer platform.

6. The circuit board inspection apparatus according to claim 2, wherein
the first guide portion and the second guide portion are disposed on the base opposite each other in the X direction,
the first movable transfer platform further has a first support portion disposed below the first transfer platform in the Z direction, and a column portion interposed between the first transfer platform and the first support portion,
the first guided portion is disposed on the first support portion, and is in slidable contact with the first guide portion from above in the Z direction,
the second movable transfer platform further has a second support portion that is disposed below the second transfer platform in the Z direction,
the second guided portion is disposed on the second support portion, and is in slidable contact with the second guide portion from above in the Z direction, and
the height adjustment mechanism is interposed between the second transfer platform and the second support portion.

7. The circuit board inspection apparatus according to claim 6, further comprising an inspection transfer platform where the visual recognition position is disposed, wherein
the first transfer platform is configured to deliver the first circuit board to the inspection transfer platform, and the first transfer platform is configured to return to the first lane-divided section, for an inspection of the first circuit board, and
the second transfer platform is configured to deliver the second circuit board to the inspection transfer platform, and the second transfer platform is configured to return to the second lane-divided section, for an inspection of the second circuit board.

8. The circuit board inspection apparatus according to claim 2, further comprising:
an imaging device disposed above a first imaging position and a second imaging position in the Z direction to allow the first circuit board at the first imaging position and the second circuit board at the second imaging position to be imaged, wherein
the first imaging position is disposed on the first lane-divided section and the second imaging position is disposed on the second lane-divided section, and
the first movable transfer platform is configured to transfer the first circuit board from the first lane-divided section to the visual recognition position when an image inspection at the first imaging position is regarded as unacceptable, and
the second movable transfer platform is configured to transfer the second circuit board from the second lane-divided section to the visual recognition position when an image inspection at the second imaging position is regarded as unacceptable.

9. The circuit board inspection apparatus according to claim 1, wherein
while one of the plurality of movable transfer platforms transfers a circuit board to the visual recognition position, the other movable transfer platforms of the plurality of movable transfer platforms are configured to transfer other circuit boards in the X direction.

10. The circuit board inspection apparatus according to claim 1, wherein
when located at the visual recognition position, the at least one movable transfer platform is located outside of the plurality of lane-divided sections such that another movable transfer platform of the plurality of movable transfer platforms is movable in the Y direction.

* * * * *